United States Patent
Yugami et al.

(10) Patent No.: US 9,343,527 B2
(45) Date of Patent: May 17, 2016

(54) SEMICONDUCTOR DEVICE INCLUDING AN ISOLATION FILM BURIED IN A GROOVE

(71) Applicant: Renesas Electronics Corporation, Kawasaki-shi, Kanagawa (JP)

(72) Inventors: Jiro Yugami, Kanagawa (JP); Toshiaki Iwamatsu, Kanagawa (JP); Katsuyuki Horita, Kanagawa (JP); Hideki Makiyama, Kanagawa (JP); Yasuo Inoue, Kanagawa (JP); Yoshiki Yamamoto, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 34 days.

(21) Appl. No.: 13/691,800

(22) Filed: Dec. 2, 2012

(65) Prior Publication Data
US 2013/0140669 A1 Jun. 6, 2013

(30) Foreign Application Priority Data
Dec. 5, 2011 (JP) ................................. 2011-265692

(51) Int. Cl.
*H01L 29/76* (2006.01)
*H01L 21/02* (2006.01)
(Continued)

(52) U.S. Cl.
CPC ...... *H01L 29/0649* (2013.01); *H01L 21/76224* (2013.01); *H01L 21/76229* (2013.01); *H01L 21/76283* (2013.01); *H01L 21/823807* (2013.01); *H01L 21/823878* (2013.01); *H01L 27/1203* (2013.01); *H01L 27/1207* (2013.01)

(58) Field of Classification Search
None
See application file for complete search history.

(56) References Cited

U.S. PATENT DOCUMENTS 5,976,945 A * 11/1999 Chi et al. ...................... 438/386
6,028,344 A   2/2000 Hashimoto
(Continued)

FOREIGN PATENT DOCUMENTS

JP   10-242440 A    9/1998
JP   2002-118165 A  4/2002
(Continued)

OTHER PUBLICATIONS

N. Sugii et al., "Comprehensive Study on Vth Variability in Silicon on Thin Box (SOTB) CMOS with Small Random-Dopant Fluctuation: Finding a Way to Further Reduce Variation," IEDM 2008, p. 249.

(Continued)

*Primary Examiner* — Mamadou Diallo
*Assistant Examiner* — Jay C Chang
(74) *Attorney, Agent, or Firm* — Shapiro, Gabor and Rosenberger, PLLC

(57) ABSTRACT

A first MISFET which is a semiconductor element is formed on an SOI substrate. The SOI substrate includes a supporting substrate which is a base, BOX layer which is an insulating layer formed on a main surface (surface) of the supporting substrate, that is, a buried oxide film; and an SOI layer which is a semiconductor layer formed on the BOX layer. The first MISFET as a semiconductor element is formed to the SOI layer. In an isolation region, an isolation groove is formed penetrating though the SOI layer and the BOX layer so that a bottom surface of the groove is positioned in the middle of a thickness of the supporting substrate. An isolation film is buried in the isolation groove being formed. Then, an oxidation resistant film is interposed between the BOX layer and the isolation film.

7 Claims, 49 Drawing Sheets

(51) Int. Cl.
*H01L 21/70* (2006.01)
*H01L 29/06* (2006.01)
*H01L 21/762* (2006.01)
*H01L 21/8238* (2006.01)
*H01L 27/12* (2006.01)

(56) References Cited

U.S. PATENT DOCUMENTS

| | | | | |
|---|---|---|---|---|
| 6,657,276 | B1* | 12/2003 | Karlsson et al. | 257/510 |
| 2002/0022308 | A1 | 2/2002 | Ahn et al. | |
| 2004/0212035 | A1* | 10/2004 | Yeo et al. | 257/510 |
| 2005/0040473 | A1* | 2/2005 | Saito | 257/384 |
| 2007/0275537 | A1* | 11/2007 | Henson | H01L 21/76283 438/421 |
| 2010/0038745 | A1* | 2/2010 | Wu et al. | 257/510 |
| 2011/0115021 | A1* | 5/2011 | Dennard et al. | 257/347 |
| 2011/0284930 | A1* | 11/2011 | Hershberger | G06F 17/5068 257/270 |
| 2012/0286392 | A1* | 11/2012 | Pei et al. | 257/532 |

FOREIGN PATENT DOCUMENTS

| | | |
|---|---|---|
| JP | 2003-017554 A | 1/2003 |
| JP | 2010-263104 A | 11/2010 |

OTHER PUBLICATIONS

Office Action issued Sep. 1, 2015, in Japanese Patent Application No. 2011-265692.

Office Action issued Jan. 27, 2016, in Taiwanese Patent Application No. 101139914.

* cited by examiner

SEMICONDUCTOR DEVICE INCLUDING AN ISOLATION FILM BURIED IN A GROOVE

CROSS-REFERENCE TO RELATED APPLICATION

The present application claims priority from Japanese Patent Application No. 2011-265692 filed on Dec. 5, 2011, the content of which is hereby incorporated by reference into this application.

TECHNICAL FIELD OF THE INVENTION

The present invention relates to a semiconductor device and a method of manufacturing the same. More particularly, the present invention relates to technology effectively applied to a semiconductor device including semiconductor elements formed to an SOI substrate and a method of manufacturing the semiconductor device.

BACKGROUND OF THE INVENTION

In a semiconductor device, an isolation groove is formed in a semiconductor substrate in an isolation region and an isolation film is formed by burying an insulating film in the isolation groove formed. As various semiconductor elements are formed in an active region defined by the isolation region in which the isolation film is formed, the semiconductor device is manufactured. The semiconductor elements formed in each active region can be mutually electrically isolated by the isolation film formed in the isolation region.

Japanese Patent Application Laid-Open Publication No. 2010-263104 (Patent Document 1) describes technology of preventing oxidization of a side surface of an isolation groove by forming an oxidation-resistant sidewall film to the side surface of the isolation groove of a semiconductor substrate.

Also, along with development of high integration of semiconductor devices, field effect transistors such as MISFET (Metal Insulator Semiconductor Field Effect Transistor) etc. are miniaturized in accordance with the scaling rule but a problem of lowering in performance occurs, such as short-channel characteristics and the uniformity of threshold voltage along with miniaturization. Meanwhile, a MISFET on an SOI substrate, in which a BOX (Buried Oxide) layer which is a buried oxide film and an SOI (Silicon On Insulator) layer which is a semiconductor layer are formed on a bulk substrate, is excellent in short-channel characteristics and the uniformity of threshold voltage as compared to a MISFET on a bulk substrate. From this fact, it is considered that mounting MISFETs on an SOI substrate is necessary technology for achieving semiconductor devices in the 20 nm generation and subsequent generations of circuit line width.

For example, N. Sugii et al., "Comprehensive Study on Vth Variability in Silicon on Thin BOX (SOTB) CMOS with Small Random-Dopant Fluctuation: Finding a Way to Further Reduce Variation," IEDM 2008, p. 249 (Non-Patent Document 1) describes that, when a thickness of a BOX layer of an SOI substrate is made thinner than already existing SOI substrates, the threshold voltage can be controlled by controlling the potential of a bulk substrate and thus it is very advantageous in operating voltage lowering and power consumption reduction.

SUMMARY OF THE INVENTION

According to a study made by the inventors of the present invention, the following facts have been found.

To control the threshold voltage by using the potential of a bulk substrate, the thickness of the BOX layer is required to be uniform. However, the inventors have found that, when an isolation film is formed in an isolation region by already existing technology, upon subjecting the isolation film to a thermal processing, the SOI layer is oxidized due to oxide diffused through the isolation film in a portion on the isolation region side in the active region, thereby locally increasing the thickness of the BOX layer.

When the thickness of the BOX layer is varied like it is locally increased, the threshold voltage of the MISFET is also varied. Also, when the channel length of the MISFET is decreased, contribution of the portion of the isolation region is increased. Therefore, in a semiconductor element having a short channel length, when the thickness of the BOX layer is varied, the performance of the semiconductor device is lowered such as that the uniformity of the electric characteristics, i.e., the threshold voltage of the semiconductor device is lowered.

A preferred aim of the present invention is to provide technology capable of improving performance of semiconductor devices.

The above and other preferred aims and novel characteristics of the present invention will be apparent from the description of the present specification and the accompanying drawings.

The typical ones of the inventions disclosed in the present application will be briefly described as follows.

A semiconductor device of a typical embodiment includes an oxidation resistant film interposed between an isolation film provided to an SOI substrate and a BOX layer.

In addition, a method of manufacturing a semiconductor device according to a typical embodiment includes forming a groove portion by etching an SOI layer of an SOI substrate, a BOX layer and a supporting substrate and forming a concave portion to the BOX layer exposed to a side surface of the groove portion. Then, an oxidation resistant film is formed to be buried in the concave portion formed, the oxidation resistant film is etched leaving the portion of the concave portion filled by the oxidation resistant film, and an isolation film is buried in the groove portion having the concave portion being filled with the oxidation resistant film.

The effects obtained by typical aspects of the present invention will be briefly described below.

According to the typical embodiments, performance of semiconductor devices can be improved.

BRIEF DESCRIPTIONS OF THE DRAWINGS

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable. Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Hereinafter, embodiments of the present invention will be described in detail with reference to the accompanying drawings. Note that components having the same function are denoted by the same reference symbols throughout the drawings for describing the embodiment, and the repetitive description thereof will be omitted.

Also, in some drawings used in the embodiments, hatching is used even in a cross-sectional view so as to make the drawings easy to see. Moreover, in some drawings used in the embodiments, hatching is used even in a plan view so as to make the drawings easy to see.

(First Embodiment)
<Semiconductor Device>

A semiconductor device which is an embodiment of the present invention will be described with reference to the drawings. The semiconductor device of the present embodiment is a semiconductor device including a MISFET as a semiconductor element.

Figure 1:
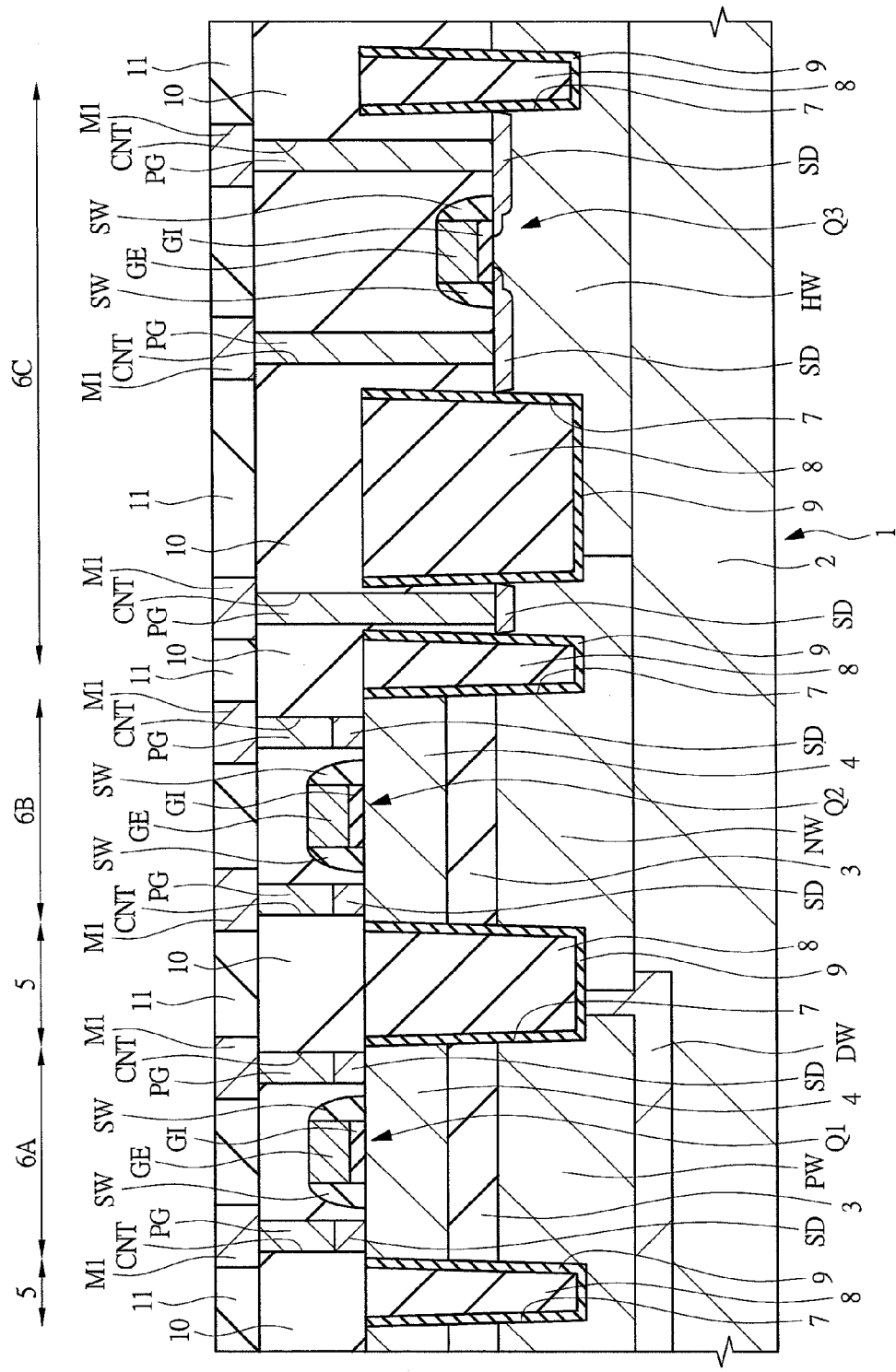
FIG. 1 is a cross-sectional view of main parts of a semiconductor device according to a first embodiment.
Figure 2:
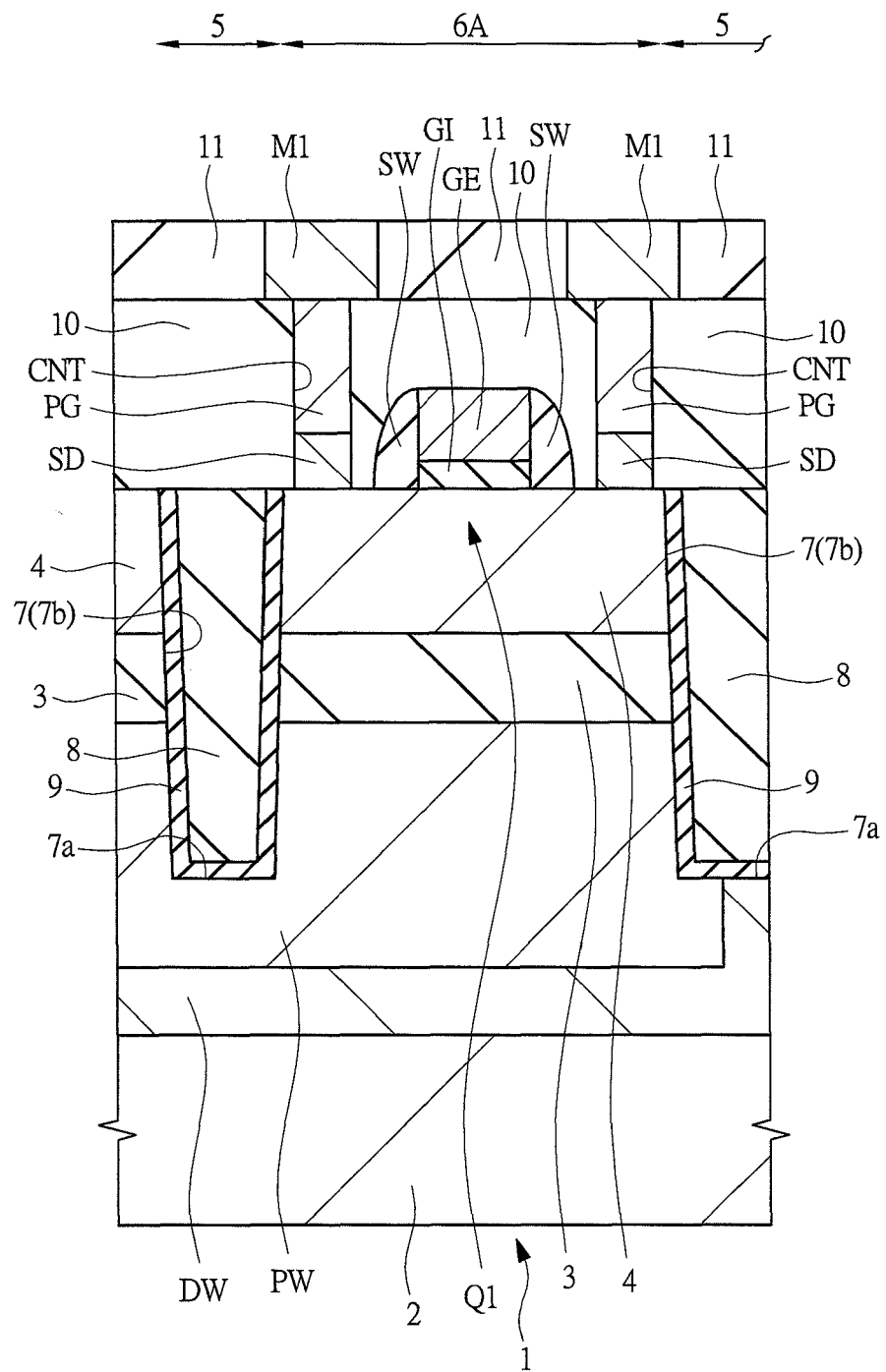
FIG. 2 is a cross-sectional view of main parts of a semiconductor device according to the first embodiment.

FIGS. 1 and 2 are cross-sectional views of main parts of the semiconductor device of the first embodiment FIG. 2 is a diagram illustrating a vicinity region of a MISFET Q1 of n-channel type in FIG. 1 in an enlarged manner. Note that, in FIG. 1, illustration of a part of an isolation region 5 is omitted to facilitate viewing of the drawing.

As illustrated in FIG. 1, the MISFET provided in the semiconductor device of the first embodiment is formed to an SOI substrate 1. The SOI substrate 1 includes a supporting substrate 2 that is a base; a BOX layer 3 of an insulating film, that is, a buried oxide film formed on a main surface (surface) of the supporting substrate 2; and an SOI layer 4, which is a semiconductor layer formed on the BOX layer 3. To the SOI layer 4, a MISFET is formed as a semiconductor element. The supporting substrate 2 is, for example, a single crystal silicon substrate. The BOX layer 3 is, for example, a silicon oxide film having a thickness of, for example, about 4 to 100 nm. The SOI layer 4 is, for example, a single crystal silicon layer having a thickness of, for example, about 4 to 100 nm.

On a main surface of the SOI substrate 1, the isolation region 5 and a MISFET forming regions (active region) 6A and 6B are defined. The MISFET forming regions 6A, 6B are regions sectioned by the isolation region 5. To the SOI layer 4 in the MISFET forming regions 6A, 6B, semiconductor elements such as a MISFET are formed. The MISFET forming region 6A is a region (n-type MISFET forming region 6A) in which the MISFET Q1 of n-channel type is formed on the SOI layer 4. The MISFET forming region 6B is a region (p-type MISFET forming region 6B) in which a MISFET Q2 of p-channel type is formed on the SOI layer 4.

Note that, while the n-type MISFET forming region 6A and the p-type MISFET forming region 6B are illustrated to be adjacent to each other in FIG. 1 for facilitate understanding, the positional relationship of the n-type MISFET forming region 6A and the p-type MISFET forming region 6B can be changed as necessary.

In the n-type MISFET forming region 6A and the p-type MISFET forming region 6B, well regions PW, NW are formed to the supporting substrate 2, respectively. The p-type well region PW is formed to the n-type MISFET forming region 6A and the n-type well region NW is formed to the p-type MISFET forming region 6B.

Note that, a deep well region DW may be formed to a lower side (opposite to the main surface) of the p-type well region PW formed to the n-type MISFET forming region 6A.

First, a specific configuration of the MISFET Q1 of n-channel type formed in the n-type MISFET forming region 6A will be described.

A gate electrode GE of the n-channel type MISFET Q1 is formed on the p-type well region PW formed to the supporting substrate 2 via the BOX layer 3, the SOI layer 4, and a gate insulator GI.

The gate insulator GI is, for example, a silicon oxide film or a silicon oxynitride film. Alternatively, as the gate insulator GI, a High-k film (high dielectric constant film) that is a metal oxide film, for example, a hafnium oxide ($HfO_2$) film, a zirconium oxide ($ZrO_2$) film, an aluminum oxide ($Al_2O_3$) film, a tantalum oxide ($Ta_2O_5$) film, or a lanthanum oxide ($La_2O_3$) film can be used. Moreover, as the gate insulator GI, a stacked film of a silicon oxide film (or silicon oxynitride film) and a High-k film (high dielectric constant film) can be used.

The gate electrode GE is, for example, a polycrystalline silicon film (doped poly-silicon film) considered to have a low resistivity as an impurity is introduced therein. Alternatively, as the gate electrode GE, for example, a metal film such as a titanium nitride (TiN) film, a tantalum nitride (TaN) film, a tungsten nitride (WN) film, a titanium carbide (TiC) film, a tantalum carbide (TaC) film, a tungsten carbide (WC) film, or a tantalum carbonitride (TaCN) film can be used. Moreover, the gate electrode GE can be in a MIPS (Metal Inserted Poly-silicon Stack) structure which is a stacked structure of these metal films and a polycrystalline silicon film. Then, on a sidewall of the gate electrode GE, a sidewall spacer SW is formed as a sidewall insulator.

To portions on both sides interposing the gate electrode GE to which the sidewall spacer SW is formed in the n-type MISFET forming region 6A, source/drain regions SD formed of a silicon layer formed by selectively growing by selective epitaxial growth on the SOI layer are formed. In the n-type MISFET forming region 6A, the source/drain regions SD are n-type semiconductor regions in which an n-type impurity, for example, phosphorus (P) or arsenic (As) is diffused.

Note that, instead of the source/drain regions SD formed on the SOI layer 4 by selective epitaxial growth, n-type semiconductor regions are formed by diffusing an n-type impurity in the portions that is the SOI layer 4 on both sides interposing the gate electrode GE to which the sidewall spacer SW can be formed to be source/drain regions. In addition, $n^-$-type semiconductor regions (extension regions) and $n^+$-type semiconductor regions (source/drain extension regions having a higher impurity concentration than the $n^-$-type semiconductor regions can be formed in the SOI layer 4 to be source/drain regions in an LDD (Lightly Doped Drain) structure.

Further, on the source/drain regions SD and on the gate electrode GE, a metal silicide layer such as a cobalt silicide layer or a nickel silicide layer can be formed using salicide (Self-aligned Silicide) technology.

Next, a specific configuration of the p-channel type MISFET Q2 formed in the p-type MISFET forming region 6B will be described mainly about points different from the n-channel type MISFET Q1.

A gate electrode GE of the p-channel type MISFET Q2 is formed in the p-type MISFET forming region 6B and on the n-type well region NW formed to the supporting substrate 2 via a BOX layer 3, an SOI layer 4, and the gate insulator GI. As the gate insulator GI, materials same as those of the gate insulator GI of the n-channel type MISFET Q1 can be used. In addition, as the gate electrode GE, materials same as those of the gate electrode GE of the n-channel type MISFET Q1 can be used. Moreover, on sidewalls of the gate electrode GE, sidewall spacers SW are formed as sidewall insulators.

To portions on both sides interposing the gate electrode GE to which the sidewall spacers SW are formed in the p-type MISFET forming region 6b, source/drain regions SD formed of a silicon layer selectively grown by selective epitaxial growth on the SOI layer are formed. In the p-type MISFET forming region 6B, the source/drain regions SD are p-type semiconductor regions in which a p-type impurity such as boron (B) is diffused.

Note that, also in the p-type MISFET forming region 6B, in the same manner as the n-type MISFET forming region 6A, p-type semiconductor regions can be formed by diffusing a p-type impurity in portions that are the SOI layer 4 on both sides interposing the gate electrode GE to which the sidewall spacers SW are formed to be the source/drain regions. Also, in the p-type MISFET forming region 6B, the source/drain regions can be in the LDD structure. Moreover, also in the p-type MISFET forming region 6B, a metal salicide layer can be formed on the source/drain regions and the gate electrode GE using salicide technology.

In this manner, the n-channel type MISFET Q1 is formed in the n-type MISFET forming region 6A and the p-channel type MISFET Q2 is formed in the p-type MISFET forming region 6B.

The isolation region 5 is a region for sectioning the n-type MISFET forming region 6A in which the n-channel type MISFET Q1 is formed and the p-type MISFET forming region 6B in which the p-channel type MISFET Q2 is formed. In the isolation region 5, an isolation groove (groove) 7 is formed in the main surface of the SOI substrate 1 penetrating through the SOI layer 4 and the BOX layer 3 so that a bottom surface 7a is positioned in the middle of the thickness of the supporting substrate 2. An isolation film 8 is buried in the groove 7 formed. The isolation film 8 isolates the n-channel type MISFET Q1 formed in the n-type MISFET forming region 6A from the p-channel type MISFET Q2 formed in the p-type MISFET forming region 6B. The isolation film 8 is preferably formed of a silicon oxide film. The isolation film 8 in the isolation region 5 can be formed by the STI (Shallow Trench Isolation) method as described hereinafter.

In the present embodiment, an oxidation resistant film 9 is interposed between a portion of the BOX layer 3 exposed to a side surface 7b of the groove 7 and the isolation film 8. The oxidation resistant film 9 prevents oxidation of the SOI layer 4 upon performing a thermal processing (annealing processing) for baking the isolation film 8 formed to fill the groove 7.

When the supporting substrate 2 and the SOI layer 4 are formed of single crystal silicon and the BOX layer 3 is formed of a silicon oxide film, it is preferable to use a silicon nitride film as the oxidation resistant film 9. Here, the oxidation resistant film 9 can be formed by depositing a silicon nitride film so as to cover the whole surface of the bottom surface 7a and a side surface 7b of the groove 7 after forming the groove 7. Alternatively, the oxidation resistant film 9 can be formed by subjecting the bottom surface 7a and the side surface 7b of the groove 7 to a nitridation processing after forming the groove 7.

In addition, the semiconductor device of the present embodiment may have a MISFET Q3 having a higher withstand voltage than the MISFETs Q1 and Q2 formed to the SOI layer 4. The MISFET Q3 having a high withstand voltage can be formed in a region in a part of the main surface of the SOI substrate 1, that is, a region in which the supporting substrate 2 is exposed by removing the SOI layer 4 and the BOX layer 3. Here, to the SOI substrate 1, as illustrated in FIG. 1, a high-withstand-voltage MISFET formation region 6C for forming the MISFET Q3 having a high withstand voltage is formed where the supporting substrate 2 is exposed is defined.

When the high-withstand-voltage MISFET Q3 is an n-channel type MISFET, in the high-withstand-voltage MISFET forming region 6C, for example, a high-withstand-voltage well region HW having a smaller p-type impurity concentration than the p-type well PW in the n-type MISFET forming region 6A can be formed to the supporting substrate 2. Alternatively, when the high-withstand-voltage MISFET Q3 is a p-channel type MISFET, in the high-withstand-voltage MISFET forming region 6C, for example, a high-withstand-voltage well region HW having a smaller n-type impurity concentration than the n-type well region NW in the p-type MISFET forming region 6B can be formed to the supporting substrate 2.

A gate electrode GE of the MISFET Q3 having a high withstand voltage is formed on the high-withstand-voltage well region HW formed to the supporting substrate 2 interposing a gate insulator GI in the high-withstand-voltage MISFET forming region 6C. As the gate insulator GI, a material same as that of the gate insulator GI of the n-channel type MISFET Q1 can be used. Also, as the gate electrode GE, a material same as that of the gate electrode GE of the n-channel type MISFET Q1 can be used. Moreover, a sidewall spacer SW as a sidewall insulator is formed on sidewalls of the gate electrode GE.

To portions in the high-withstand-voltage MISFET forming region 6C on both sides interposing the gate electrode GE where the sidewall spacers SW are formed, source/drain regions SD are formed by diffusing an impurity in the supporting substrate 2.

Note that, also in the high-withstand-voltage MISFET forming region 6C, the source/drain regions SD can be in the LDD structure in the same manner as the n-type MISFET forming region 6A. Further, also in the high-withstand-voltage MISFET forming region 6C, a metal silicide layer can be formed on the source/drain regions SD and on the gate electrode GE using the salicide technology.

On the whole surface of the main surface (surface) of the SOI substrate 1 described above, an interlayer insulator 10 is formed so as to cover the gate electrodes GE, sidewall spacers SW, and source/drain regions SD of the n-channel type MISFET Q1, the p-channel type MISFET Q2, and the high-withstand-voltage MISFET Q3, respectively. The interlayer insulator 10 is formed of, for example, a single film of a silicon oxide film or a stacked film of a silicon nitride film and a silicon oxide film having a larger thickness than the silicon nitride film (the silicon nitride film is positioned at a lower layer) or the like. An upper surface of the interlayer insulator 10 is planarized to have a height substantially coinciding with those of the n-type MISFET forming region 6A, p-type MISFET forming region 6B and the high-withstand-voltage MISFET forming region 6C.

To the interlayer insulator 10, contact holes CNT are formed, and conductive plugs PG are formed inside the contact holes CNT. The contact holes CNT and the plugs PG to fill in the contact holes CNT are formed on the source/drain regions SD and on the gate electrodes GE etc. in the n-type MISFET forming region 6A, the p-type MISFET forming region 6B and the high-withstand-voltage MISFET forming region 6C. Bottom portions of the plugs PG are electrically connected to the source/drain regions and the gate electrodes GE formed in the n-type MISFET forming region 6A, the p-type MISFET forming region 6B and the high-withstand-voltage MISFET forming region 6C.

On the interlayer insulator 10 in which the plugs PG are buried, an insulating film 11 formed of, for example, a silicon oxide film is formed, and a wiring M1 as a first-layer wiring is formed inside wiring grooves (openings) formed in the insulating film 11. The wiring M1 is electrically connected to the source/drain regions SD and the gate electrodes GE etc. formed in the n-type MISFET forming region 6A, the p-type MISFET forming region 6B and the high-withstand-voltage MISFET forming region 6C via the plugs PG.

While the wiring M1 is formed by the damascene technology (single damascene technology here), as another aspect, the wiring M1 can be formed of a patterned conductor film (for example, a tungsten wiring or aluminum wiring).

<Manufacturing Process of the Semiconductor Device>

Figure 3:
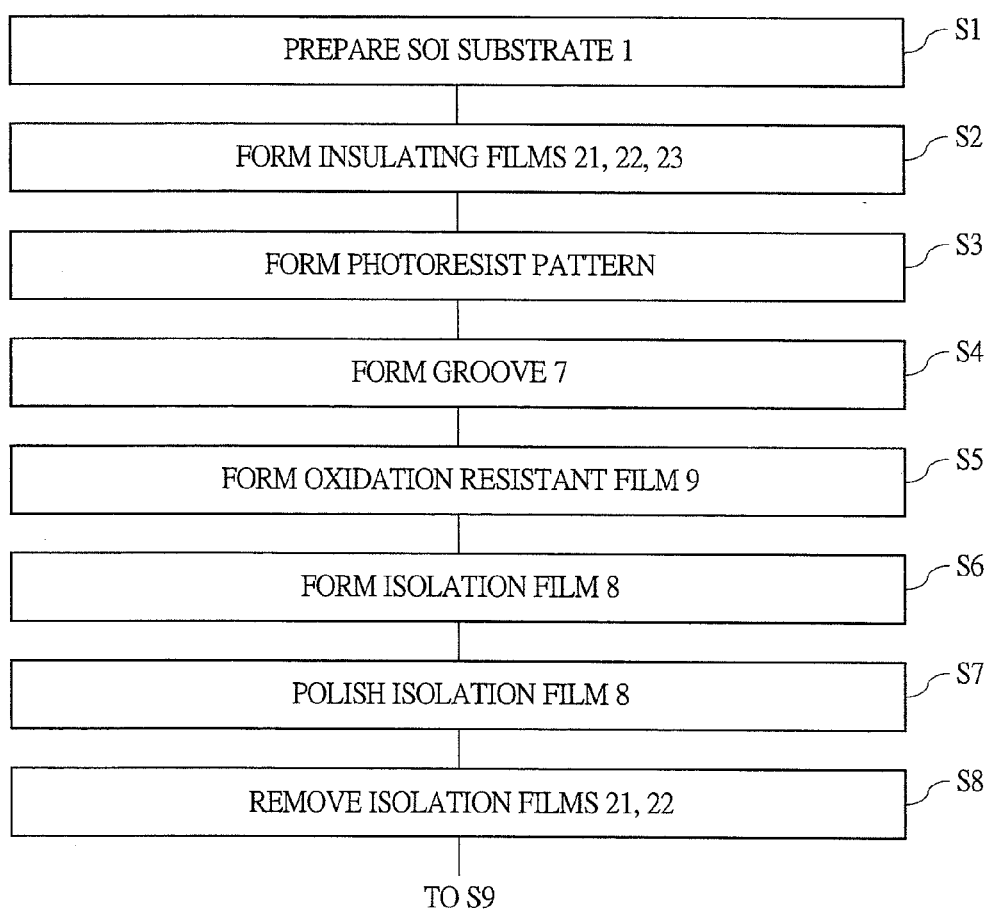
FIG. 3 is a manufacturing process flow diagram illustrating a part of a manufacturing process of the semiconductor device of according to the first embodiment.
Figure 4:
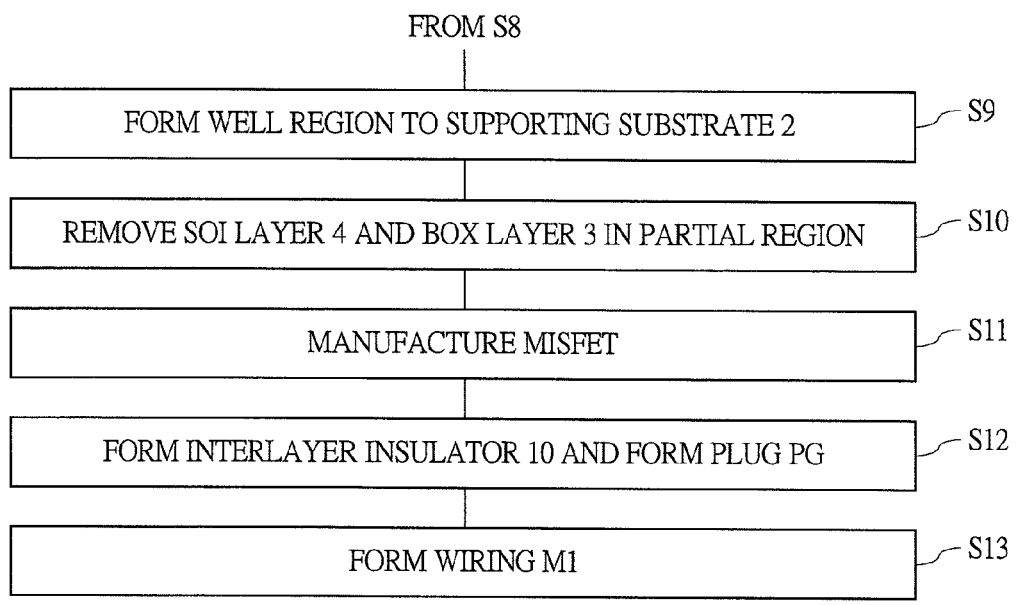
FIG. 4 is a manufacturing process flow diagram illustrating a part of the manufacturing process of the semiconductor device of according to the first embodiment.

A manufacturing process of the semiconductor device according to the present embodiment will be described with reference to the drawings. FIGS. 3 and 4 are manufacturing process flow charts illustrating a part of the manufacturing process of the semiconductor device according to the first embodiment. FIGS. 5 to 12 and FIGS. 18 to 22 are cross-sectional views of main parts during the manufacturing process of the semiconductor device according to the first embodiment. FIG. 13 is a manufacturing process flow chart illustrating a part of a manufacturing process of a semiconductor device according to a first modification example of the first embodiment. FIGS. 14 to 17 are cross-sectional views of main parts during the manufacturing process of the semiconductor device according to the first modification example of the first embodiment. Note that, in FIGS. 5 to 12 and FIGS. 14 to 17, a vicinity of the isolation region is illustrated in an enlarged manner.

Figure 5:
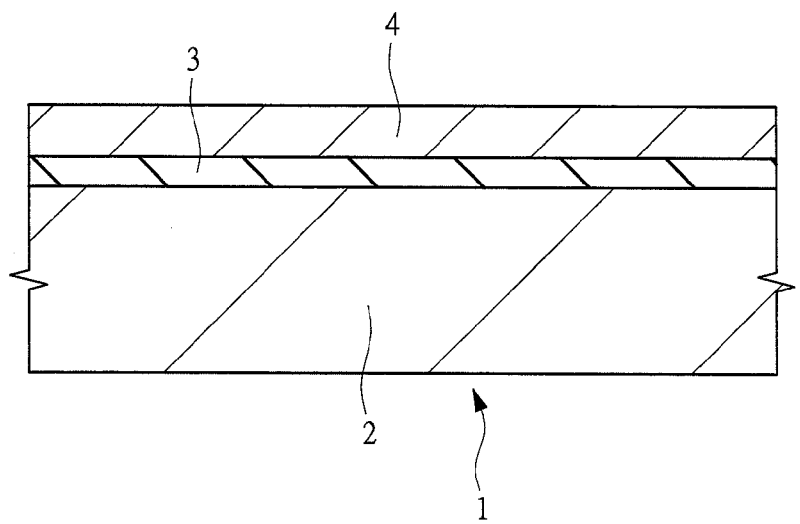
FIG. 5 is a cross-sectional view of main parts of the semiconductor device during the manufacturing process according to the first embodiment.

First, as illustrated in FIG. 5, the SOI substrate 1 is prepared (step S1 in FIG. 3). As described above, the SOI substrate 1 includes: the supporting substrate 2 which is a base; a BOX layer 3 of an insulating film, that is, a buried oxide film formed on a main surface (surface) of the supporting substrate 2; and an SOI layer 4, which is a semiconductor layer formed on the BOX layer 3. The supporting substrate 2 is, for example, a single crystal silicon plate. The BOX layer 3 is, for example, a silicon oxide film and has a thickness of, for example, about 4 to 100 nm. Moreover, the SOI layer 4 is, for example, a single crystal silicon layer and has a thickness of, for example, about 4 to 100 nm.

Next, the isolation film 8 is formed in the isolation region 5 of the SOI substrate 1 by the STI method.

Figure 6:
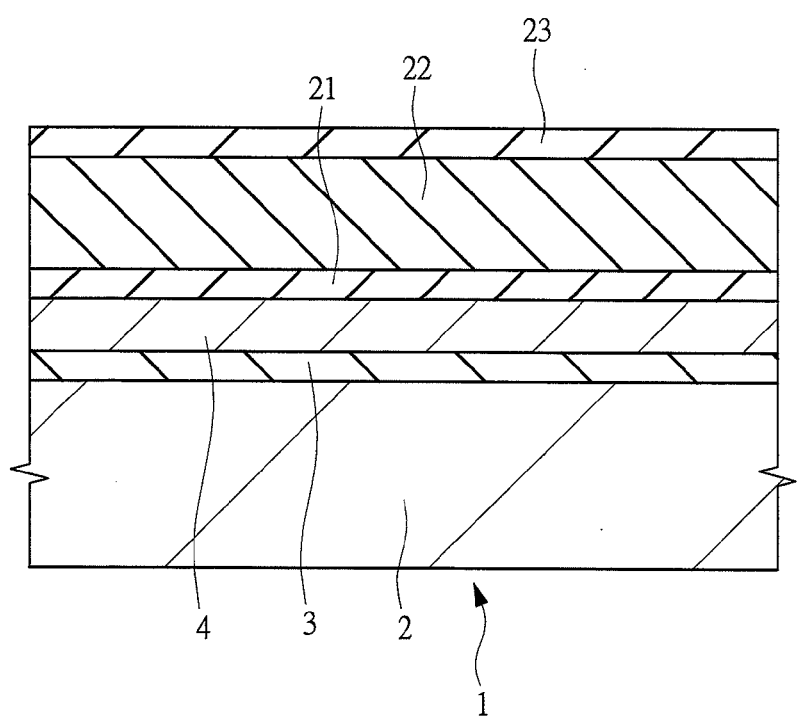
FIG. 6 is a cross-sectional view of main parts of the semiconductor device during the manufacturing process according to the first embodiment.

As illustrated in FIG. 6, on the whole surface of the main surface (surface) of the SOI layer 1, an insulating film 21, an insulating film 22, and an insulating film 23 are sequentially formed (step S2 in FIG. 3). First, the SOI layer 1 is oxidized (preferably, thermally oxidized) and the insulating film (oxide film) 21 is formed on the whole surface of the main surface (surface) of the SOI layer 1, that is, on the SOI layer 4. Next, on the whole surface of the main surface (surface) of the SOI layer 1, that is, on the insulating film 21, the insulating film 22 is formed (deposited) by a CVD (Chemical Vapor Deposition) method (for example, thermal CVD method) or the like. Next, on the whole surface of the main surface 8 surface) of the SOI layer 1, that is, on the insulating film 22, the insulating film 23 is formed (deposited) preferably by a CVD method (preferably thermal CVD). The insulating film 21 is preferably formed of a silicon oxide film. The insulating film 22 is preferably formed of a silicon nitride film. The insulating film 23 is preferably formed of a silicon oxide film. A thickness of the insulating film 21 may be, for example, about 5 to 20 nm. A thickness of the insulating film 22 may be, for example, about 50 to 150 nm. A thickness of the insulating film 23 may be, for example, about 10 to 100 nm.

Figure 7:
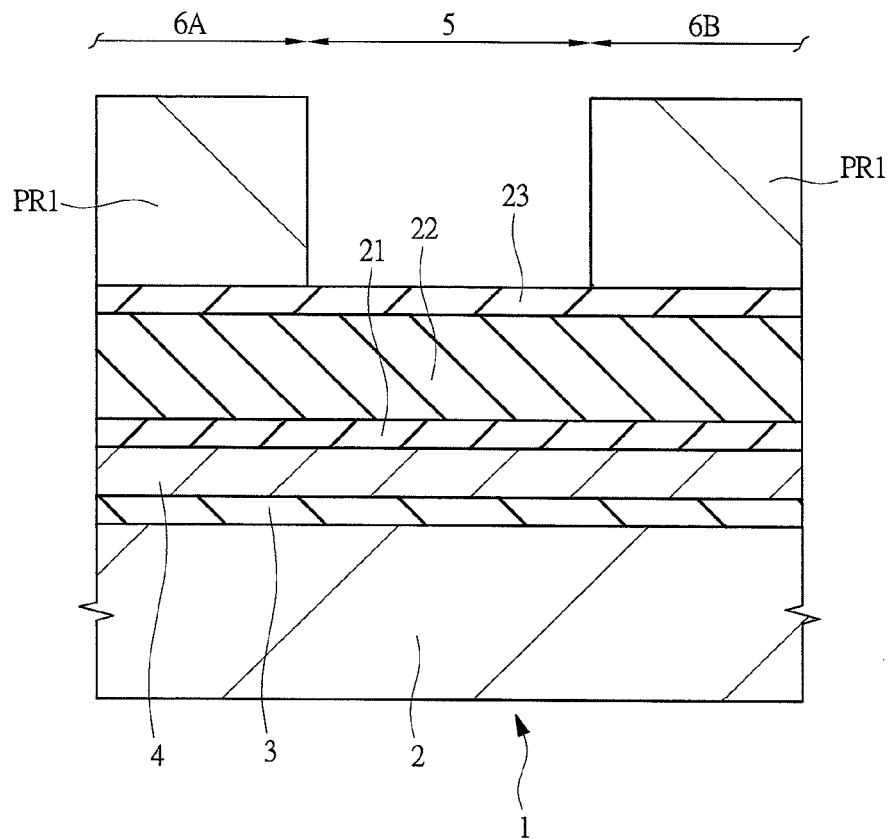
FIG. 7 is a cross-sectional view of main parts of the semiconductor device during the manufacturing process according to the first embodiment.

Next, on the whole surface of the main surface (surface) of the SOI layer 1, that is, on the insulating film 23, a photoresist pattern PR1 is formed as illustrated in FIG. 7 by applying a photoresist layer on the insulating film 23 and exposing and developing the photoresist layer (step S3 in FIG. 3). The photoresist pattern PR1 has an opening in the isolation region 5.

Figure 8:
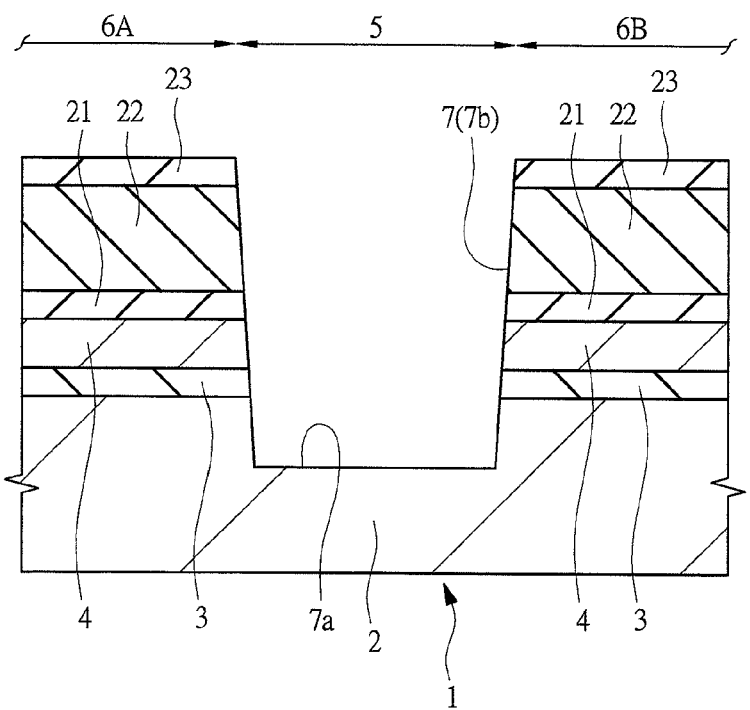
FIG. 8 is a cross-sectional view of main parts of the semiconductor device during the manufacturing process according to the first embodiment.

Next, with using the photoresist pattern PR1 as an etching mask, the insulating film 23, the insulating film 22, the insulating film 21 and the SOI layer 1 are sequentially dry-etched (in plasma dry etching) to form the groove (isolation groove) 7 as illustrated in FIG. 8 (step S4 in FIG. 3). In the step S4, the groove 7 is formed by, for example, plasma dry etching. The groove 7 is formed through the insulating film 23, the insulating film 22, the insulating film 21, the SOI layer 4, the BOX layer 3, and the supporting substrate 2. More specifically, the groove 7 is formed to penetrate the insulating film 23, the insulating film 22, the insulating film 21, the SOI layer 4 and the BOX layer 3 so that the bottom surface 7a of the groove 7 is positioned in the middle of the thickness of the supporting substrate 2. Therefore, the supporting substrate 2 is exposed to the bottom surface 7a of the groove 7 and the side surface 7b and the BOX layer 3, the SOI layer 4, the insulating film 21, the insulating film 22 and the insulating film 23 are exposed to the side surface 7b of the groove 7. A depth of the groove 7 in the supporting substrate 2 (depth to the bottom surface 7a of the groove 7 from the upper surface of the supporting substrate 2) is, for example, about 300 to 700 nm. After forming the groove 7, the photoresist pattern PR1 is removed. In FIG. 8, a stage (state) in which the photoresist pattern PR1 is removed is illustrated.

Figure 9:
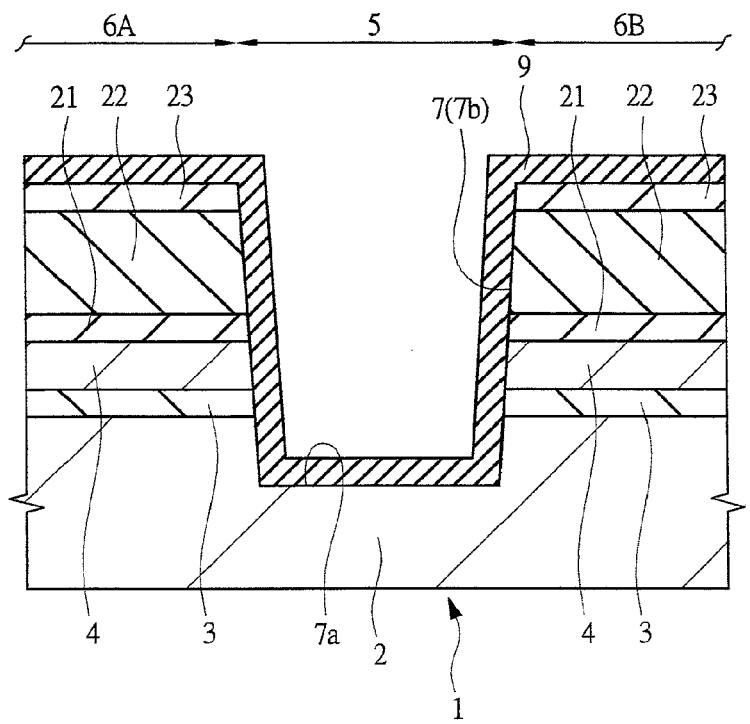
FIG. 9 is a cross-sectional view of main parts of the semiconductor device during the manufacturing process according to the first embodiment.

Next, as illustrated in FIG. 9, the oxidation resistant film 9 is formed (deposited) by a CVD method (for example, thermal CVD method) to cover the inside of the groove 7 (that is, the bottom surface 7a and side surface 7b of the groove 7) and a surface of the insulating film 23 (step S5 in FIG. 3). Here, in the supporting substrate 2, the portion exposed to the bottom surface 7a and side surface 7b of the groove and the portions of the BOX layer 3, SOI layer 4, the insulating film 21, the insulating film 22, and the insulating film 23 exposed to the side surface 7b of the groove 7 are covered by the oxidation resistant film 9 over the whole surface. The oxidation resistant film 9 is preferably formed of a silicon nitride film. The oxidation resistant film 9 can prevent oxidation of the SOI layer 4 due to oxygen supplied through the isolation film 8 upon performing thermal processing in each step such as the thermal processing (annealing processing) of the isolation film 8 described later and so forth. A thickness of the oxidation resistant film 9 may be about 1 to 10 nm.

Figure 10:
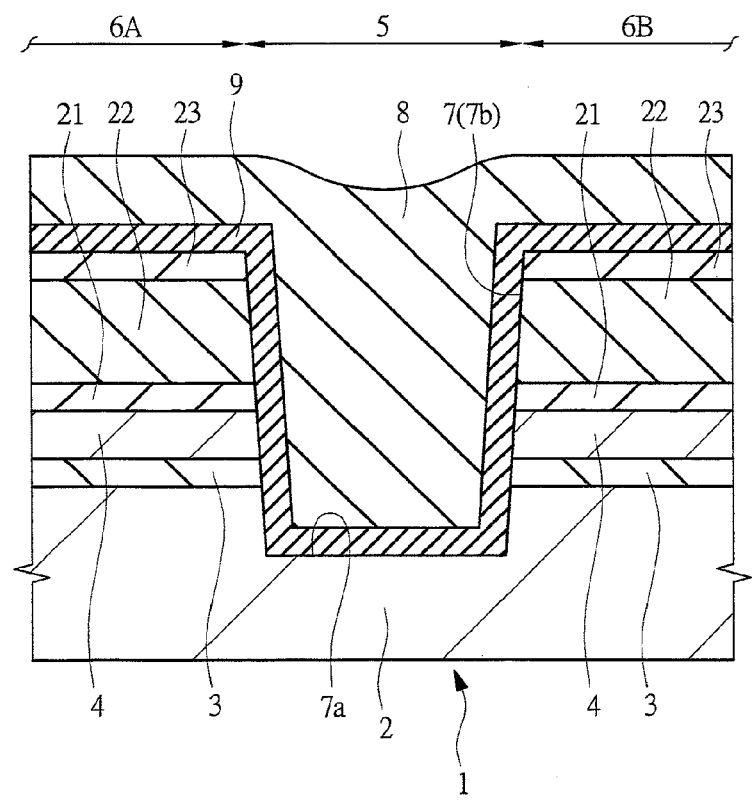
FIG. 10 is a cross-sectional view of main parts of the semiconductor device during the manufacturing process according to the first embodiment.

Next, as illustrated in FIG. 10, on the whole surface of the main surface (surface) of the SOI layer 1, that is, on the oxidation resistant film 9, the isolation film 8 is formed (deposited) to fill the groove 7 (step S6 in FIG. 3). The isolation film 8 is preferably formed of a silicon oxide film. The isolation film 8 is preferably formed by a plasma CVD method and more preferably by a HDP-CVD method (HDP: High Density Plasma). The isolation film 8 is formed to have a thickness capable of filling the groove 7. While it depends on the depth of the groove 7, the thickness of the isolation film 8 may be, for example, about 500 to 1000 nm. When the isolation film 8 is formed by a plasma CVD (particularly, HDP-CVD method), the oxidation resistant film 9 also has a function of preventing damage to the SOI substrate 1 upon depositing the isolation film 8.

Next, a thermal processing (annealing processing) for baking the isolation film 8 buried inside the groove 7 is performed. This thermal processing can be performed by subjecting the SOI substrate 1 to a thermal processing at about 400 to 1200° C.

Figure 11:
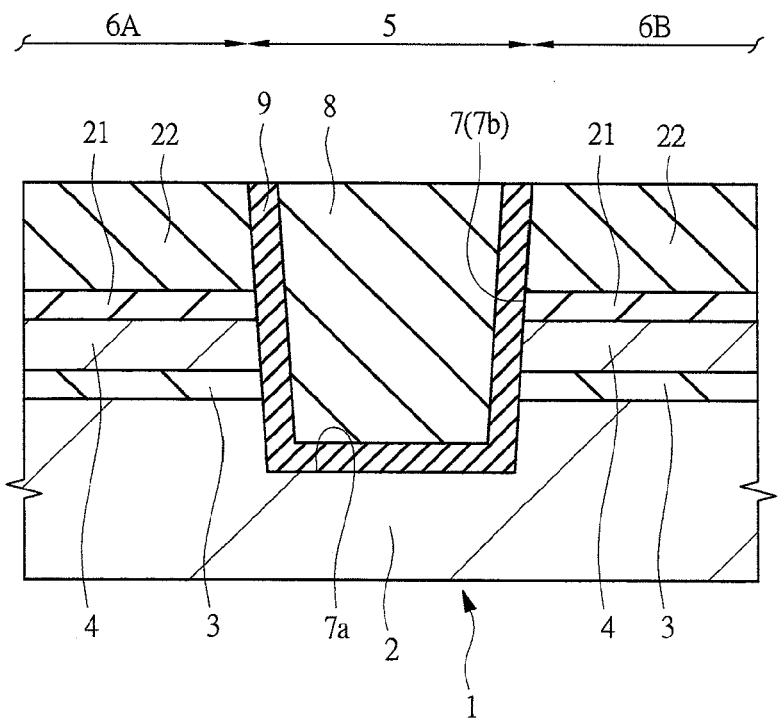
FIG. 11 is a cross-sectional view of main parts of the semiconductor device during the manufacturing process according to the first embodiment.

Next, the isolation film 8 is polished by a CMP (Chemical Mechanical Polishing) method (step S7 in FIG. 3). In this manner, as illustrated in FIG. 11, the isolation film 8 outside the groove 7 is removed, leaving the isolation film 8 inside the groove 7. Also, upon the CMP processing, the isolation film 8 on the insulating film 22, the oxidation resistant film 9 and the insulating film 23 are also removed and the upper surface of the insulating film 22 is exposed. Further, since the CMP processing is performed in a condition to make the polishing speed of the insulating film 22 (silicon nitride film) smaller than that of the isolation film 8 and the insulating film 23, the insulating film 22 can function as a stopper film (or protective film) in the CMP processing.

Figure 12:
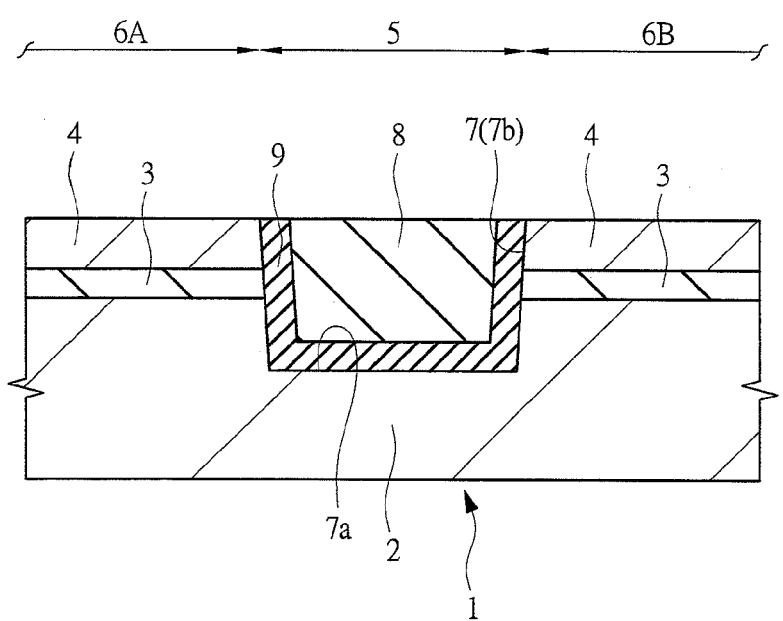
FIG. 12 is a cross-sectional view of main parts of the semiconductor device during the manufacturing process according to the first embodiment.
Figure 13:
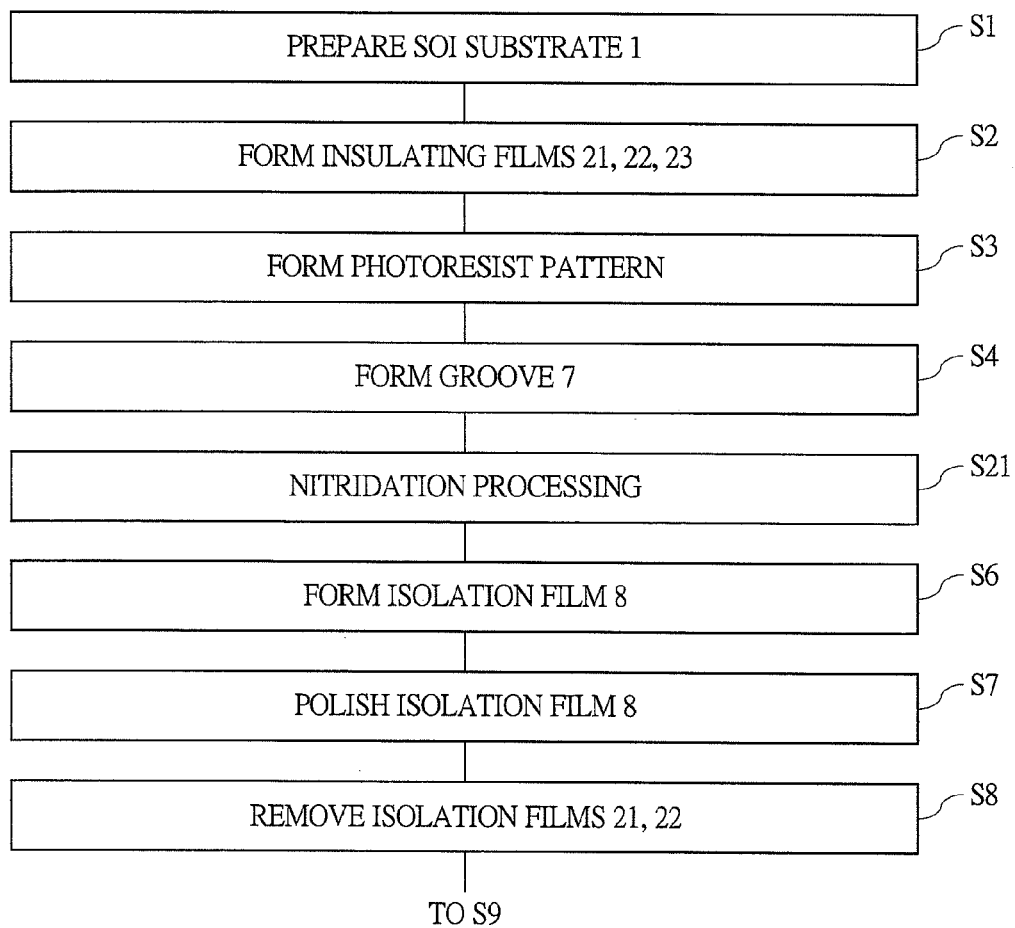
FIG. 13 is a manufacturing process flow diagram illustrating a part of a manufacturing process of a semiconductor device of a first modification example of the first embodiment.

Next, as illustrated in FIG. 12, the insulating films 22 and 21 are removed and the isolation film 8 is etched by a desired amount and a processing of reducing a step between the isolation film 8 buried in the groove 7 and the SOI layer 4 is performed (step S8 in FIG. 3). First, the insulating film 22 is removed by wet etching using a chemical (etching solution) such as hot phosphoric acid. As the wet etching here is performed in an etching condition to make the etching speed of the isolation film 8 and the insulating film 21 (silicon oxide film) smaller than that of the insulating film 22 (silicon nitride film), the insulating film 22 is selectively removed and the upper surface of the insulating film 21 is exposed. Next, by wet etching using a chemical (etching solution) such as hydrofluoric acid, the insulating film 21 is removed. As the insulating film 21 is removed, the upper surface of the SOI layer 4 is exposed. In addition, the wet etching of the insulating film 21 is performed only to such an extent that the upper surface of the SOI layer 4 is exposed as the insulating film 21 is removed, the isolation film 8 inside the groove 7 and the oxidation resistant film 9 are barely removed and remain. Next, an upper portion (upper surface) of the isolation film 8 in the groove 7 is etched back by dry etching (plasma dry etching) so that the upper surface of the isolation film 8 in the groove 7 is set back. Here, the dry etching (plasma dry etching) is preferably finished before a position of the height of the upper surface of the isolation film 8 in the groove 7 gets lower than that of that of the upper surface of the SOI layer 4. FIG. 12 illustrates a state in which the position of the height of the upper surface of the isolation film 8 in the groove 7 is substantially equal to that of the upper surface of the SOI layer 4 as the step is removed.

Here, as the first modification example, as illustrated in FIGS. 14 to 17, instead of depositing a silicon nitride film, the oxidation resistant film 9 may be formed by nitriding the inside of the groove 7.

Figure 14:
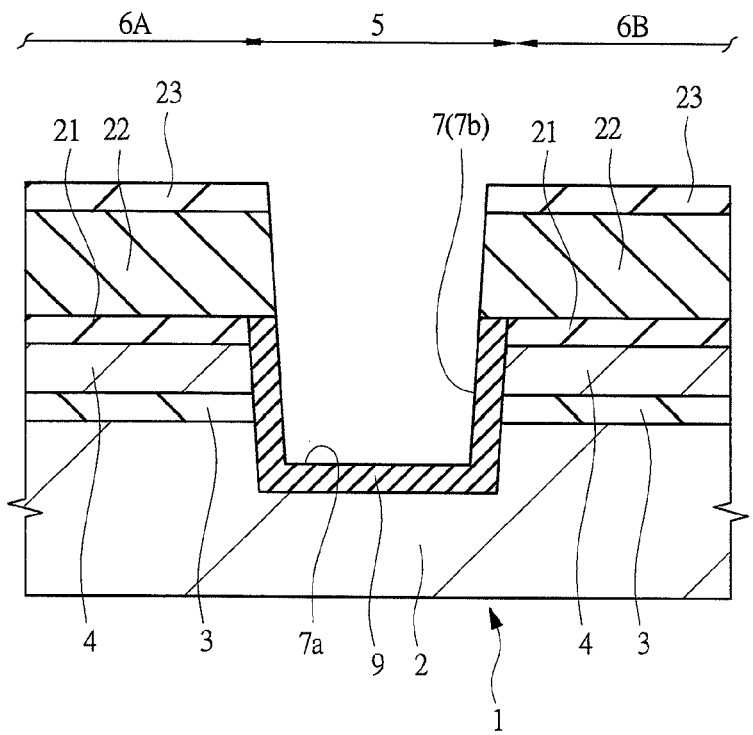
FIG. 14 is a cross-sectional view of main parts of the semiconductor device during the manufacturing process according to the first modification example of the first embodiment.

In the first modification example, first, by performing a process (steps S1 to S4 in FIG. 13) in the same manner as the process illustrated in FIGS. 5 to 8 (steps S1 to S4 in FIG. 3), the groove 7 is formed in the isolation region 5. After forming the groove 7 in the isolation region 5, instead of the process illustrated in FIG. 9 (step S5 in FIG. 3), as illustrated in FIG. 14, the inside of the groove 7 (that is, the bottom surface 7a and the side surface 7b of the groove 7) is subjected to a nitridation process (step S21 in FIG. 13). From this nitridation process, among the SOI layer 4, the BOX layer 3 and the supporting substrate 2, the portions exposed to the groove 7 are nitrided and become the oxidation resistant film 9. That is, among the SOI layer 4, the BOX layer 3 and the supporting substrate 2, the portions exposed to the groove 7 are covered by the oxidation resistant film 9 over the whole surface. For example, when the SOI layer 4 is a single crystal silicon layer, the portion exposed to the groove 7 is nitrided and becomes a silicon nitride film. In the same manner, when the supporting substrate 2 is a single crystal silicon substrate, the portion exposed to the groove 7 is nitrided and becomes a silicon nitride film. Moreover, when the BOX layer 3 is a silicon oxide film, the portion exposed to the groove 7 is nitrided and becomes a silicon oxynitride film. Both of the silicon nitride film and silicon oxynitride film are more difficult for oxygen to diffuse therein than a silicon oxide film. Therefore, the oxidation resistant film 9 can prevent oxidation of the SOI layer 4 due to oxygen supplied through the isolation film 8 upon performing thermal process in each process of the thermal process (annealing process) of the isolation film 8 etc. Moreover, the thickness of the oxidation resistant film 9 formed in the nitridation process may be, for example, about 1 to 5 nm.

The nitridation process can be performed by, for example, plasma nitridation or thermal nitridation. The plasma nitridation is a method of subjecting a substrate surface to a nitride processing by generating nitride ion or nitride radical (active species) by exciting a nitride-based gas such as nitride ($N_2$) gas by plasma and exposing the SOI substrate 1 to the nitride-based gas so that the substrate surface is nitrided by the nitride ion or nitride radical (active species). In addition, the thermal nitridation is a method of nitriding processing on the substrate surface by maintaining the substrate surface at, for example, about 1000° C. in atmosphere of, for example, nitride monoxide (NO) gas.

When performing the nitridation by the plasma nitridation, a silicon oxynitride film is easily formed to the portion exposed to the groove 7 of the BOX layer 3 formed of a silicon oxide film. However, in the case of the SOI layer 4 and the supporting substrate 2, it is not easy to form the silicon nitride film since nitridation from the surface portion exposed to the groove 7 to deeper inside is not progressed.

Meanwhile, when performing the nitridation processing by the thermal nitridation using No gas, it is easy for also the SOI layer 4 and the supporting substrate 2 to be nitrided from the surface portion exposed to the groove 7 to deeper inside and the silicon nitride film is easily formed. Therefore, it is preferable to perform the nitridation processing by, for example, the thermal nitridation using NO gas.

Figure 15:
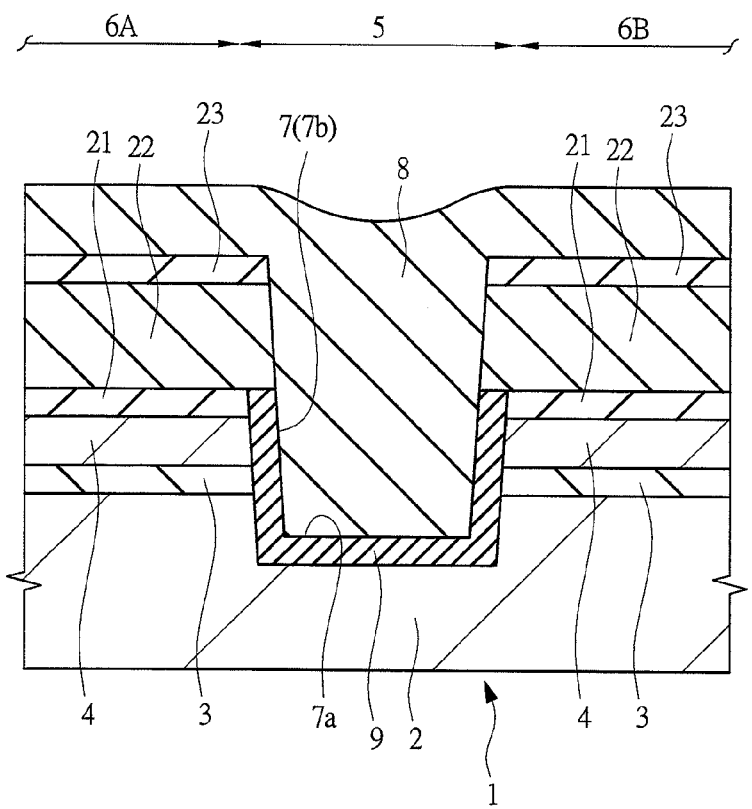
FIG. 15 is a cross-sectional view of main parts of the semiconductor device during the manufacturing process according to the first modification example of the first embodiment.
Figure 16:
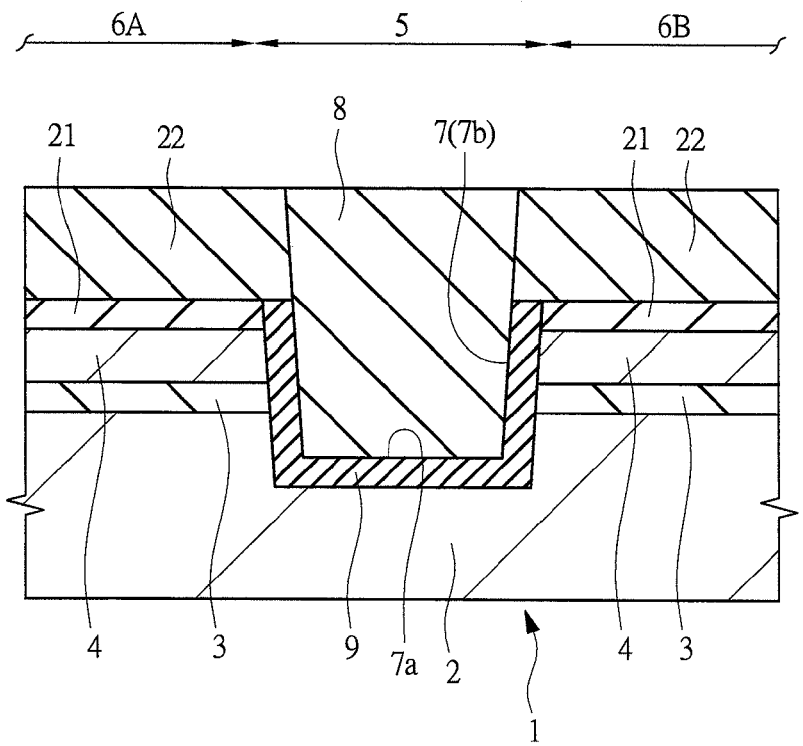
FIG. 16 is a cross-sectional view of main parts of the semiconductor device during the manufacturing process according to the first modification example of the first embodiment.
Figure 17:
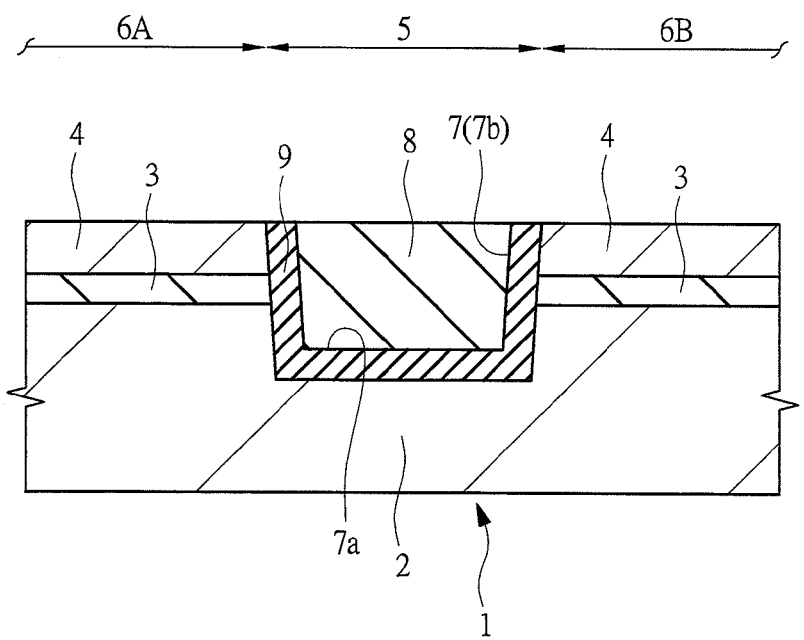
FIG. 17 is a cross-sectional view of main parts of the semiconductor device during the manufacturing process according to the first modification example of the first embodiment.

Thereafter, in the same manner as the process illustrated in FIGS. 10 to 12 (steps S6 to S8 in FIG. 3), the process illustrated in FIGS. 15 to 17 (S6 to S8 in FIG. 13) is performed. In this manner, the isolation film 8 is formed to fill the groove 7 and a treatment for reducing the step between the isolation film 8 buried in the groove 7 and the SOI layer 4 is performed.

Figure 18:
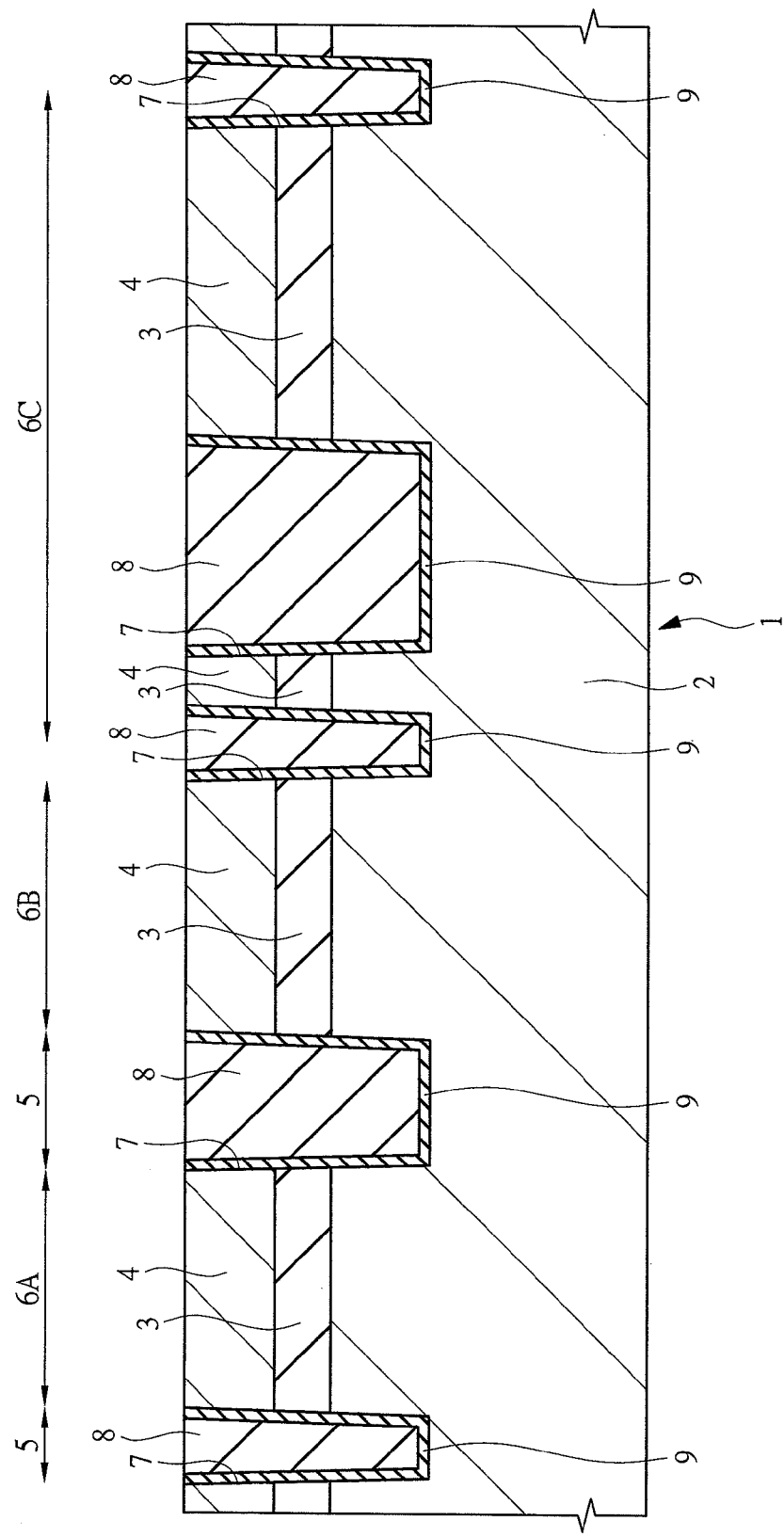
FIG. 18 is a cross-sectional view of main parts of the semiconductor device during the manufacturing process according to the first embodiment.

In the manner as described above, as illustrated in FIG. 12 or 17, the isolation film 8 is formed by the STI method. In addition, as illustrated in FIG. 18, over the whole surface of the main surface (surface) of the SOI substrate 1, in a plurality of the isolation regions 5, the isolation film 8 is formed. Since the isolation film 8 is formed in the isolation region 5, the SOI substrate 1 is defined (sectioned) into the MISFET forming regions (active regions) 6A, 6B and 6C by the isolation regions 5 to which the isolation film 8 is formed. Moreover, to the MISFET forming regions 6A, 6B and 6C, various semiconductor elements (for example, the MISFETs Q1, Q2, Q3 etc. described hereinafter) are formed in following process.

Note that, while an example of having the structure illustrated in FIG. 12 (the present embodiment) will be exemplified and described from FIG. 18 represented by FIGS. 12 and 18, the situation of having the structure illustrated in FIG. 17 (the first modification example) can be made in substantially the same manner.

Figure 19:
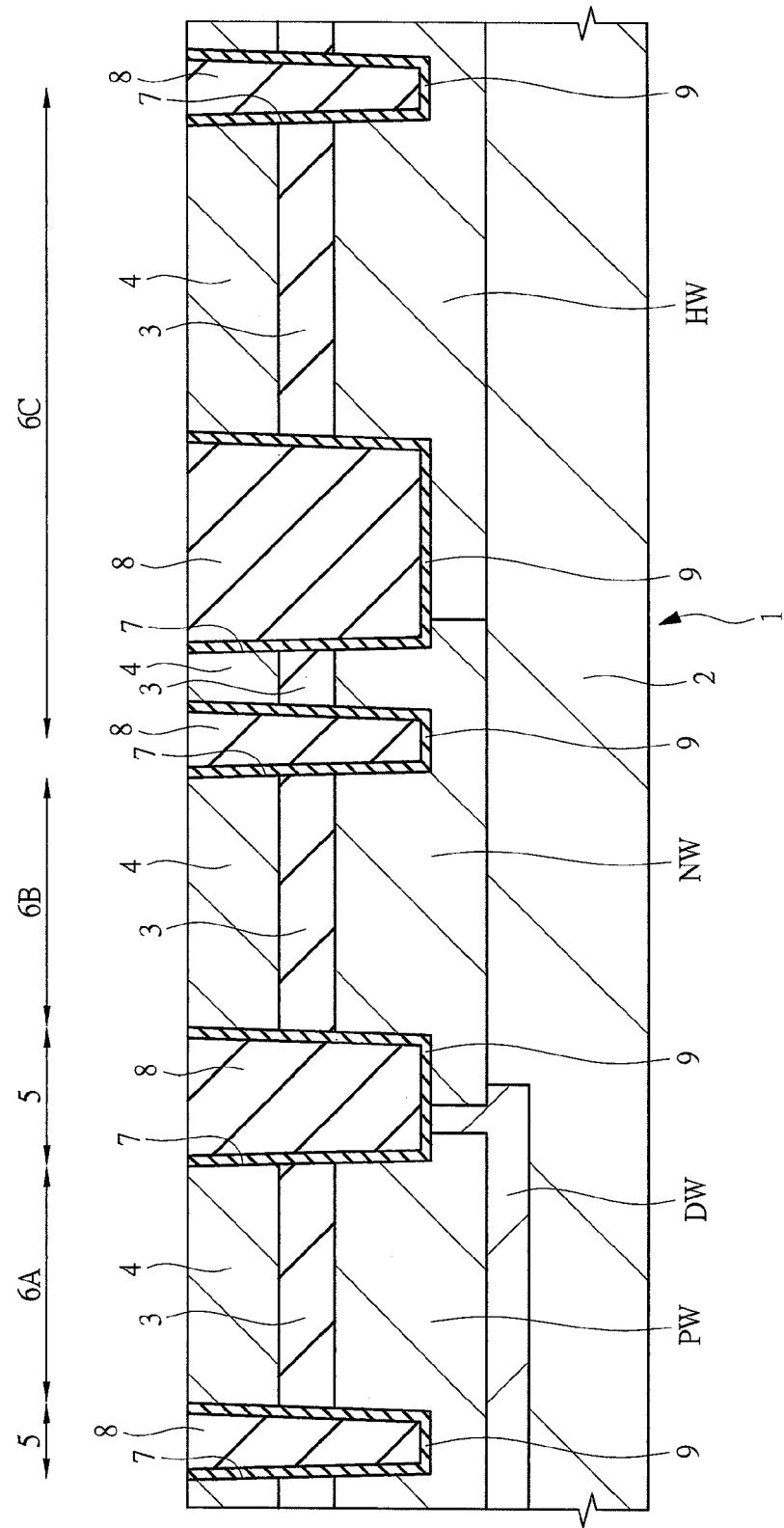
FIG. 19 is a cross-sectional view of main parts of the semiconductor device during the manufacturing process according to the first embodiment.

Next, as illustrated in FIG. 19, a well region is formed from the upper surface of the supporting substrate 2 to a predetermined depth (step S9 in FIG. 4).

In the present embodiment, the p-type well PW containing a p-type impurity (for example, boron) and the n-type well NW containing an n-type impurity (for example, phosphorus or arsenic) are formed. The p-type well PW is formed by using, for example, ion injection to introduce a p-type impurity into the supporting substrate 2. For example, ions of boron (B) are implanted at a concentration of $5 \times 10^{12}$ to $5 \times 10^{13}/cm^2$ to form the p-type well region PW having an impurity concentration of $5 \times 10^{17}$ to $5 \times 10^{18}/cm^3$. The n-type well NW can be formed by using, for example, ion injection introducing an n-type impurity into the supporting substrate 2. For example, ions of phosphorus (P) or arsenic (As) are implanted at a concentration of $5 \times 10^{12}$ to $5 \times 10^{13}/cm^2$ to form the n-type well NW having an impurity concentration of $5 \times 10^{17}$ to $5 \times 10^{18}/cm^3$.

In addition, by adjusting the conditions of the ion injection, the impurities forming the well regions are controlled not to be injected to the SOI layer 4. That is, the impurity is not injected to the SOI layer 4 so that a channel region of a transistor is non-doped. However, the conditions of the ion injection can be adjusted to inject the impurities forming the well regions to the SOI layer 4.

Further, the high-withstand-voltage well region HW containing a p-type impurity or n-type impurity may be formed in a partial region in the supporting substrate 2, for example, in a region (the high-withstand-voltage MISFET forming region 6C) where the MISFET Q3 having a high withstand voltage is planned to be formed (see FIG. 19). In the high-withstand-voltage region HW, the MISFET Q3 having a high withstand voltage can be formed by making the impurity concentration in the high-withstand-voltage well region HW smaller than that of the p-type well region PW or the n-type well region NW.

Moreover, the deep well region DW may be formed to a lower side (opposite to the main surface) of the p-type well region PW formed in the n-type MISFET forming region 6A.

Figure 20:
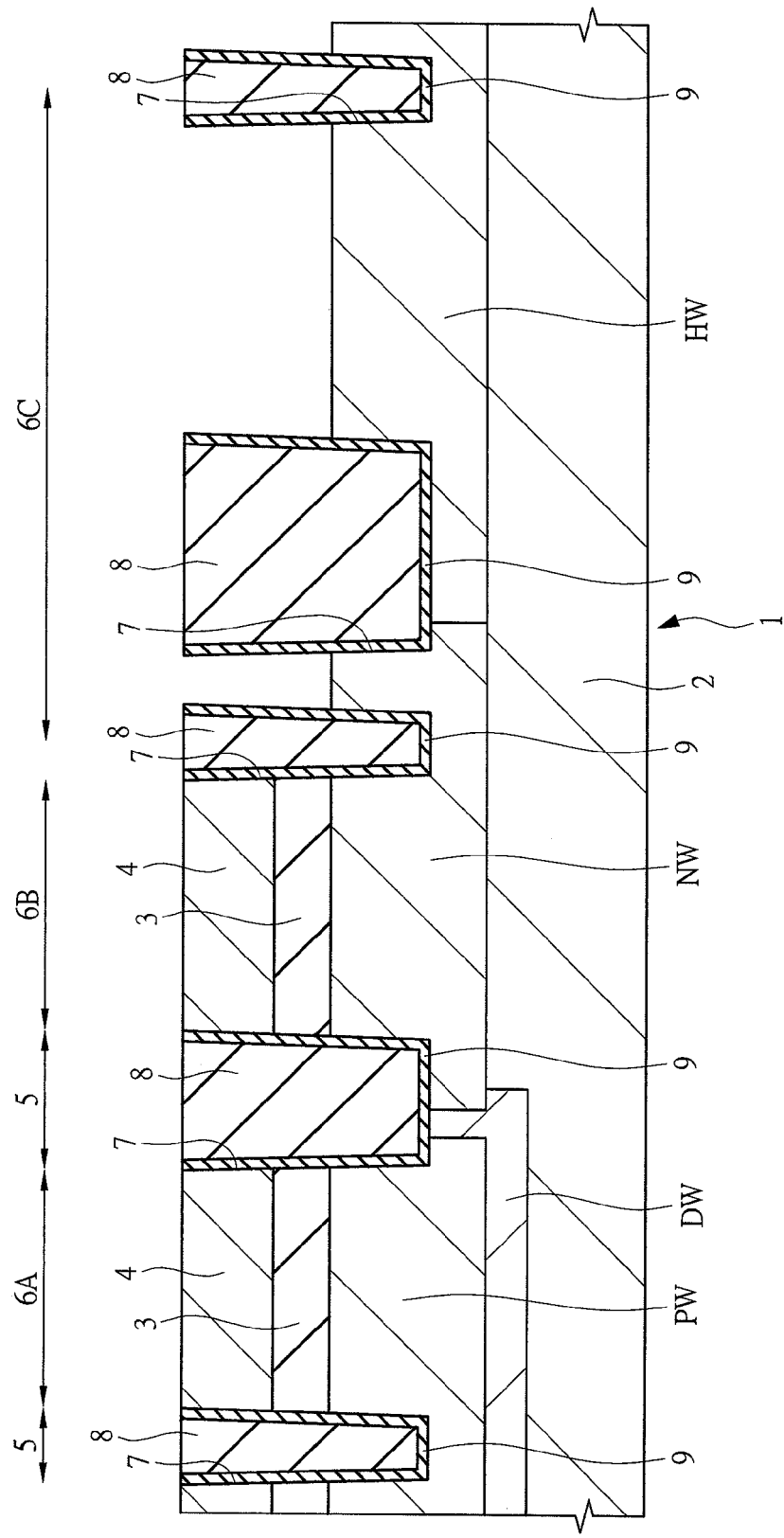
FIG. 20 is a cross-sectional view of main parts of the semiconductor device during the manufacturing process according to the first embodiment.

Next, as illustrated in FIG. 20, by using lithography, dry etching and wet etching, the SOI layer 4 and the BOX layer 3 are removed in the high-withstand-voltage MISFET forming region 6C where the MISFET Q3 having a high withstand voltage (step S10 in FIG. 4). First, on the whole surface of the main surface (surface) of the SOI substrate 1, that is, on the SOI layer 4, a photoresist pattern (not illustrated) is formed by applying a photoresist layer and then exposing and developing the photoresist layer. Next, using the photoresist pattern formed as an etching mask, the SOI layer 4 and the BOX layer 3 are etched to selectively remove the SOI layer 4 and the BOX layer 3 in the portions exposed from the photoresist pattern. Here, the SOI layer 4 and the BOX layer 3 in the portion covered with the photoresist pattern are left without being removed. In the etching, wet etching using hydrofluoric acid or the like as a chemical (etching solution) can be adopted. In the regions in which the SOI layer 4 and the BOX layer 3 are removed, the upper surface of the supporting substrate 2 is exposed. Next, the photoresist pattern is removed. To remove the photoresist pattern, removal by a wet processing may be used, for example, SPM washing using SPM (Sulfuric acid-Hydrogen Peroxide Mixture) solution may be used.

Next, the MISFETs will be manufactured (step S11 in FIG. 4).

First, on the whole surface of the main surface (surface) of the SOI substrate 1, an insulating film (not illustrated) for gate insulator formed of a silicon oxide film is formed by, for example, thermal oxidation. A thickness of the insulating film may be, for example, about 1.0 to 2.5 nm. Note that, a silicon oxide film may be formed using a CVD method and a silicon oxynitride film may be formed by introducing nitride of about 3 to 10% by nitride plasma into a silicon oxide film. In addition, another insulating film such as a High-k film (high dielectric constant film) or a stacked film of a silicon oxide film (or silicon oxynitride film) and a High-k film (high dielectric film) may be used.

Next, on the whole surface of the main surface (surface) of the SOI substrate 1, a conductor film (not illustrated) for gate electrode is formed. As the conductor film for gate electrode, for example, a poly-crystal silicon film (doped poly-silicon film) can be used. Then, after applying a photoresist layer on the whole surface of the main surface (surface) of the SOI substrate 1, the photoresist layer is exposed and developed to form a photoresist pattern (not illustrated). Thereafter, the conductor film for gate electrode and the insulating film for gate insulator are etched by dry etching using the photoresist pattern as an etching mask. In this manner, the gate electrodes GE and the gate insulator GI are formed to the n-type MISFET forming region 6A, the p-type MISFET forming region 6B, and the high-withstand-voltage MISFET forming region 6C, respectively. Then, the photoresist pattern is removed.

Next, on sidewalls of the gate electrode GE, the sidewall spacers SW formed of, for example, a silicon oxide film, a silicon oxynitride film or a stacked film of insulating films, i.e., a silicon oxide film and a silicon oxynitride film is formed as the sidewall insulators. The sidewalls pacers SW are formed by, for example, depositing a silicon oxide film, silicon oxynitride film or a stacked film of a silicon oxide film and a silicon oxynitride film on the whole surface of the main surface (surface) of the SOI substrate 1 and subjecting the silicon oxide film, silicon oxynitride film or stacked film of a silicon oxide film and a silicon oxynitride film to anisotropic etching of RIE (Reactive Ion Etching) method or the like.

Next, in the n-type MISFET forming region 6A and the p-type MISFET forming region 6B, by selective epitaxial growth, a silicon layer is formed. For example, a silicon layer is deposited by low-pressure CVD using dichlorosilane ($SiH_2Cl_2$) and hydrogen chloride (HCl) gas. According to this method, the silicon layer deposited to the portion where the SOI layer 4 is exposed is epitaxially grown following the single crystal of the SOI layer 4. Then, in each of the n-type MISFET forming region 6A and the p-type MISFET forming region 6B, a pair of source/drain regions SD formed of the silicon layer and arranged to sandwich the gate electrode GE and the sidewall spacers SW is formed on the SOI layer 4.

Figure 21:
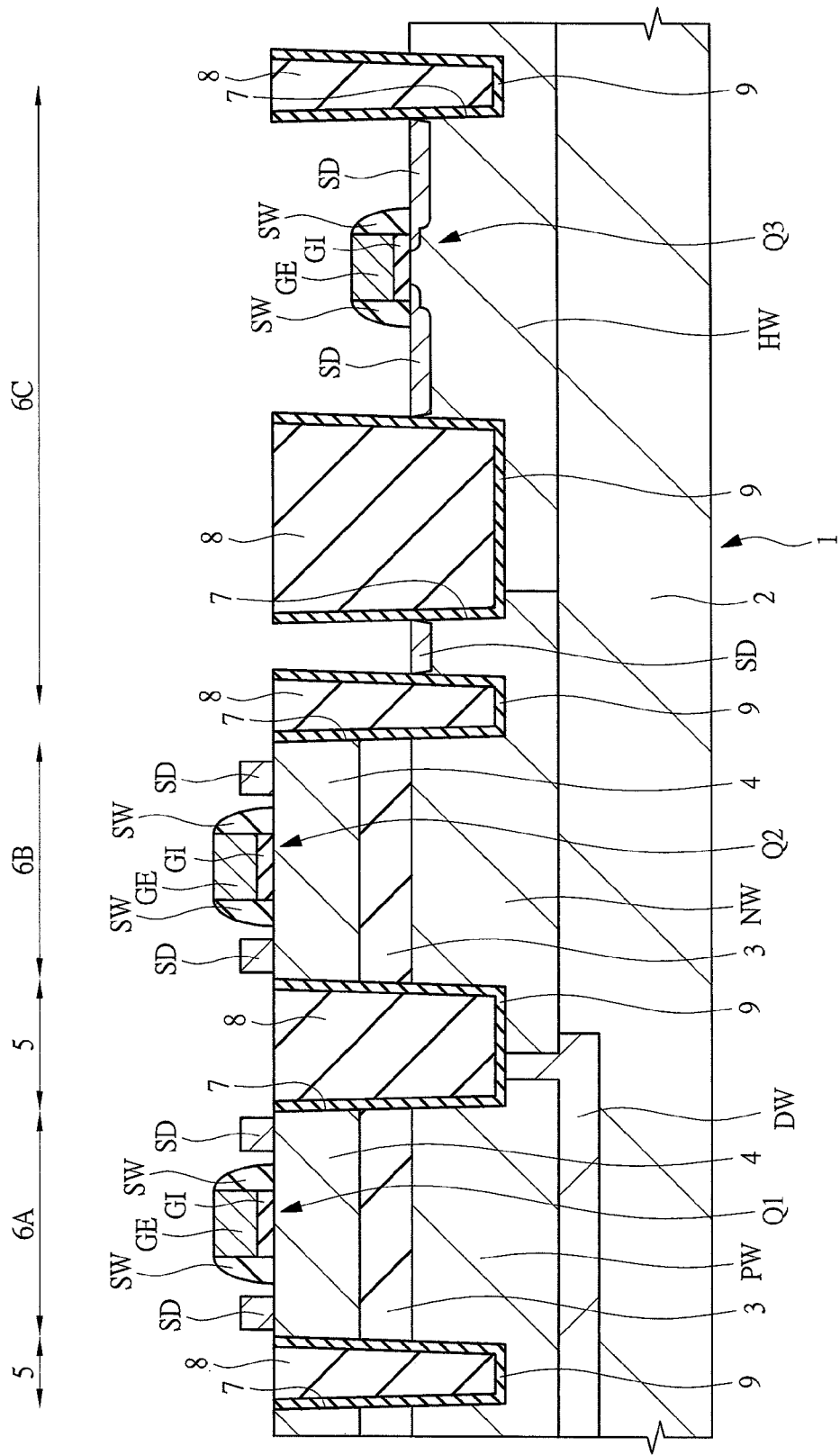
FIG. 21 is a cross-sectional view of main parts of the semiconductor device during the manufacturing process according to the first embodiment.

Next, an n-type impurity such as phosphorus (P) or arsenic (As) is ion-injected to the source/drain regions SD in the n-type MISFET forming region 6A and an annealing processing for activating the introduced ions is performed. In addition, a p-type impurity such as boron (B) is ion-injected to the source/drain regions SD of the p-type MISFET forming region 6B and an annealing processing for activating the introduced impurity is performed. In this manner, as illustrated in FIG. 21, the n-channel type MISFET Q1 is formed in the n-type MISFET forming region 6A and the p-type MISFET Q2 is formed in the p-type MISFET forming region 6B.

Also, an impurity is ion-injected to regions on both sides of the gate electrode GE and the sidewall spacers SW in the high-withstand-voltage MISFET forming region 6C and an annealing processing for activating the introduced impurity is performed. In this manner, also in the high-withstand-voltage MISFET forming region 6C, a pair of source/drain regions SD arranged to sandwich the gate electrode GE and the sidewall spacers SW is formed to the surface of the supporting substrate 2, forming the MISFET Q3 having a high withstand voltage as illustrated in FIG. 21.

Note that, a metal silicide layer (not illustrated) having a low resistance formed of cobalt silicide or nickel silicide may be formed to the surfaces of the gate electrode GE and the source/drain regions SD by the salicide technology. The metal silicide layer can be formed by depositing a metal film such as a cobalt (Co) film or a nickel film (Ni) so as to cover the gate electrode GE and the source/drain regions SD and subject the metal film to a thermal processing and an unreacted part of the metal film is removed thereafter.

Next, the interlayer insulator 10 and the plug PG are formed (step S12 in FIG. 4).

First, the interlayer insulator 10 is formed on the whole surface of the main surface (surface) of the SOI substrate 1. More specifically, the interlayer insulator 10 is formed on the whole surface of the main surface (surface) of the SOI substrate 1 so as to cover the gate electrode GE and the sidewall spacers SW. The interlayer insulator 10 is formed of, for example, a single film of a silicon oxide film, a stacked film of a silicon nitride film and a silicon oxide film thicker than the silicon nitride film or the like. Thereafter, by polishing the surface (upper surface) of the interlayer insulator 10 by the CMP method or in another way, the upper surface of the interlayer insulator 10 is planarized. Even when uneven geometry is formed on the surface of the interlayer insulator 10 caused by steps of the base, by polishing the surface of the interlayer insulator 10 by the CMP method, an interlayer insulator having a planarized surface can be obtained.

Next, using a photoresist pattern (not illustrated) formed on the interlayer insulator 10 as an etching mask, the interlayer insulator 10 is dry-etched to form the contact hole CNT in the interlayer insulator 10. At the bottom surface of the contact hole CNT, a portion of the main surface of the SOI substrate 1, for example, a portion of the surfaces of the source/drain regions SD and a portion of the surface of the gate electrode GE are exposed.

Figure 22:
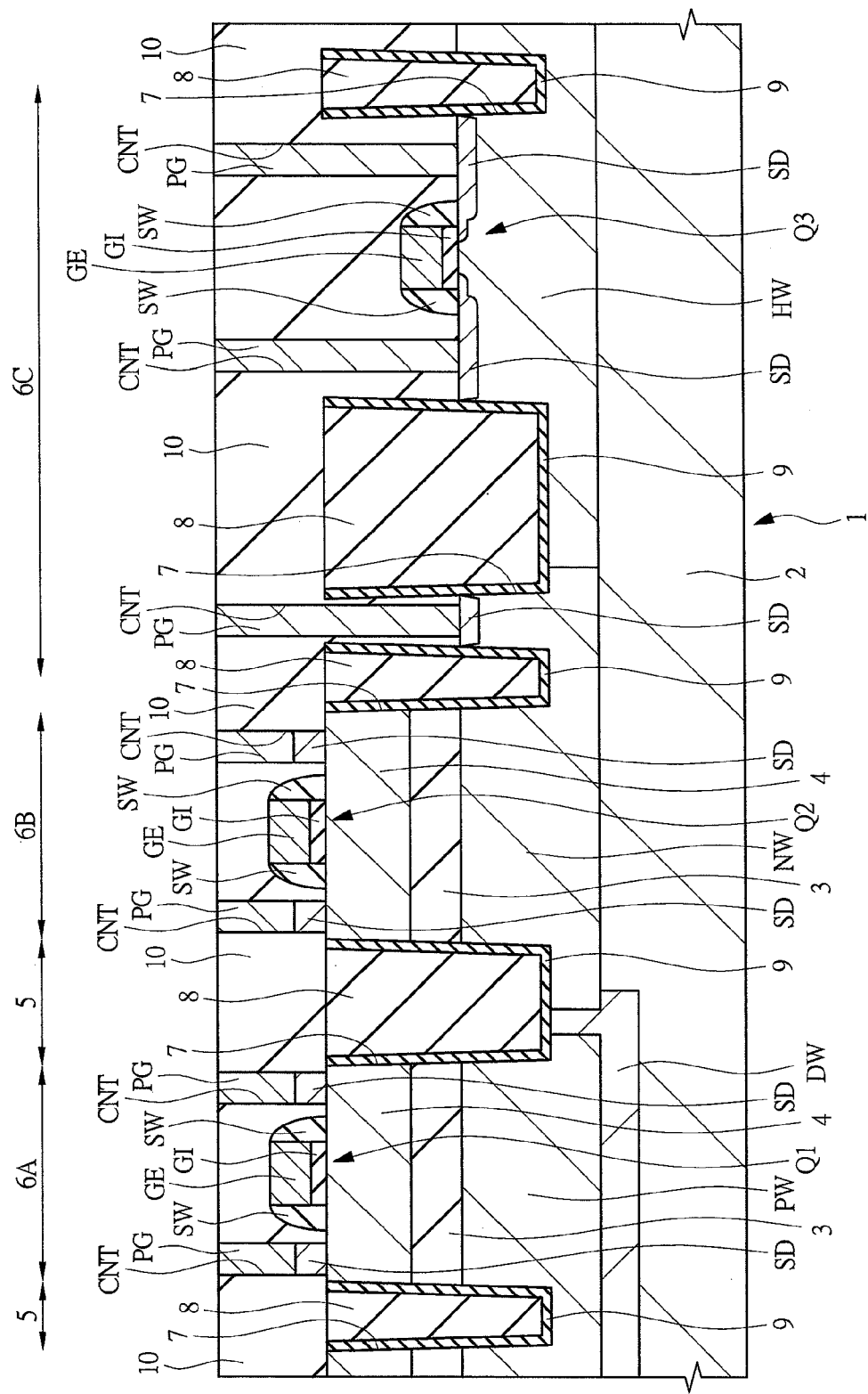
FIG. 22 is a cross-sectional view of main parts of the semiconductor device during the manufacturing process according to the first embodiment.

Next, inside the contact hole CNT, the conductive plug PG formed of tungsten (W) or the like is formed. To form the plug PG, for example, a barrier conductor film (for example, a titanium film, titanium nitride film or a stacked film of a titanium film and a titanium nitride film) is formed on the interlayer insulating film 10 including the inside of the contact hole CNT by plasma CVD or the like. Then, a main conductor film formed of a tungsten film or the like is formed on the barrier conductor film so as to fill the contact hole CNT by CVD or the like and unnecessary parts of the main conductor film and the barrier conductor film on the interlayer insulator 10 are removed by CMP or etchback, thereby forming the plug PG as illustrated in FIG. 22. In FIG. 22, to simplify the drawing, the plug PG is illustrated integrating the main conductor film and the barrier conductor film. The plug PG is contacted with the surface of the gate electrode GE or the source/drain regions SD (when a metal silicide layer is formed to the surface, this metal silicide layer) and so forth and thus electrically connected to them at its bottom surface.

Next, the insulating film 11 is formed on the interlayer insulator 10 in which the plug PG is buried. The insulating film 11 may be formed of a stacked film of a plurality of insulating films.

Next, by single damascene method, the wiring M1 which is a first layer is formed (step S13 in FIG. 4). More specifically, the wiring M1 can be formed in the following manner. First, after forming wiring grooves in predetermined regions by dry etching (plasma dry etching) using a photoresist pattern (not illustrated), a barrier conductor film (for example, a titanium nitride film, a tantalum film, a tantalum nitride film or the like) is formed on the insulating film 11 including the bottom portion and sidewall of the wiring groove. Subsequently, a seed layer of copper is formed on the barrier conductor film by CVD, spattering or the like, and a copper plating film is formed on the seed layer using electroplating or the like to fill the inside of the wiring grooves by the copper plating film. Then, the main conductor film (the copper plating film and the seed layer) and the barrier conductor film in the region other than the wiring grooves are removed by CMP, thereby forming the wiring M1 of the first layer using copper buried in the wiring grooves as a main conductive material. In this manner, as illustrated in FIG. 1, the semiconductor device having the structure in which the wiring M1 of the first layer is formed is manufactured. In FIG. 1, to simplify the drawing, the wiring M1 is illustrated integrating the barrier conductor film, the seed layer and the copper plating film.

The wiring M1 is electrically connected to the gate electrode GE, the source/drain regions SD or else via the plug PG. While a wiring of a second layer will be formed by dual damascene method thereafter, illustration and descriptions thereof will be omitted here.

<About Oxidation of the SOI Layer Associated with Isolation Region Formation>

Figure 23:
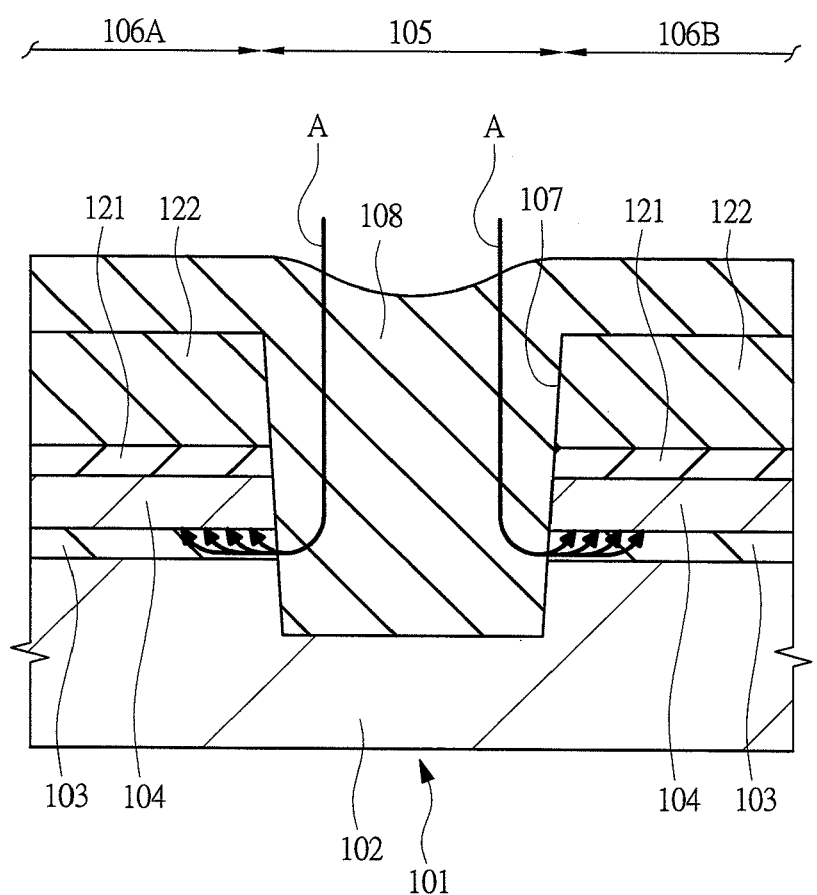
FIG. 23 is a cross-sectional view of main parts illustrating by enlarging a vicinity region of an isolation region of a semiconductor device according to a comparative example in which an oxidation resistant film is fort formed.

FIG. 23 is a cross-sectional view of main parts of a vicinity of a semiconductor device of a comparative example in which an oxidation resistant film is not formed in an enlarged manner.

In FIG. 23, an SOI substrate 101, a supporting substrate 102, a BOX layer 103, and a SOI layer 104 correspond to the SOI substrate 1, the supporting substrate 2, the BOX layer 3, and the SOI layer 4, respectively. Also, insulating films 121 and 122 correspond to the insulating films 21 and 22, respectively. Further, a groove 107 and an isolation film 108 correspond to the groove 7 and the isolation film 8, respectively. Moreover, an isolation region 105 and MISFET forming regions 106A and 106B correspond to the isolation region 5 and the MISFET forming regions 6A and 6B, respectively.

A structure (state) in FIG. 23 is formed by, after performing the process of FIGS. 5 to 8 descried above, performing the process until the thermal processing for baking the isolation film 8 in the process in FIG. 10 described above without performing the process in FIG. 9. That is, the structure (state) in FIG. 23 is formed by substantially the same process until obtaining the structure (state) in FIG. 10 described above without the point not forming the oxidation resistant film 9. However, in the structure (state) in FIG. 23, the insulating film 23 is not formed in the process in FIGS. 6 and 7 either.

Meanwhile, according to an analysis by the inventors of the present invention, a possibility has been found that, from the state in FIG. 23, the BOX layer 103 becomes significantly thick at a portion on the isolation region 105 in the MISFET forming regions 106A and 106B after the thermal processing (annealing processing) for baking the isolation film 108 and the SOI layer 104 is warped and strained.

Figure 24:
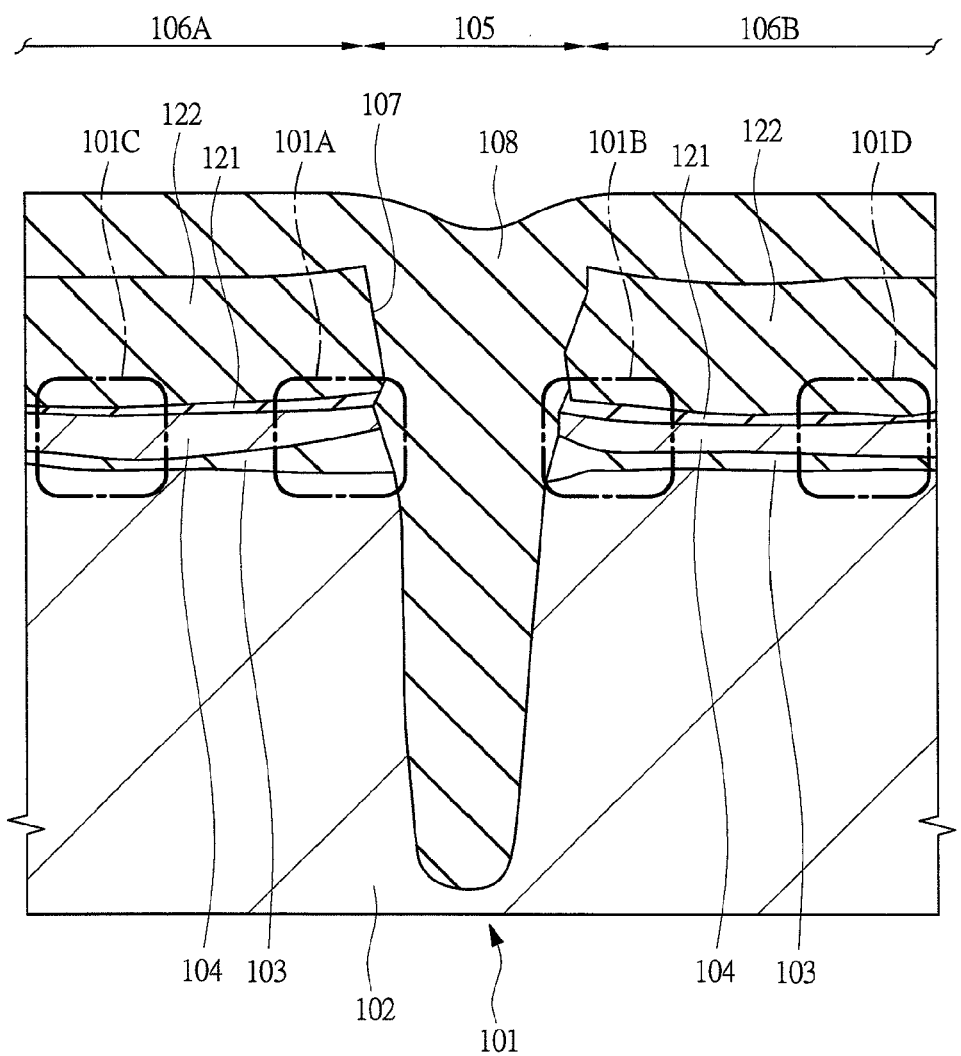
FIG. 24 is a cross-sectional view of main parts obtained from an image observing the vicinity region of the isolation region of the semiconductor device according to the comparative example in which the oxidation resistant film is not formed.

As to a vicinity of the isolation region of the semiconductor device after the annealing processing, FIG. 24 illustrates an example of a diagram obtained by tracing an image for observing a cross-sectional shape by SEM (Scanning Electron Microscope) on a sample piece made by processing the semiconductor device to expose its cross section. A thickness of the BOX layer 103 in a portion on the isolation region 105 side (edge side regions 101A and 101B surrounded by dashed-dotted lines) of the MISFET forming regions 106A and 106B is significantly larger than a thickness of the BOX layer 103 at the portion on the center side of the MISFET forming regions 106A and 106B (center side regions 101C and 101D surrounded by dashed-dotted lines). Associated with that, the SOI layer 104 of the edge side regions 101A and 101B is pushed up to be above the SOI layer 104 in the center side regions 101C and 101D, resulting in warping and strain of the SOI layer 104.

From a study by the inventors on a cause of the increase in thickness of the BOX layer 103, it has been found that there is a main cause in the annealing processing in which the portions of the SOI layer 104, which are in contact with the BOX layer 103 in the edge side regions 101A and 101B, are oxidized. More specifically, it has been found that, as illustrated by the arrow A in FIG. 23, upon the annealing processing, oxygen diffuses through the silicon oxide film of the isolation film 108 and the silicon oxide film of the BOX layer 103 and the oxygen oxidizes the portions of the SOI layer 104, which are in contact with the BOX layer 103, making the portions become portions of the BOX 103. As more oxygen is supplied to the edge side regions 101A and 101B, a difference in thickness of the BOX layer 103 in the edge regions 101A and 101B and the center side regions 101C and 101D is generated. Also, the shorter the channel length of the MISFET is, the smaller the contribution of the center side regions 101C and 101D and the larger the contribution of the edge side regions 101A and 101B. Moreover, for example, the thicker the BOX layer 103, the larger threshold voltages (Vth) of the MISFETs, varying the threshold voltages of the MISFETs in accordance with the variations in thickness of the BOX layer 103. Therefore, in the semiconductor device of the comparative example, particularly in a minute MISFET having a short channel length, there is a possibility that the phenomenon of increasing the thickness of the BOX layer 103 in the edge side regions 101A and 101B is become more prominent, making variations of the threshold voltages (Vth) of the semiconductor device easier.

Further, it is difficult to control the increasing amount of the thickness of the BOX layer 103 in the edge side regions 101A and 101B to be uniform over the whole surface of the main surface (surface) of the SOI substrate 101. Therefore, in the semiconductor device of the comparative example, particularly as to a minute MISFET having a short channel length, fluctuations in the threshold voltage (Vth) of the semiconductor device are prone to occur over the whole surface of the main surface (surface) of the SOI substrate 101 and there is a possibility of making lowering the uniformity of electric characteristics of the semiconductor device easier.

In addition, although not illustrated here, it has been found that the etching speed of the BOX layer 103 in the edge side regions 101A and 101B in an etching processing by hydrofluoric acid on the sample observed in the manner in FIG. 24 is very much faster than that of the BOX layer 103 in the center side regions 1010 and 101D.

More specifically, in the semiconductor device of the comparative example, a difference also occurs in the etching speed of the BOX layer 103 between the edge side regions 101A and 101B and the center side regions 1010 and 101D. In addition, as described above, the shorter the channel length of the MISFET is, the smaller the contribution of the center side regions 101C and 101D is and the larger the contribution of the edge side regions 101A and 101B. Therefore, in the semiconductor device of the comparative example, particularly in a minute MISFET having a short channel length, there is a possibility of having "pattern defects" that means some of patterns of elements, which should be formed by etching the BOX layer 103 in the edge side regions 101A and 101B during the process, are lost.

<Main Features and Effects of the First Embodiment>

Accordingly, in the first embodiment, after forming the groove 7 in the isolation region 5, the oxidation resistant film 9 is formed by deposition so as to cover the inside of the groove 7. Also, in the first modification example, the inside of the groove 7 is subjected to a nitridation processing to form the oxidation resistant film 9. While the BOX layer 3 is exposed to the side surface 7B of the groove 7 during formation of the groove 7, when the oxidation resistant film 9 is formed, the portion of the BOX layer 3, which is exposed to the side surface 7b of the groove 7, is covered with the oxidation resistant film 9. That is, the oxidation resistant film 9 is interposed between the BOX layer 3 and the isolation film 8. In this manner, upon the annealing processing after forming the isolation film 8 so as to fill the groove 7 with the BOX layer 3 being covered with the oxidation resistant film 9, diffusion of oxygen through the isolation film 8 and the BOX layer 3 can be prevented and thus oxidation of the SOI layer 4 can be prevented.

Particularly, when the BOX layer 3 and the isolation film 8 are silicon oxide films, the oxidation resistant film 9 is preferred to be a silicon nitride film. As oxygen diffusion can be prevented by the silicon nitride film, it is possible to surely prevent diffusion of oxygen through the silicon oxide film of the isolation film 8 and the silicon oxide film of the BOX layer 3 and to surely prevent oxidation of the SOI layer 4 upon the annealing processing.

As a result, in the semiconductor device of the present embodiment, also in a minute MISFET having a short channel length, it is possible to prevent an increase in the thickness of the BOX layer 3 on the isolation region 5 side and to suppress variations of the threshold voltage (Vth) of the semiconductor device. In addition, in the semiconductor device of the present embodiment, also in a minute MISFET having a short channel length, it is possible to prevent occurrence of fluctuations in the threshold voltage (Vth) of the semiconductor device over the whole surface of the main surface (surface) of the SOI substrate 1 and to prevent lowering of the uniformity of electric characteristics of the semiconductor device. Further, in the semiconductor device of the present embodiment, an increase in the etching speed of the BOX layer 3 on the isolation region 5 side can be prevented and thus occurrence of "pattern defects" can be prevented.

(Second Embodiment)

In the first embodiment, the oxidation resistant film 9 has been interposed over the whole surface between the isolation film 8 and the bottom surface 7a and side surface 7b of the groove 7. On the contrary, in a second embodiment, the oxidation resistant film 9 is not interposed between the isolation film 8 and the SOI layer 4 and supporting substrate 2 exposed to the bottom surface 7a and side surface 7b of the groove 7.

In other words, in the second embodiment, the oxidation resistant film 9 is formed to cover the portion of the BOX layer 3, which is exposed to the groove 7, so that the oxidation resistant film 9 is interposed between the BOX layer 3 and the isolation film 8.

<Semiconductor Device>

Figure 25:
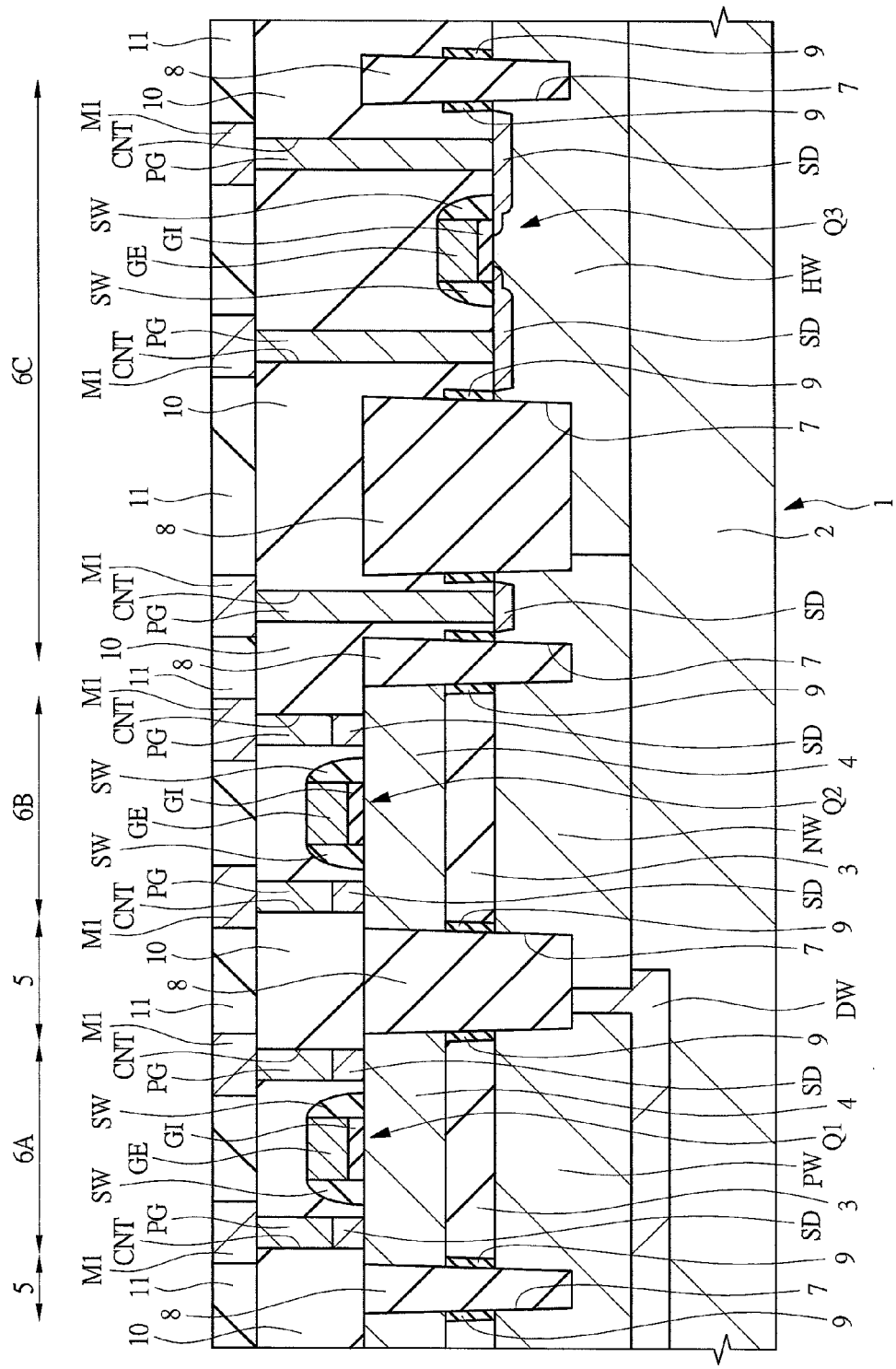
FIG. 25 is a cross-sectional view of main parts of a semiconductor device according to a second embodiment.
Figure 26:
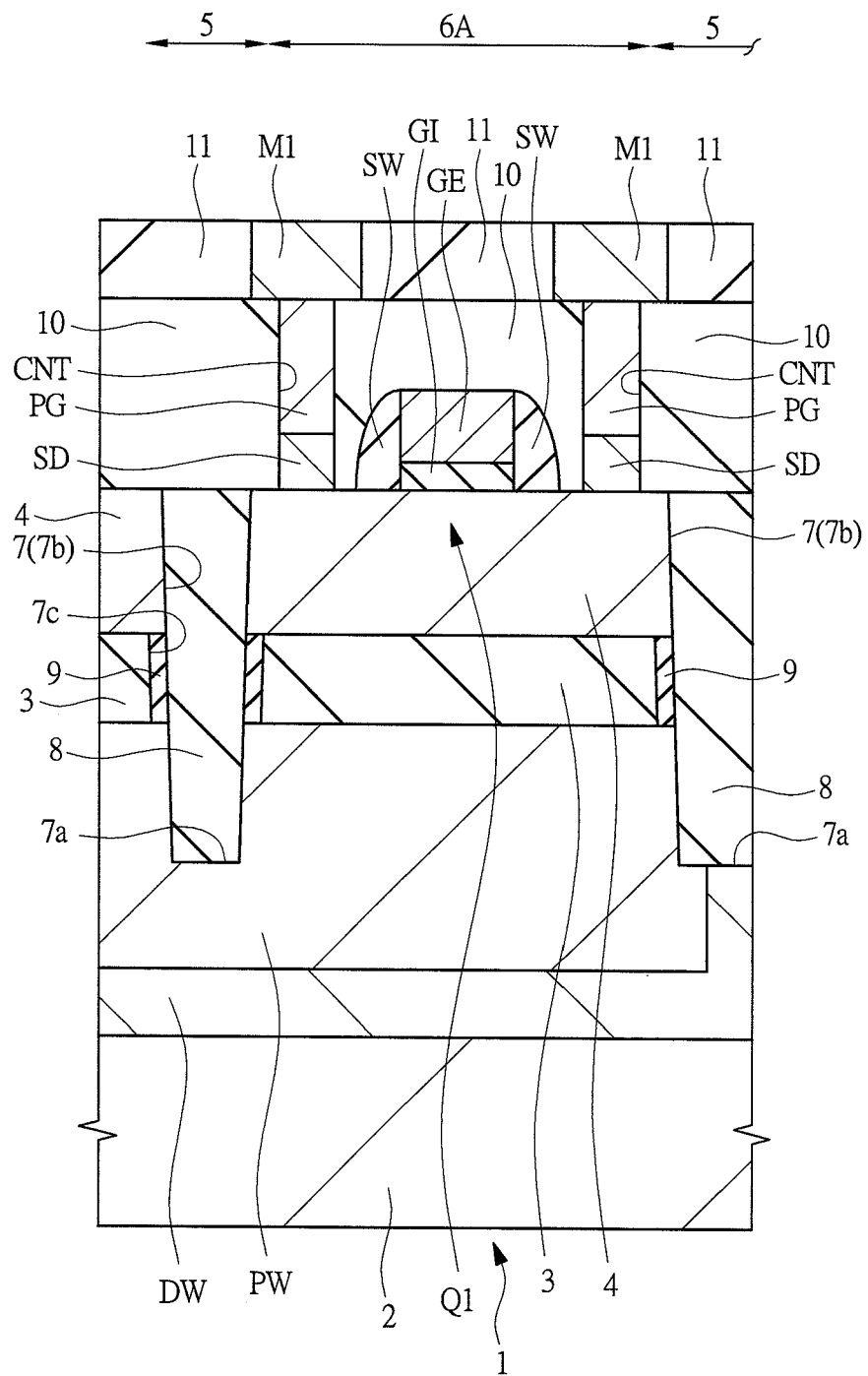
FIG. 26 is a cross-sectional view of main parts of the semiconductor device according to the second embodiment.

FIGS. 25 and 26 are cross-sectional views of main parts of the semiconductor device of the second embodiment. FIG. 26 is a diagram illustrating a region in a vicinity of an n-channel type MISFET Q1 in FIG. 25 in an enlarged manner.

In the present embodiment, the oxidation resistant film 9 is interposed between the BOX layer 3 and the isolation film 8. The oxidation resistant film 9 prevents oxidation of the SOI layer 4 upon the thermal processing (annealing processing) for baking the isolation film 8 buried in the groove 7.

When the supporting substrate and the SOI layer 4 are formed of single crystal silicon and the BOX layer 3 is a silicon oxide film, a silicon nitride film can be used as the oxidation resistant film 9. Here, after forming the groove 7, the portion of the BOX 3, which is exposed to the side surface 7b of the groove 7, is etched to set back the BOX layer 3 from the side surface 7b of the groove 7, thereby forming a concave portion 7c to the side surface 7b of the groove 7. Then, a silicon nitride film is formed to fill the concave portion 7c and also to cover the side surface 7b of the groove 7 and then the silicon nitride formed is etched so as to leave the portion of the silicon nitride film filling the concave portion 7c, thereby forming the oxidation resistant film 9. The oxidation resistant film 9 formed is interposed between the isolation film 8 and the BOX layer 3 set back from the side surface 7b of the groove 7 and also sandwiched by the SOI layer 4 and the supporting substrate 2 from the top and bottom.

Alternatively, the oxidation resistant film 9 can be formed by, without forming the concave portion 7c after forming the groove 7, forming a silicon nitride film to cover the side surface 7b of the groove 7 and etching the silicon nitride film to leave the portion of the silicon nitride formed covering the BOX layer 3.

Note that, the SOI layer 4 is preferable to have a portion being directly in contact with the isolation film 8. In this manner, it is possible to suppress variations on the threshold voltage (Vth) of the MISFET due to charge up caused by trapping of charges in the oxidation resistant film (silicon nitride film) formed to the portion in contact with the SOI layer 4. In addition, it is preferable that a portion on the upper surface side of the SOI layer 4 is directly in contact with the isolation film and also a portion on the lower surface side of the SOI layer 4 is in contact with the isolation film 8 interposing the oxidation resistant film 9. In this manner, variations in the threshold voltage (Vth) of the MISFET can be suppressed and also oxidation of the SOI layer 4 due to oxygen supplied through the isolation film 8 and the BOX layer 3 upon the thermal processing (annealing processing) can be efficiently prevented.

Further, the oxidation resistant film 9 is preferable not to be interposed between the supporting substrate 2 and the isolation film 8. In this manner, variations in the threshold voltage (Vth) of the MISFET due to charge up caused by trapping of charges in an oxidation resistant film can be suppressed.

<Manufacturing Process of the Semiconductor Device>

Figure 27:
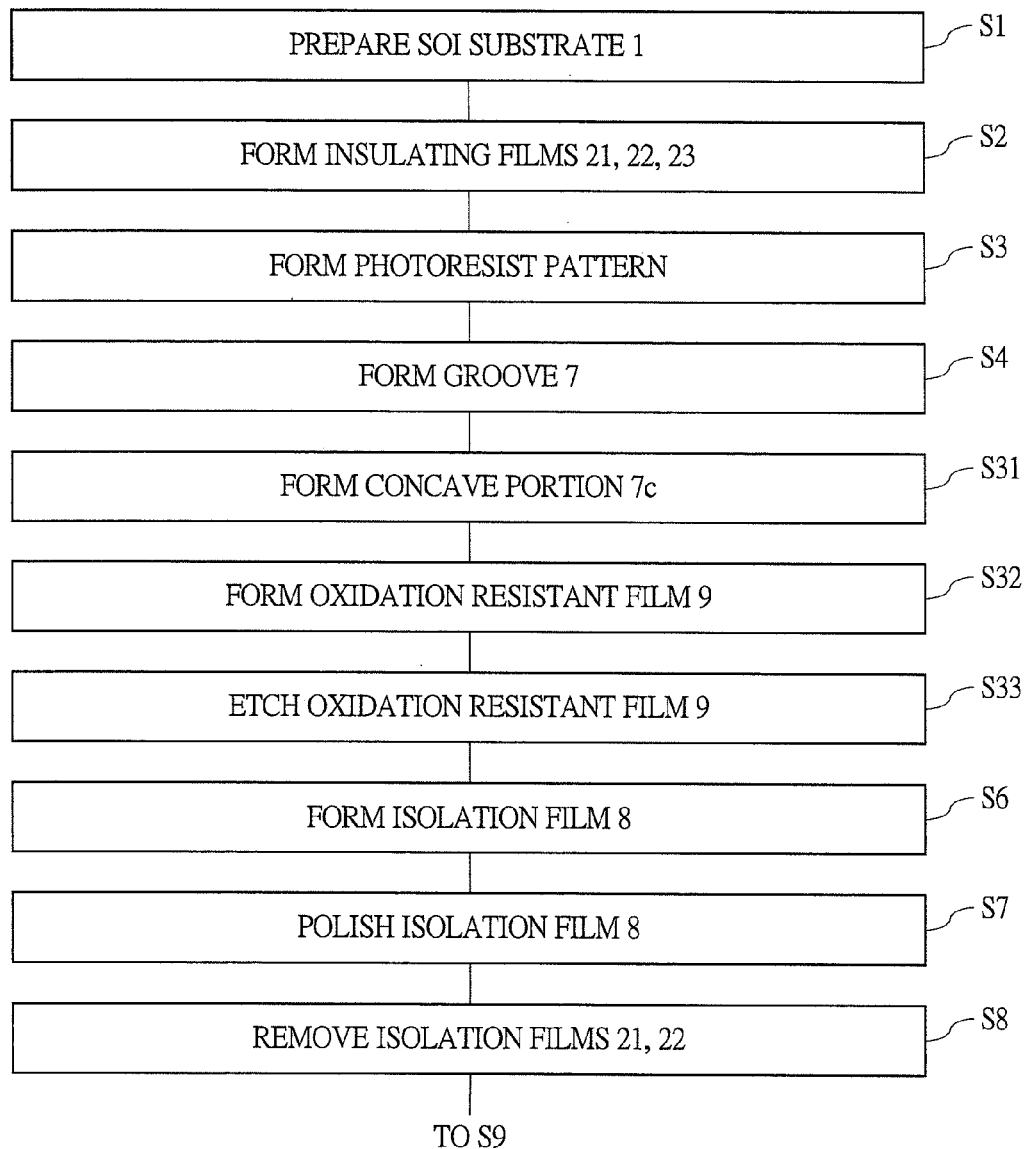
FIG. 27 is a manufacturing process flow diagram illustrating a part of a manufacturing process of the semiconductor device according to the second embodiment.
Figure 34:
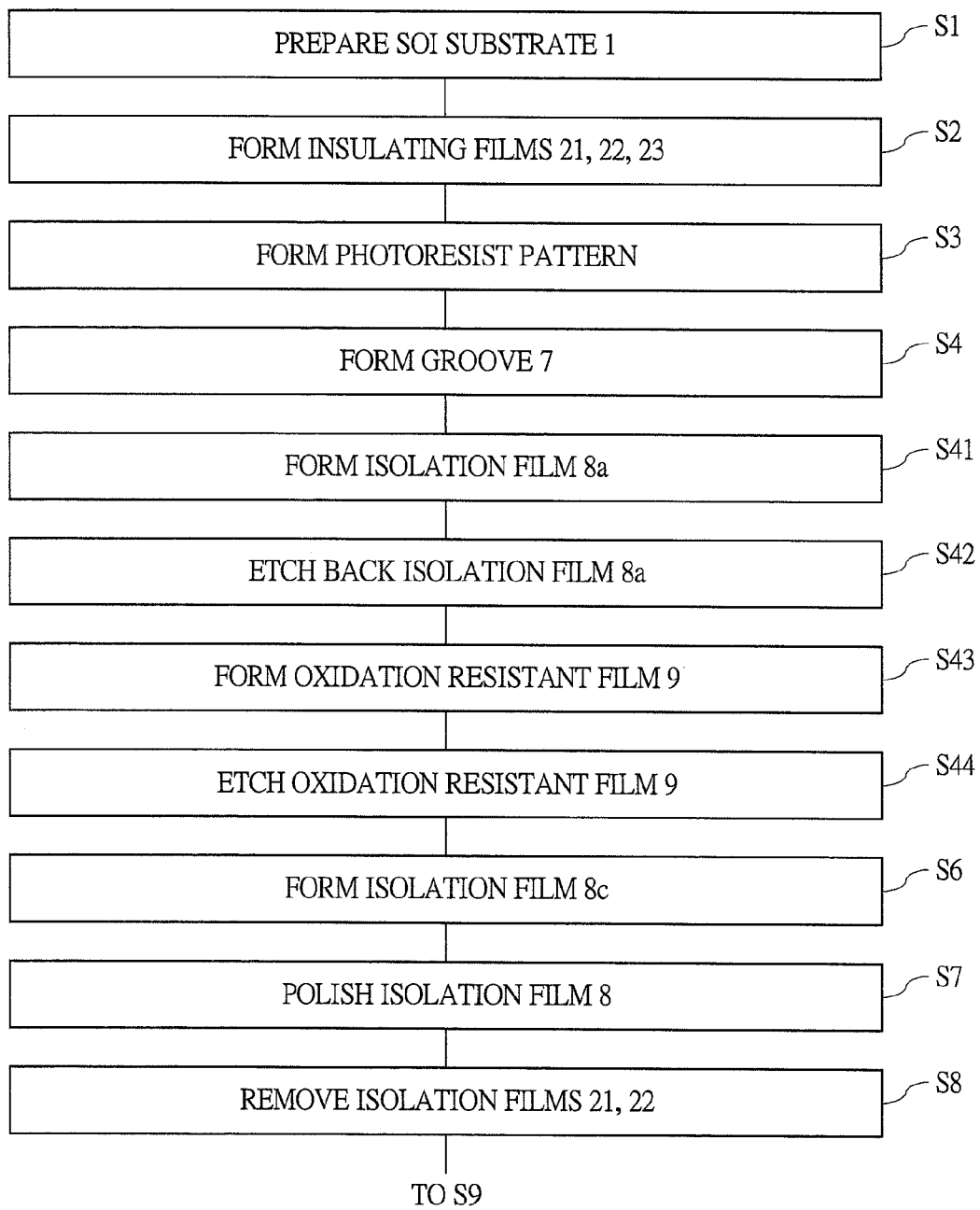
FIG. 34 is a manufacturing process flow diagram illustrating a part of a manufacturing process of a semiconductor device of a first modification example of the second embodiment.

A manufacturing process of the semiconductor device of the present embodiment will be described with reference to the drawings. FIG. 27 is a manufacturing process flow chart illustrating a part of the manufacturing process of the semiconductor device according to the second embodiment. FIGS. 28 to 33 and FIGS. 50 to 52 are cross-sectional views of main parts of the semiconductor device during the manufacturing process according to the second embodiment. FIG. 34 is a manufacturing process flow chart illustrating a part of a manufacturing process of a semiconductor device according to a first modification example of the second embodiment. FIGS. 35 to 41 are cross-sectional views of main parts of the semiconductor device during the manufacturing process according to the first modification example of the second embodiment. FIG. 42 is a manufacturing process flow chart illustrating a part of a manufacturing process of a semiconductor device according to a second modification example of the second embodiment. FIGS. 43 to 49 are cross-sectional views of main parts of the semiconductor device during the manufacturing process according to the second modification example of the second embodiment. Note that, FIGS. 28 to 33, 35 to 41 and 43 to 49 illustrate a vicinity of one isolation region in an enlarged manner.

First, by performing a process (steps S1 to S4 in FIG. 27) in the same manner as the process illustrated in FIGS. 5 to 8 (steps S1 to S4 in FIG. 3), the groove 7 is formed in the isolation region 5.

Figure 28:
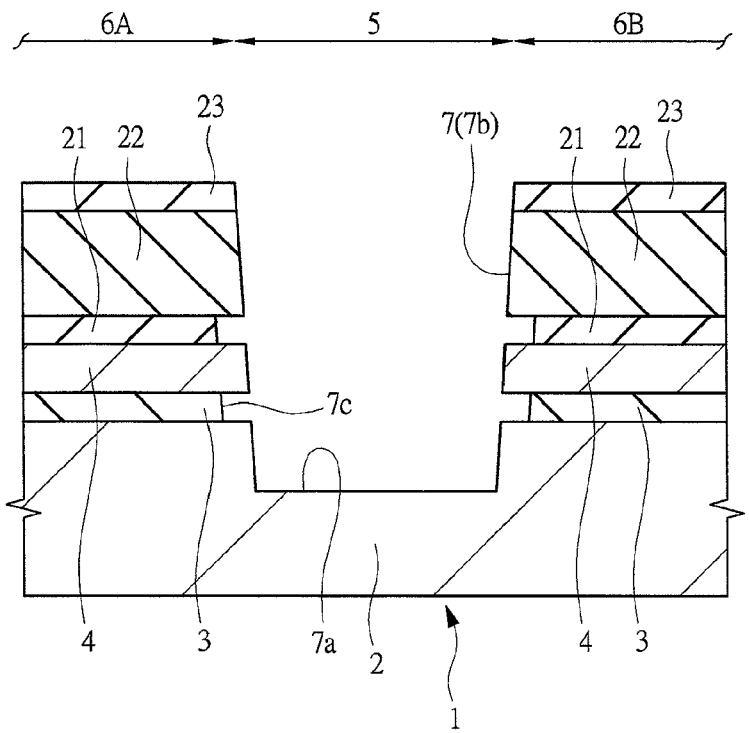
FIG. 28 is a cross-sectional view of main parts of the semiconductor device during the manufacturing process according to the second embodiment.

Next, as illustrated in FIG. 28, the portion of the BOX layer 3, which is exposed to the side surface 7*b* of the groove 7, is etched and a concave portion 7*c* is formed to the side surface 7*b* of the groove 7 (step S31 in FIG. 27). By wet etching using a chemical (etching solution) such as hydrofluoric acid, the portion of the BOX layer 3, which is exposed to the side surface 7*b* of the groove 7, is etched in the lateral direction to set back the BOX layer 3 from the side surface (surface) 7*b* of the groove 7 to deeper inside, thereby forming the concave portion 7*c*. In addition, together with the BOX layer 3, the portion of the insulating film 21, which is exposed to the side surface 7*b* of the groove 7, is also etched in the lateral direction and set back to deeper inside from the side surface (surface) 7*b* of the groove 7. Since this etching is performed only to an extent that the concave portion 7*c* is formed as the BOX layer 3 is set back to deeper inside from the side surface (surface) 7*b* of the groove 7, almost all of the insulating films 22 and 23 are not etched but remain.

Figure 29:
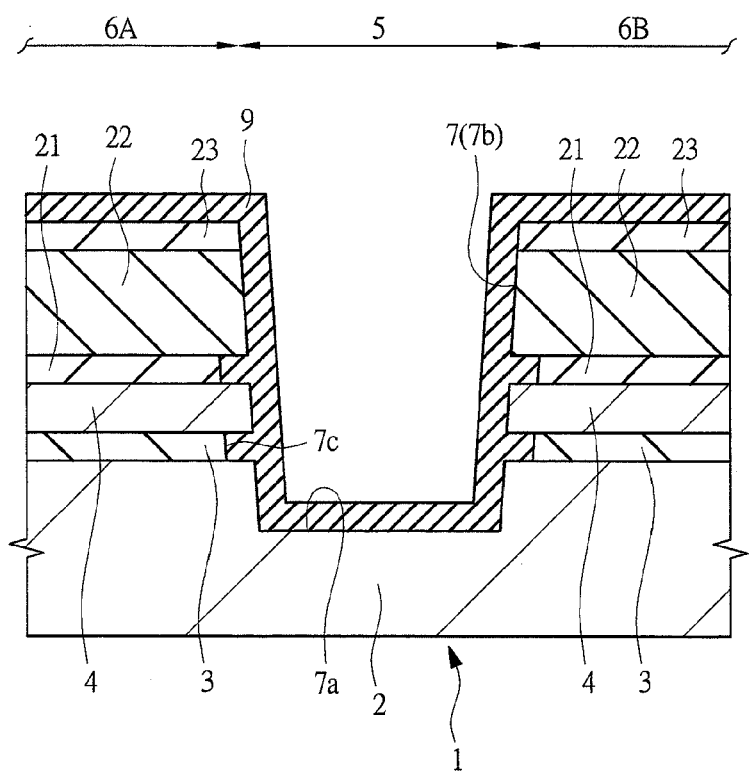
FIG. 29 is a cross-sectional view of main parts of the semiconductor device during the manufacturing process according to the second embodiment.

Next, as illustrated in FIG. 29, the oxidation resistant film 9 is formed (deposited) by CVD (for example, thermal CVD) or the like so as to fill the concave portion 7*c* and also cover the side surface 7*b* of the groove 7 (step S32 in FIG. 27). The oxidation resistant film 9 is formed of a silicon nitride film. A thickness of the oxidation resistant film 9 may be, for example, about 1 to 5 nm.

Figure 30:
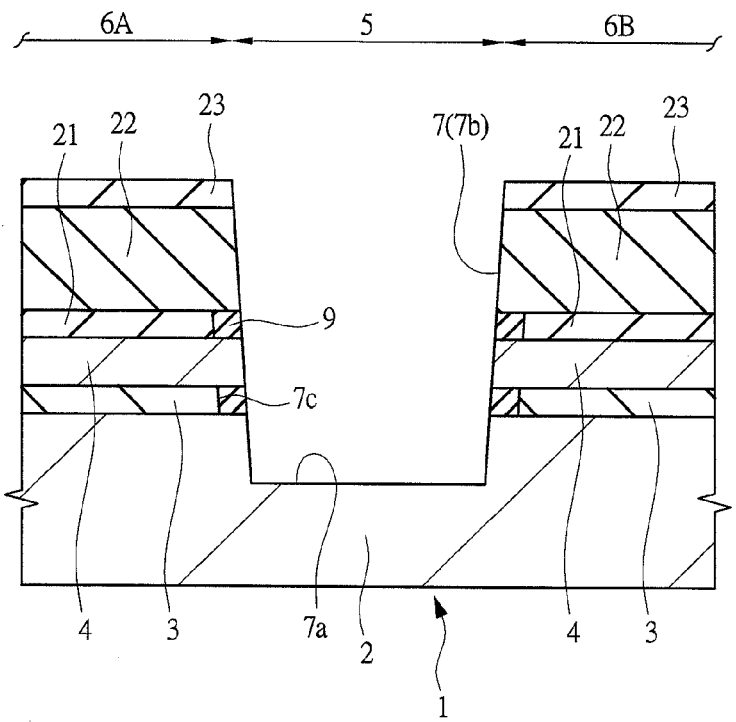
FIG. 30 is a cross-sectional view of main parts of the semiconductor device during the manufacturing process according to the second embodiment.

Next, as illustrated in FIG. 30, the oxidation resistant film 9 is etched by dry etching (plasma dry etching) so as to leave the portion of the oxidation resistant film 9 formed filling the concave portion 7*c* (step S33 in FIG. 27). In this manner, in the portion exposed to the side surface 7*b* of the groove 7, only the BOX layer 3 can be covered with the oxidation resistant film 9. The oxidation resistant film 9 formed to cover the BOX layer 3 exposed to the side surface 7*b* of the groove 7 can prevent oxidation of the SOI layer upon thermal processings (annealing processings) etc. in respective processes of the isolation film 8 formed in a later process due to oxygen supplied through the isolation film 8 and the BOX layer 3. In addition, as the oxidation resistant film 9 is not interposed between the SOI layer 4 and the isolation film 8, variations in the threshold voltage (Vth) of the MISFET due to charge-up of charges trapped in the oxidation resistant film 9 can be suppressed. Moreover, as the oxidation resistant film 9 is not interposed also between the supporting substrate 2 and the isolation film 8, variations in the threshold voltage (Vth) of the MISFET due to charge-up of charges trapped in the oxidation resistant film 9 can be suppressed.

Figure 31:
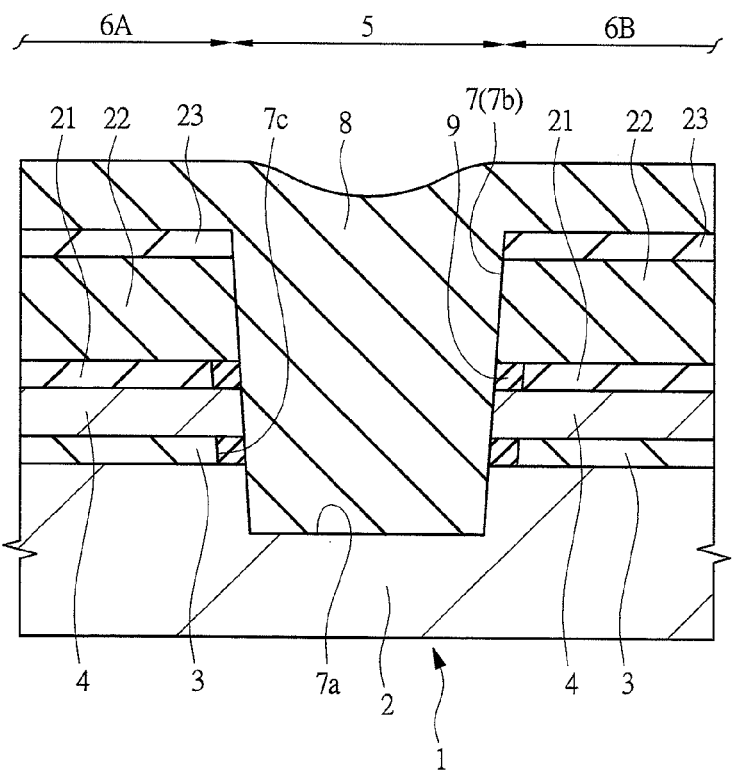
FIG. 31 is a cross-sectional view of main parts of the semiconductor device during the manufacturing process according to the second embodiment.
Figure 32:
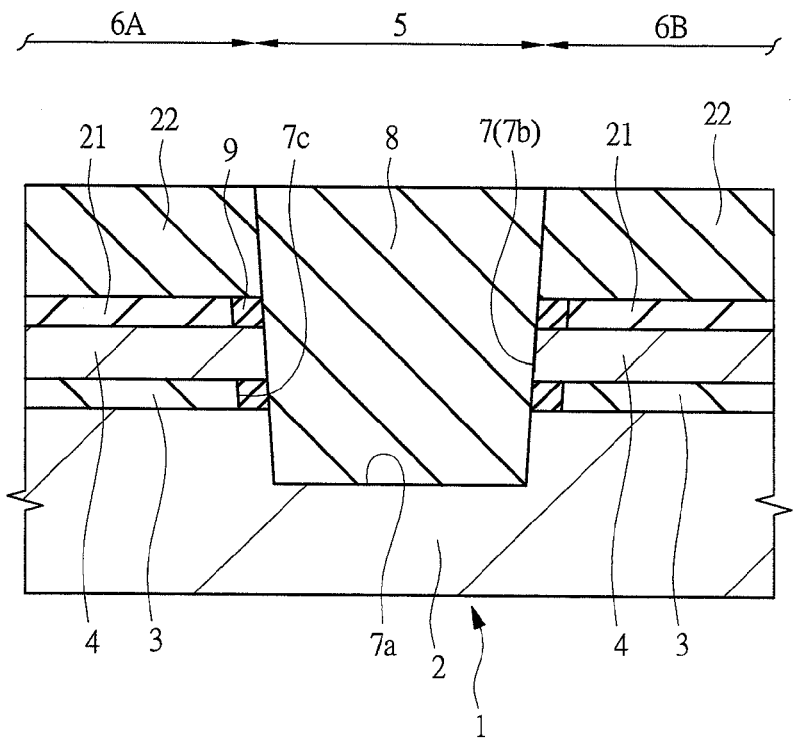
FIG. 32 is a cross-sectional view of main parts of the semiconductor device during the manufacturing process according to the second embodiment.
Figure 33:
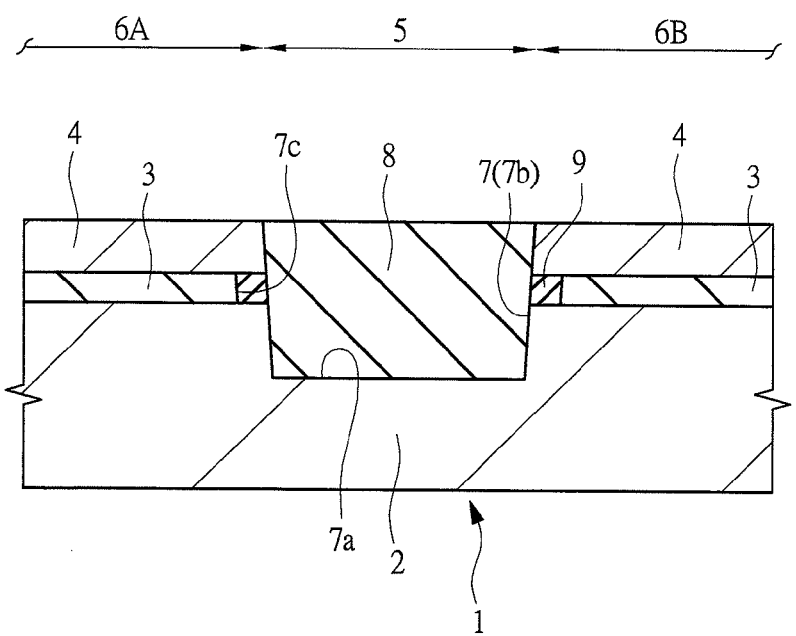
FIG. 33 is a cross-sectional view of main parts of the semiconductor device during the manufacturing process according to the second embodiment.

Thereafter, in the same manner as the process illustrated in FIG. 10 (step S6 in FIG. 3), by performing a process illustrated in FIG. 31 (step S6 in FIG. 27), the isolation film 8 is formed (deposited) so as to fill the groove 7 in a state in which the concave portion 7*c* is filled with the oxidation resistant film 9. Then, in the same manner as the process illustrated in FIGS. 11 and 12 (steps S7 and S8 in FIG. 3), by performing a process illustrated in FIGS. 32 and 33 (steps S7 and S8 in FIG. 27), a procedure for reducing a step between the isolation film 8 buried in the groove 7 and the SOI layer 4 is performed.

Here, as a first modification example, as illustrated in FIGS. 35 to 41, the portion of the BOX layer 3, which is exposed to the side surface 7*b* of the groove 7, can be covered with the oxidation resistant film 9 without forming the concave portion 7*c*.

In the first modification example, first, by performing a process (steps S1 to S4 in FIG. 34) same as the process illustrated in FIGS. 5 to 8 (steps S1 to S4 in FIG. 3), the groove 7 is formed in the isolation region 5.

Figure 35:
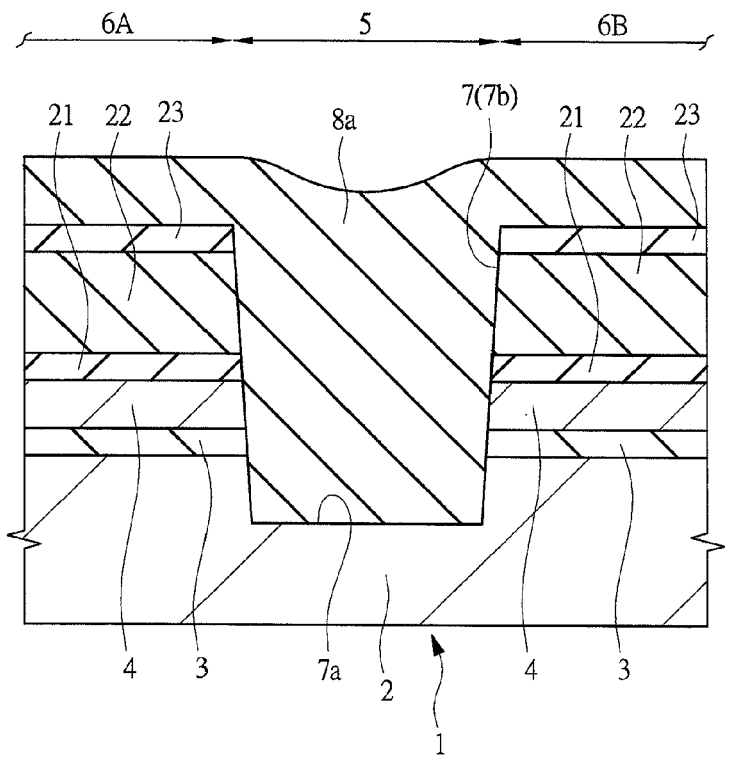
FIG. 35 is a cross-sectional view of main parts of the semiconductor device during the manufacturing process according to the first modification example of the second embodiment.

Next, as illustrated in FIG. 35, on the whole surface of the main surface (surface) of the SOI substrate 1, that is, on the insulating film 23, the isolation film 8*a* is formed (deposited) (step S41 in FIG. 34).

Figure 36:
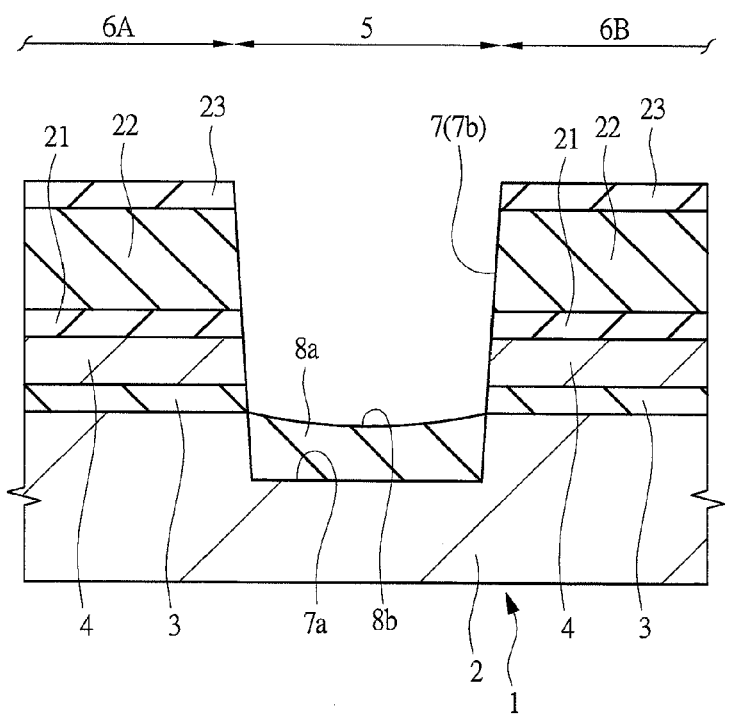
FIG. 36 is a cross-sectional view of main parts of the semiconductor device during the manufacturing process according to the first modification example of the second embodiment.

Next, as illustrated in FIG. 36, by etching back the isolation film 8*a* in the groove 7 by dry etching (plasma dry etching), an upper surface of the isolation film 8*a* in the groove 7 is set back (step S42 in FIG. 34). Here, in a state in which the bottom surface 7*a* is covered with the isolation film 8*a*, the upper surface 8*b* of the isolation film 8 in the groove 7 is set bask so that the BOX layer 3 is exposed to the side surface 7*b* of the groove until an edge portion on the supporting substrate 2 side (lower surface side).

Figure 37:
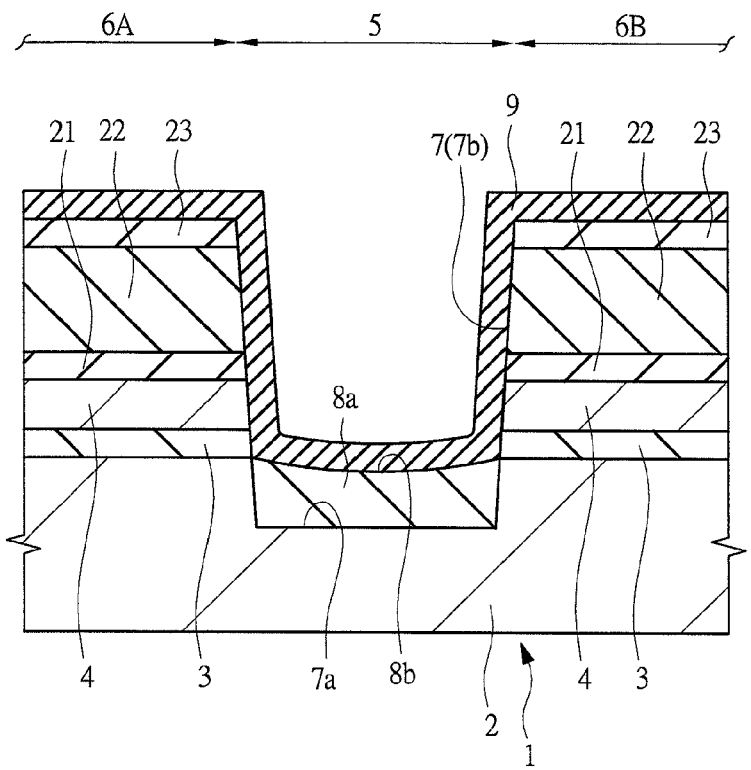
FIG. 37 is a cross-sectional view of main parts of the semiconductor device during the manufacturing process according to the first modification example of the second embodiment.

Next, as illustrated in FIG. 37, the oxidation resistant film 9 is formed (deposited) so as to cover the inside (that is, the side surface 7*b* of the groove 7 and the upper surface 8*b* of the isolation film 8*a*) and a surface of the insulating film 23 by CVD (for example, thermal CVD) or the like (step S43 in FIG. 34). The oxidation resistant film 9 is formed of a silicon nitride film. A thickness of the oxidation resistant film 9 is, for example, about 1 to 5 nm.

Figure 38:
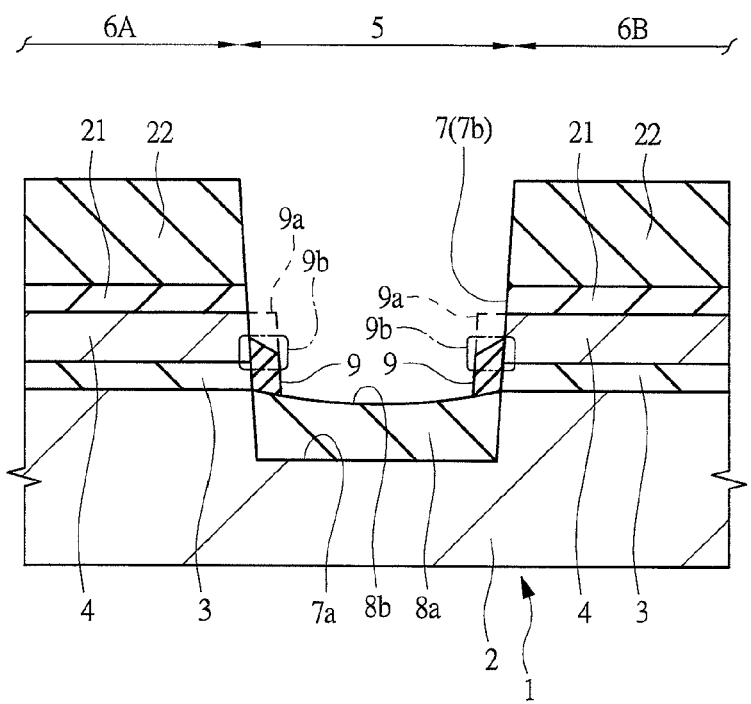
FIG. 38 is a cross-sectional view of main parts of the semiconductor device during the manufacturing process according to the first modification example of the second embodiment.

Next, as illustrated in FIG. 38, the oxidation resistant film 9 is etched by dry etching (plasma dry etching) so that at least a portion of the oxidation resistant film 9, which is formed to cover the BOX layer 3 is left (step S44 in FIG. 34). In this manner, in the part exposed to the side surface 7*b* of the groove 7, at least the BOX layer 3 can be covered with the oxidation resistant film 9. In addition, a portion of the oxidation resistant film 9, which is in contact with the upper surface 8*b* of the isolation film 8, is also removed. The oxidation resistant film 9 being formed covering the BOX layer 3 exposed to the side surface 7*b* of the groove 7 can prevent oxidation of the SOI layer 4 due to oxygen supplied through the isolation film 8c and the BOX layer 3 upon thermal processings of respective processes such as the thermal processing (annealing processing) of the isolation film 8c etc. formed in a later process.

Here, a portion of the oxidation resistant film 9, which is in contact with the SOI layer 4, is preferable to be removed so that a portion of the SOI layer 4 is directly in contact with the isolation film 8c formed in a later process. When the oxidation resistant film 9 is interposed between the SOI layer 4 and the isolation film 8c, charges are trapped in the oxidation resistant film 9 and charge-up occurs, posing a possibility of varying the threshold voltage (Vth) of the MISFET. Therefore, by making a configuration in which the oxidation resistant film 9 is not interposed between the portion of the SOI layer 4 and the isolation film 8c, variations in the threshold voltage (Vth) of the MISFET can be suppressed.

Further, as illustrated in FIG. 38, it is more preferable that portions 9b (the regions surrounded by dashed-dotted lines) of the oxidation resistant film 9, which are in contact with a lower surface side of the SOI layer 4, are left and portions 9a (the regions surrounded by broken lines), which are in contact with the upper surface side of the SOI layer 4, are removed. The lower surface side of the SOI layer 4 means the SOI layer 4 on the BOX layer 3 side and the upper surface side of the SOI layer 4 means the SOI layer 4 on the opposite side of the BOX layer 3 side. In this manner, as well as being able to suppress variations in the threshold voltage (Vth) of the MISFET, it is possible to prevent oxidation of the SOI layer 4 due to oxygen supplied through the insulating film 8c and the BOX layer 3 upon a thermal processing (annealing processing).

Note that, since the oxidation resistant film 9 is not interposed also between the supporting substrate 2 and the isolation film 8a, variations in the threshold voltage (Vth) of the MISFET due to charge-up of charges trapped in the oxidation resistant film 9 can be suppressed.

Figure 39:
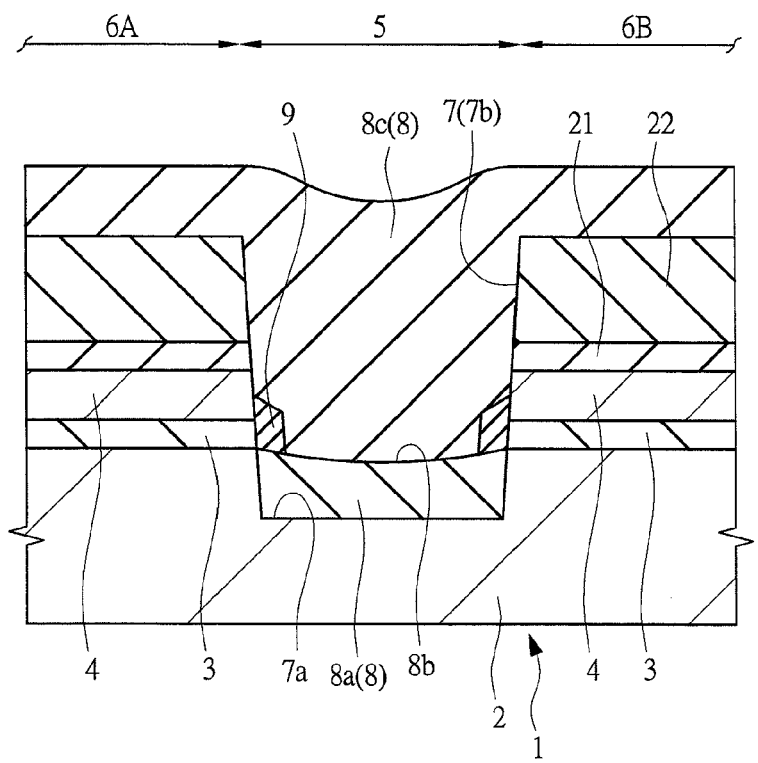
FIG. 39 is a cross-sectional view of main parts of the semiconductor device during the manufacturing process according to the first modification example of the second embodiment.
Figure 40:
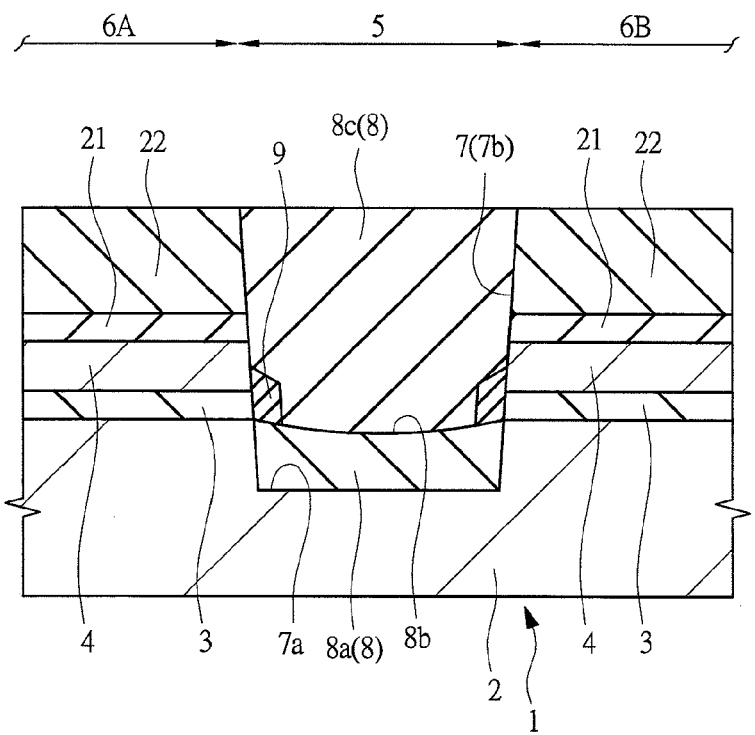
FIG. 40 is a cross-sectional view of main parts of the semiconductor device during the manufacturing process according to the first modification example of the second embodiment.
Figure 41:
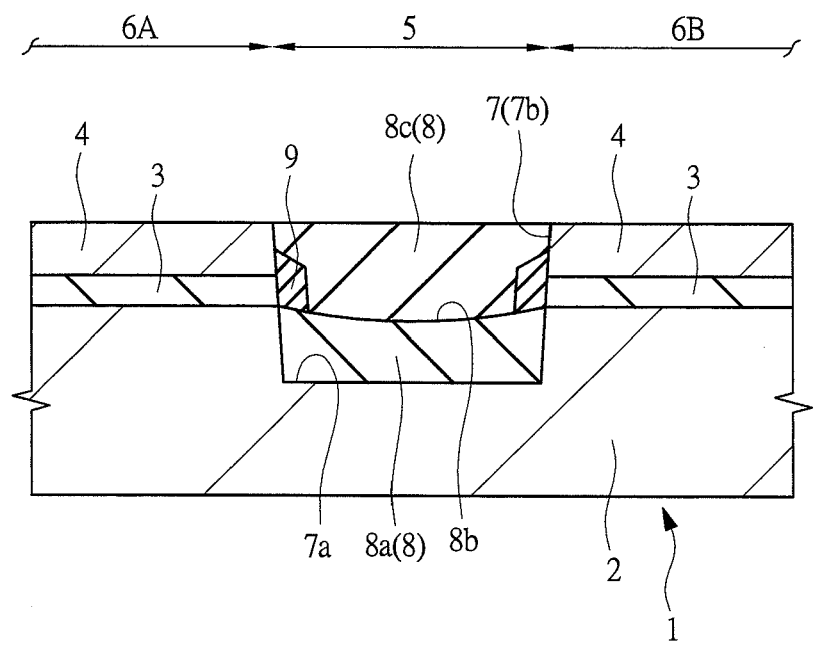
FIG. 41 is a cross-sectional view of main parts of the semiconductor device during the manufacturing process according to the first modification example of the second embodiment.
Figure 42:
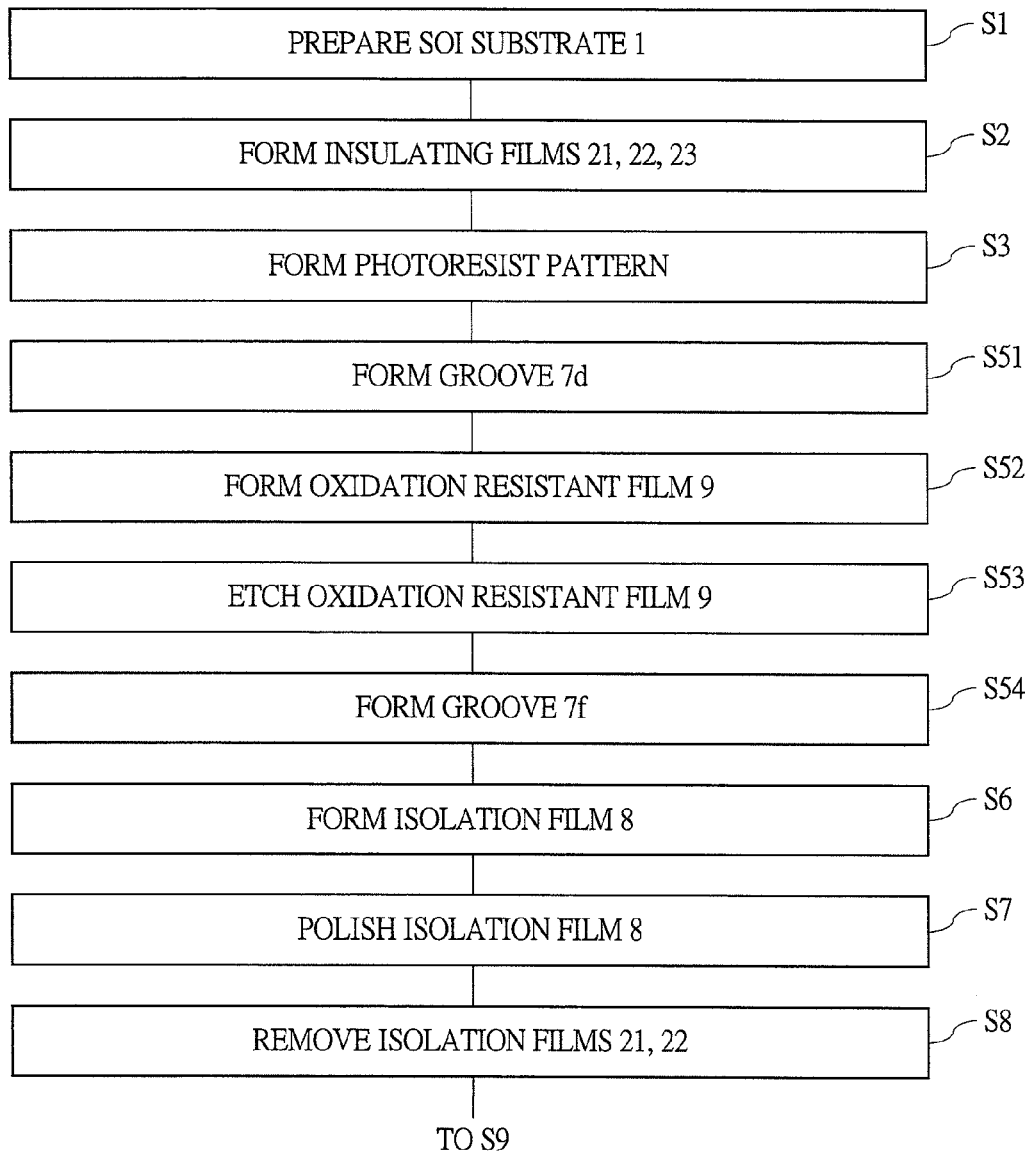
FIG. 42 is a manufacturing process flow diagram illustrating a part of a manufacturing process of a semiconductor device of a second modification example of the second embodiment.

Thereafter, in the same manner as the process illustrated in FIGS. 10 to 12 (steps S6 to S8 in FIG. 3), a process illustrated in FIGS. 39 to 41 (steps S6 to S8 in FIG. 34) is performed. However, in the process illustrated in FIG. 39, the isolation film 8c is formed to fill the groove 7. In the process illustrated in FIG. 38, by previously removing a portion of the oxidation resistant film 9, which is in contact with the upper surface 8b of the isolation film 8a, the isolation film 8c and the isolation film 8a are integrated as the isolation film 8. Then, in the process illustrated in FIGS. 40 and 41, a procedure for reducing a step between the isolation film 8 buried in the groove 7 and the SOI layer 4 is performed.

Also, as a second modification example, as illustrated in FIGS. 43 to 49, the portion of the BOX layer 3, which is exposed to the side surface 7b of the groove, can be covered with the oxidation resistant film 9 without forming the concave portion 7c.

In the second modification example, first, by performing a process (steps S1 to S3 in FIG. 42) in the same manner as the process illustrated in FIGS. 5 to 7 steps S1 to S3 in FIG. 3), a photoresist pattern is formed.

Figure 43:
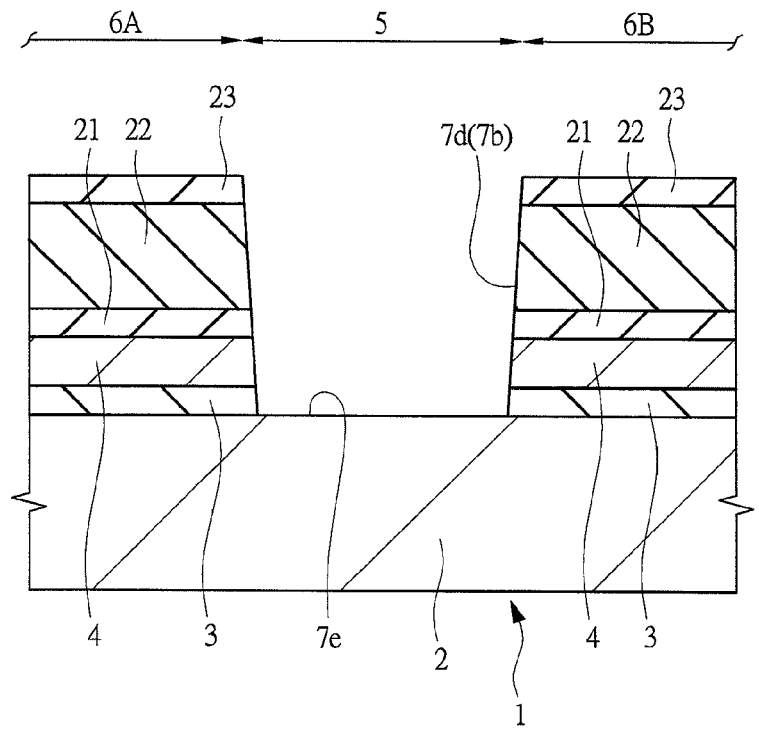
FIG. 43 is a cross-sectional view of main parts of the semiconductor device during the manufacturing process according to the second modification example of the second embodiment.

Next, using the photoresist pattern as a mask, the insulating film 23, the insulating film 22, the insulating film 21, the SOI layer 4 and the BOX layer 3 are sequentially subjected to dry etching (plasma dry etching), thereby forming a groove (isolation groove) 7d as illustrated in FIG. 43 (step S51 in FIG. 42). The groove 7d is formed so as to penetrate the insulating film 23, insulating film 22, insulating film 21, SOI layer 4 and BOX layer 3 so that a bottom surface 7e of the groove 7d is positioned at an upper surface of the supporting substrate 2. Therefore, the upper surface of the supporting substrate 2 is exposed to the bottom surface 7e of the groove 7d and the box layer 3, SOI layer 4, insulating film 21, insulating film 22 and insulating film 23 are exposed to the side surface 7b of the groove 7d.

Figure 44:
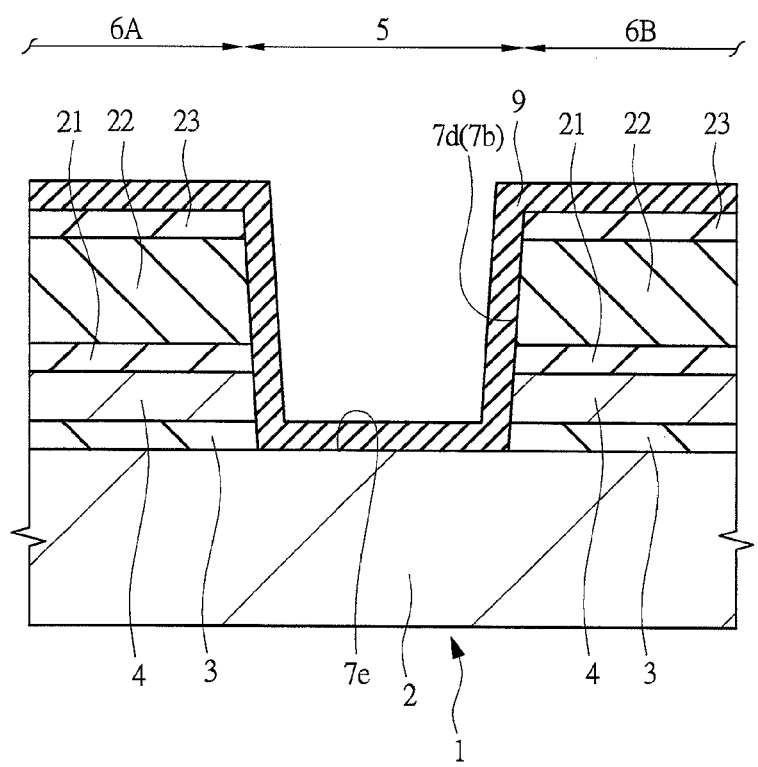
FIG. 44 is a cross-sectional view of main parts of the semiconductor device during the manufacturing process according to the second modification example of the second embodiment.

Next, as illustrated in FIG. 44, the oxidation resistant film 9 is formed (deposited) to cover the inside of the groove 7d (that is, the bottom surface 7e and the side surface 7b of the groove 7d) and a surface of the insulating film 23 by CVD (for example, thermal CVD) or the like. The oxidation resistant film 9 is formed of a silicon nitride film. A thickness of the oxidation resistant film 9 may be, for example, about 1 to 5 nm.

Figure 45:
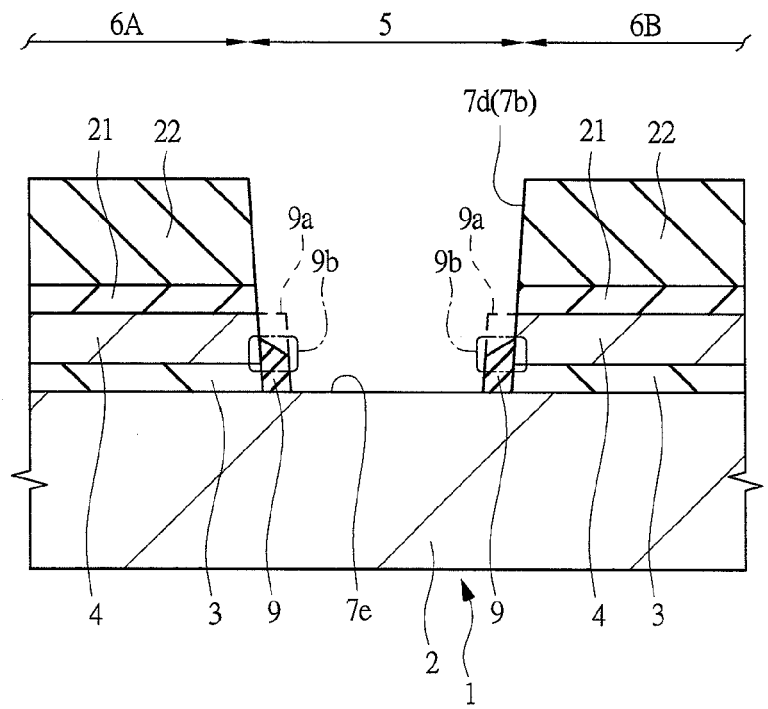
FIG. 45 is a cross-sectional view of main parts of the semiconductor device during the manufacturing process according to the second modification example of the second embodiment.

Next, as illustrated in FIG. 45, the oxidation resistant film 9 is etched by dry etching (plasma etching) so that at least a portion of the oxidation resistant film 9 formed, which covers the BOX layer 3, is left (step S53 in FIG. 42). In this manner, in the part exposed to the side surface 7b of the groove 7d, at least the BOX layer 3 can be covered with the oxidation resistant film 9. The oxidation resistant film 9 formed so as to cover the BOX layer 3 exposed to the side surface 7b of the groove 7d can prevent oxidation of the SOI layer 4 due to oxygen supplied through the isolation film 8 and the BOX layer 3 upon thermal processings in respective processes such as a thermal processing (annealing processing) of the isolation film 8 formed in a later process (see FIG. 47) etc.

Here, it is preferable that a portion of the oxidation resistant film 9, which is in contact with the SOI layer 4 is removed so that a portion of the SOI layer 4 is directly in contact with the isolation film 8 formed in a later process. When the oxidation resistant film 9 is interposed between the SOI layer 4 and the isolation film 8, charges are trapped in the oxidation resistant film 9 and charged up, posing a possibility of varying the threshold voltage (Vth) of the MISFET. Therefore, by making a configuration in which the oxidation resistant film 9 is not interposed between the portion of the SOI layer 4 and the isolation film 8, variations in the threshold voltage (Vth) of the MISFET can be suppressed.

Further, as illustrated in FIG. 45, it is preferable that portions 9b (the regions surrounded by dashed-dotted lines) of the oxidation resistant film 9, which are in contact with the lower surface side of the SOI layer 4, are left and portions 9a (the regions indicated by broken lines) of the oxidation resistant film 9, which are in contact with an upper surface side of the SOI layer 4, are removed. The lower surface side of the SOI layer 4 means the SOI layer 4 on the BOX layer 3 side, and the upper surface side of the SOI layer 4 means the SOI layer 4 on the opposite side of the BOX layer 3. In this manner, as well as being able to suppress variations in the threshold voltage (Vth) of the MISFET, it is possible to efficiently prevent oxidation of the SOI layer 4 due to oxygen supplied through the isolation film 8 and the BOX layer 3 upon thermal processings (annealing processings).

Note that, a portion of the oxidation resistant film 9, which is in contact with the bottom surface 7e of the groove 7d, is preferable to be removed. In this manner, it is unnecessary to include a process of previously etching the portion of the oxidation resistant film 9, which is in contact with the bottom surface 7e of the groove 7d upon forming a groove 7f (see FIG. 46) by digging down the bottom surface 7e of the groove 7d in the next process.

Figure 46:
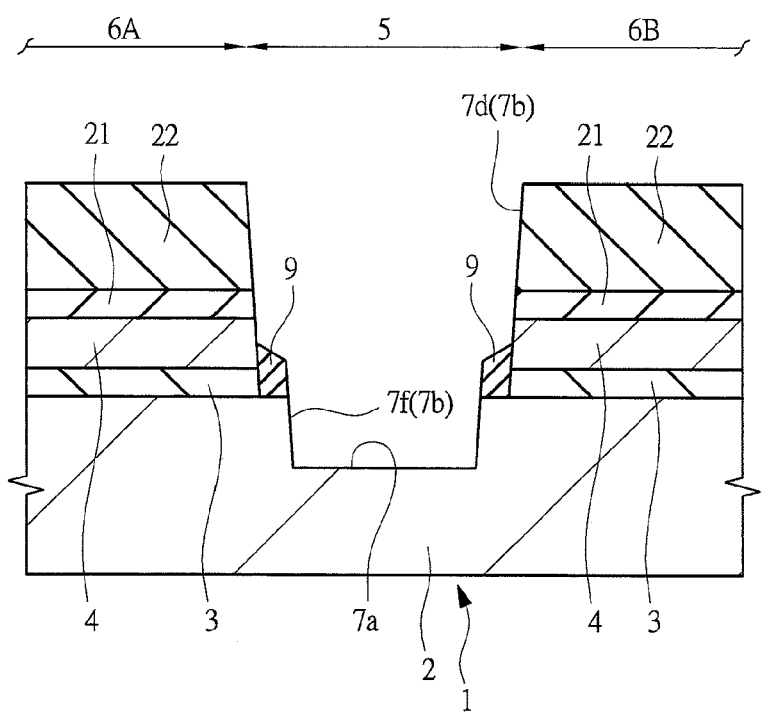
FIG. 46 is a cross-sectional view of main parts of the semiconductor device during the manufacturing process according to the second modification example of the second embodiment.

Next, as illustrated in FIG. 46, in a state in which the BOX layer 3 is covered with the oxidation resistant film 9 in the portion exposed to the side surface 7b of the groove 7d, the supporting substrate 2 exposed to the bottom surface 7e of the groove 7d is dug down by dry etching (plasma dry etching), thereby forming the groove 7f (step S54 in FIG. 42). The groove 7f is formed so that a bottom surface 7a of the groove 7*f* is positioned in the middle of the thickness of the supporting substrate 2. Also, the groove 7*f* and the groove 7*d* is integrated as the groove 7 (see FIG. 47).

Figure 47:
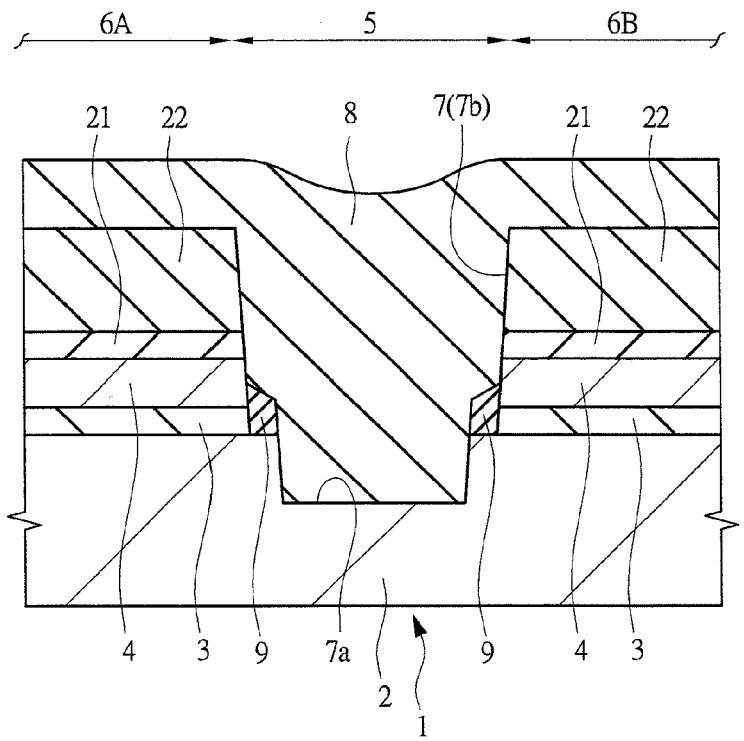
FIG. 47 is a cross-sectional view of main parts of the semiconductor device during the manufacturing process according to the second modification example of the second embodiment.
Figure 48:
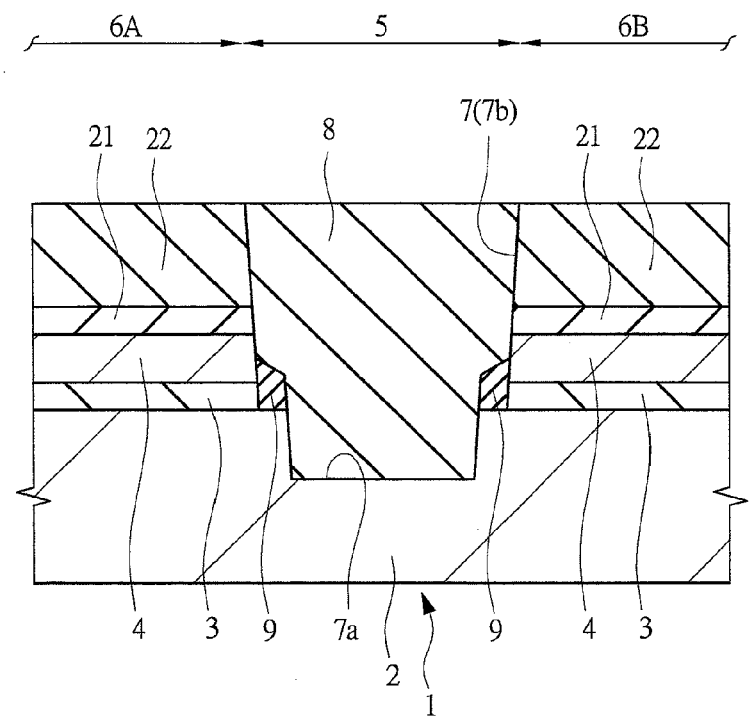
FIG. 48 is a cross-sectional view of main parts of the semiconductor device during the manufacturing process according to the second modification example of the second embodiment.
Figure 49:
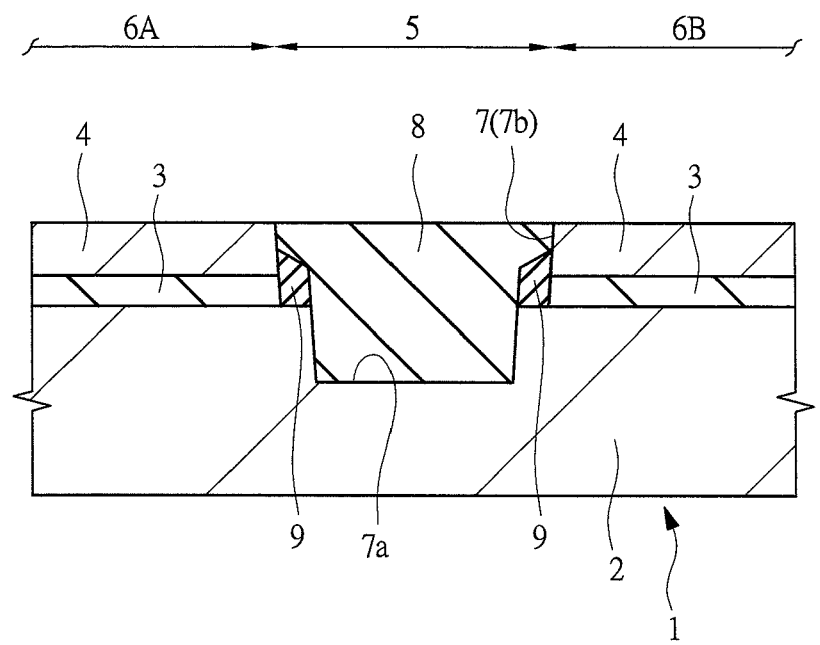
FIG. 49 is a cross-sectional view of main parts of the semiconductor device during the manufacturing process according to the second modification example of the second embodiment.

Thereafter, in the same manner as the process illustrated in FIGS. 10 to 12 (steps S6 to S8 in FIG. 3), a process illustrated in FIGS. 47 to 49 (S6 to S8 in FIG. 42) is performed. In this manner, as well as covering the inside of the groove 7 (the bottom surface 7*a* and side surface 7*b*), the isolation film 8 is formed to fill the groove 7 and a treatment for reducing the step between the isolation film 8 buried in the groove 7 and the SOI layer 4 is performed.

Note that, since the oxidation resistant film 9 is not interposed also between the supporting substrate 2 and the isolation film 8, variations in the threshold voltage (Vth) of the MISFET due to charge-up of charges trapped in the oxidation resistant film 9 can be suppressed.

Figure 50:
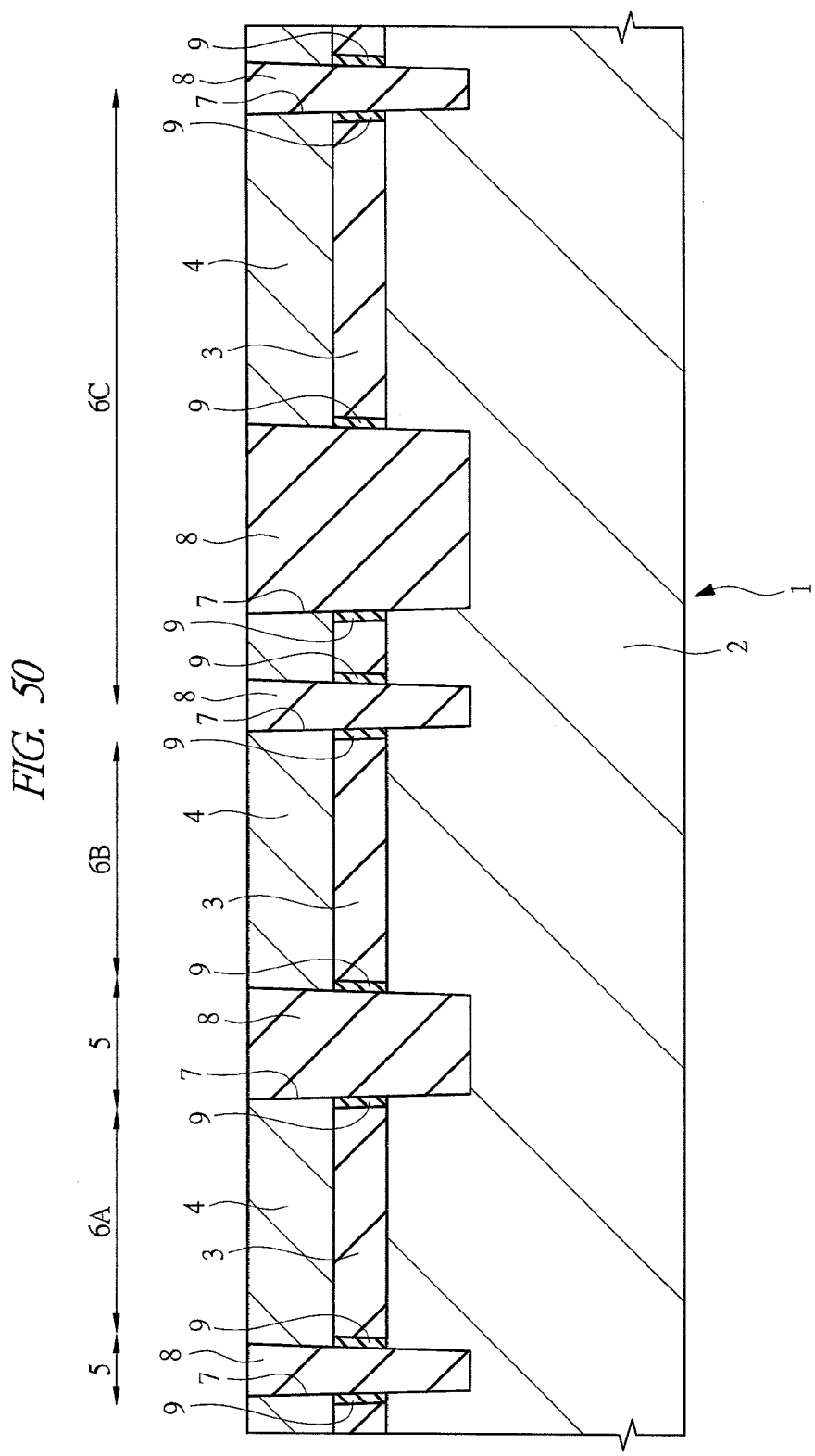
FIG. 50 is a cross-sectional view of main parts of the semiconductor device during the manufacturing process according to the second embodiment.

In the manner as described above, as illustrated in FIG. 33, 41 or 49, the isolation film 8 is formed in the isolation region 5 of the SOI substrate 1 by the STI method. In addition, as illustrated in FIG. 50, the isolation film 8 is formed in a plurality of the isolation regions 5 over the whole surface of the main surface (surface) of the SOI substrate 1. Since the isolation film 8 is formed in the isolation regions 5, the SOI substrate 1 is defined (sectioned) into the MISFET forming regions (active regions) 6A, 6B and 6C by the isolation regions 5 to which the isolation film 8 is formed. Moreover, to the MISFET forming regions 6A, 6B and 6C, various semiconductor elements (for example, the MISFETs Q1, Q2, Q3 etc.) are formed in following processes.

Figure 51:
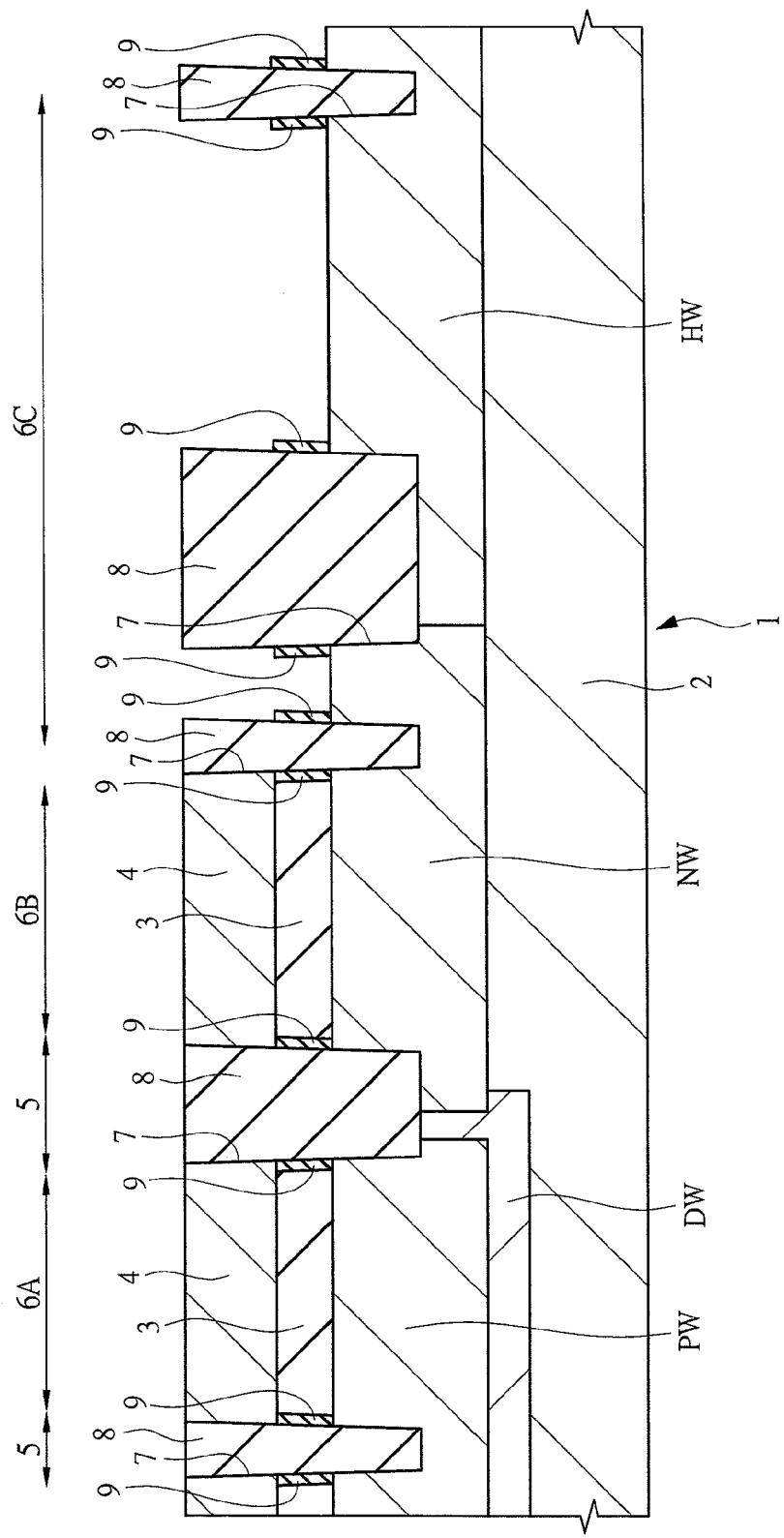
FIG. 51 is a cross-sectional view of main parts of the semiconductor device during the manufacturing process according to the second embodiment.
Figure 52:
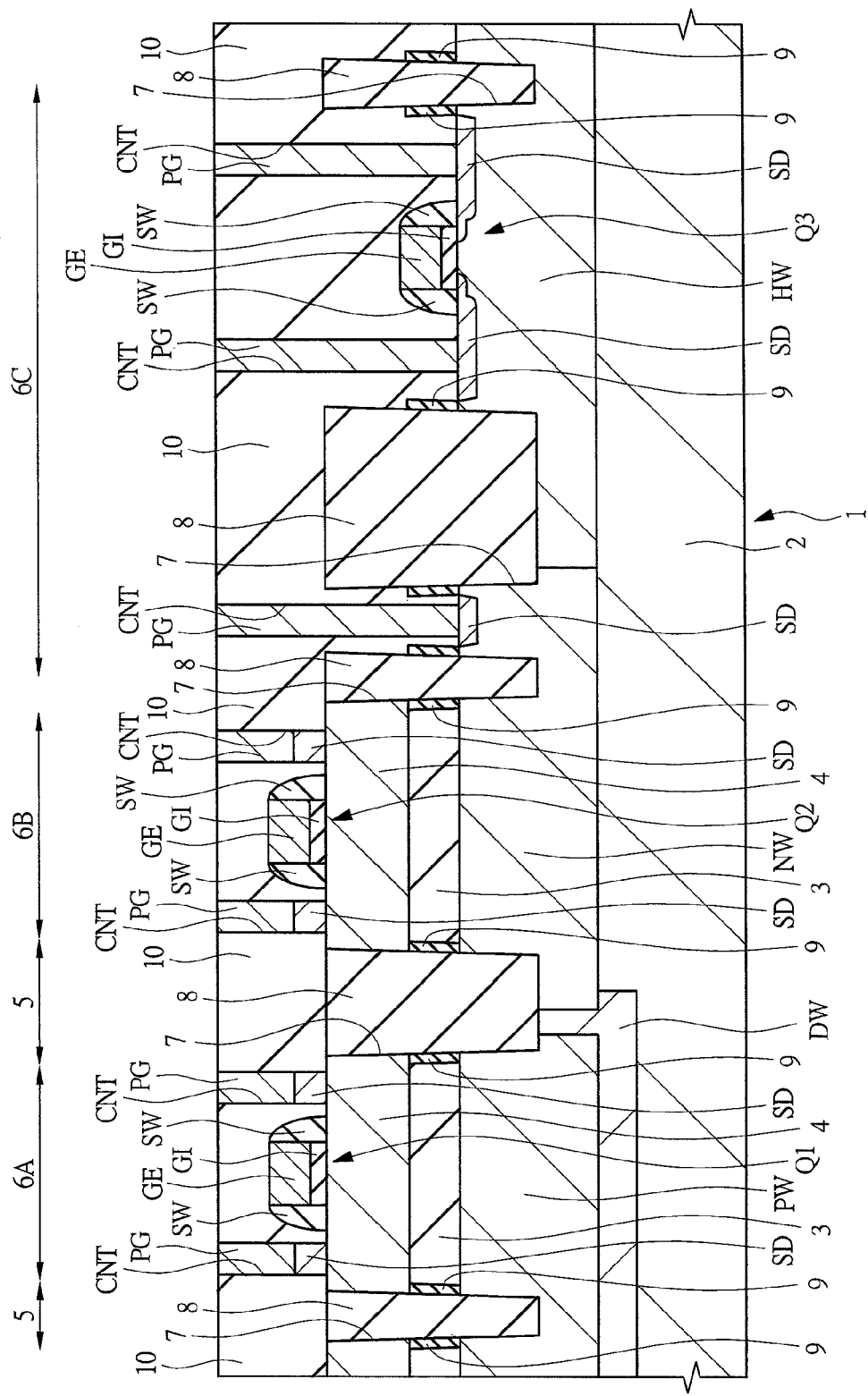
FIG. 52 is a cross-sectional view of main parts of the semiconductor device during the manufacturing process according to the second embodiment.

Then, by performing a process in the same manner as the process illustrated in FIGS. 19 and 20 (steps S9 and S10 in FIG. 4), as illustrated in FIG. 51, the well regions PW, NW and HW are formed and the SOI layer 4 and the BOX layer 3 are removed in the high-withstand-voltage MISFET forming region 6C. Then, by performing a process in the same manner as the process illustrated in FIGS. 21 and 22 (steps S11 and S12 in FIG. 4), as illustrated in FIG. 52, the n-channel type MISFET Q1 and the p-channel type MISFET Q2 are formed on the SOI layer 4 and the MISFET Q3 having a high withstand voltage is formed on the supporting substrate 2. The interlayer insulators 10 and plugs PG are formed on the MISFETs Q1, Q2 and Q3, respectively. Moreover, by performing a process in the same manner as the process denoted by S13 in FIG. 4, as illustrated in FIG. 25, a semiconductor device having a structure in which the wiring M1 of the first layer is formed is manufactured.

<Main Features and Effects of the Second Embodiment>

In the second embodiment, the groove 7 is formed in the isolation regions 5 and a portion of the BOX layer 3, which is exposed to the side surface 7*b* of the groove 7, is etched to form the concave portion 7*c* to the side surface 7*b* of the groove 7, and the oxidation resistant film 9 is formed to cover the BOX layer 3 exposed to the concave portion 7*c*. Further, in the first modification example and the second modification example, the oxidation resistant film 9 is deposited to cover the whole surface of the inside of the groove 7 and then etched to remain in the portion covering the BOX layer 3. By forming the oxidation resistant film 9, the BOX layer 3 is covered with the oxidation resistant film 9. That is, the oxidation resistant film 9 is interposed between the BOX layer 3 and the isolation film 8. In this manner, upon performing the annealing processing after forming the isolation film 8 to fill the groove 7 in which the BOX layer 3 is covered with the oxidation resistant film 9, diffusion of oxygen through the isolation film 8 and the BOX layer 3 can be prevented and thus oxidation of the SOI layer 4 can be prevented.

Particularly, when the BOX layer 3 and the isolation film 8 are silicon oxide films, the oxidation resistant film 9 is preferred to be a silicon nitride film. As oxygen diffusion can be prevented by a silicon nitride film, it is possible to surely prevent diffusion of oxygen through the silicon oxide film of the isolation film 8 and the silicon oxide film of the BOX layer 3 and to surely prevent oxidation of the SOI layer 4 upon the annealing processing.

As a result, in the semiconductor device of the present embodiment, also in a minute MISFET having a short channel length, it is possible to prevent an increase in the thickness of the BOX layer 3 on the isolation region 5 side and to suppress variations of the threshold voltage (Vth) of the semiconductor device. In addition, in the semiconductor device of the present embodiment, also in a minute MISFET having a short channel length, it is possible to prevent occurrence of fluctuations in the threshold voltage (Vth) of the semiconductor device over the whole surface of the main surface (surface) of the SOI substrate 1 and to prevent lowering of the uniformity of electric characteristics of the semiconductor device. Further, in the semiconductor device of the present embodiment, an increase in the etching speed of the BOX layer 3 on the isolation region 5 side can be prevented and thus occurrence of "pattern defects" can be prevented also in a minute MISFET having a short channel length.

Further, as an oxidation resistant film is not interposed between the SOI layer 4 and the isolation film 8 and between the supporting substrate 2 and the isolation film 8 in the second embodiment, variations in the threshold voltage (Vth) of the MISFET due to charge-up of charges trapped in an oxidation resistant film.

(Third Embodiment)

In the first and second embodiments, the oxidation resistant film 9 has been interposed between the isolation film 8 and the BOX layer 3 exposed to the side surface 7*b* of the groove 7. On the contrary, in a third embodiment, an SOI substrate 1 in which a portion of a BOX layer 3 on an SOI layer 4 side or a portion of the BOX layer 3 on a supporting substrate 2 side are nitrided is prepared; a groove 7 is formed to such the SOI substrate 1; and an isolation film 8 is formed to fill the groove 7 formed.

<Semiconductor Device>

Figure 53:
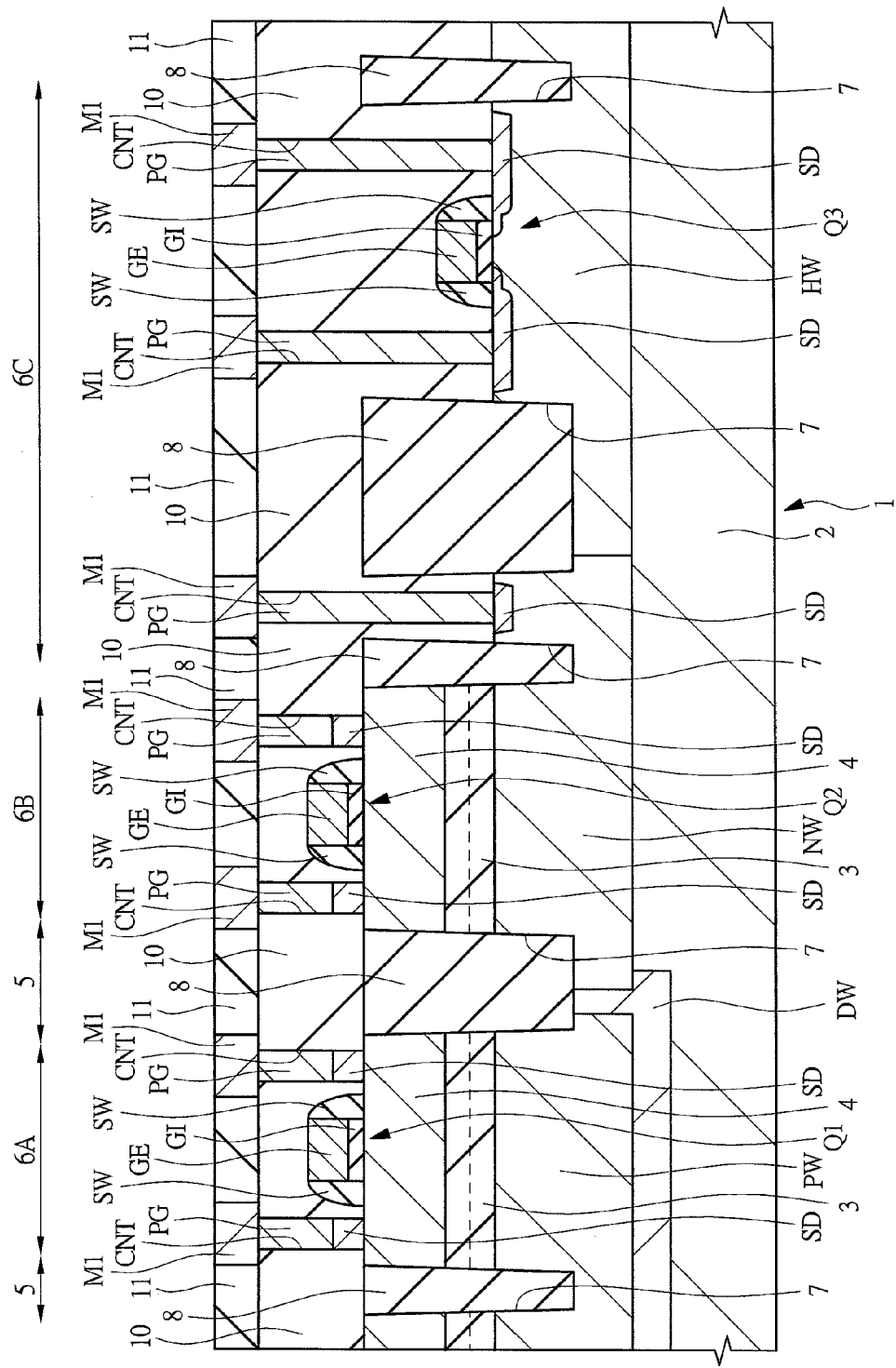
FIG. 53 is a cross-sectional view of main parts of a semiconductor device according to a third embodiment.
Figure 54:
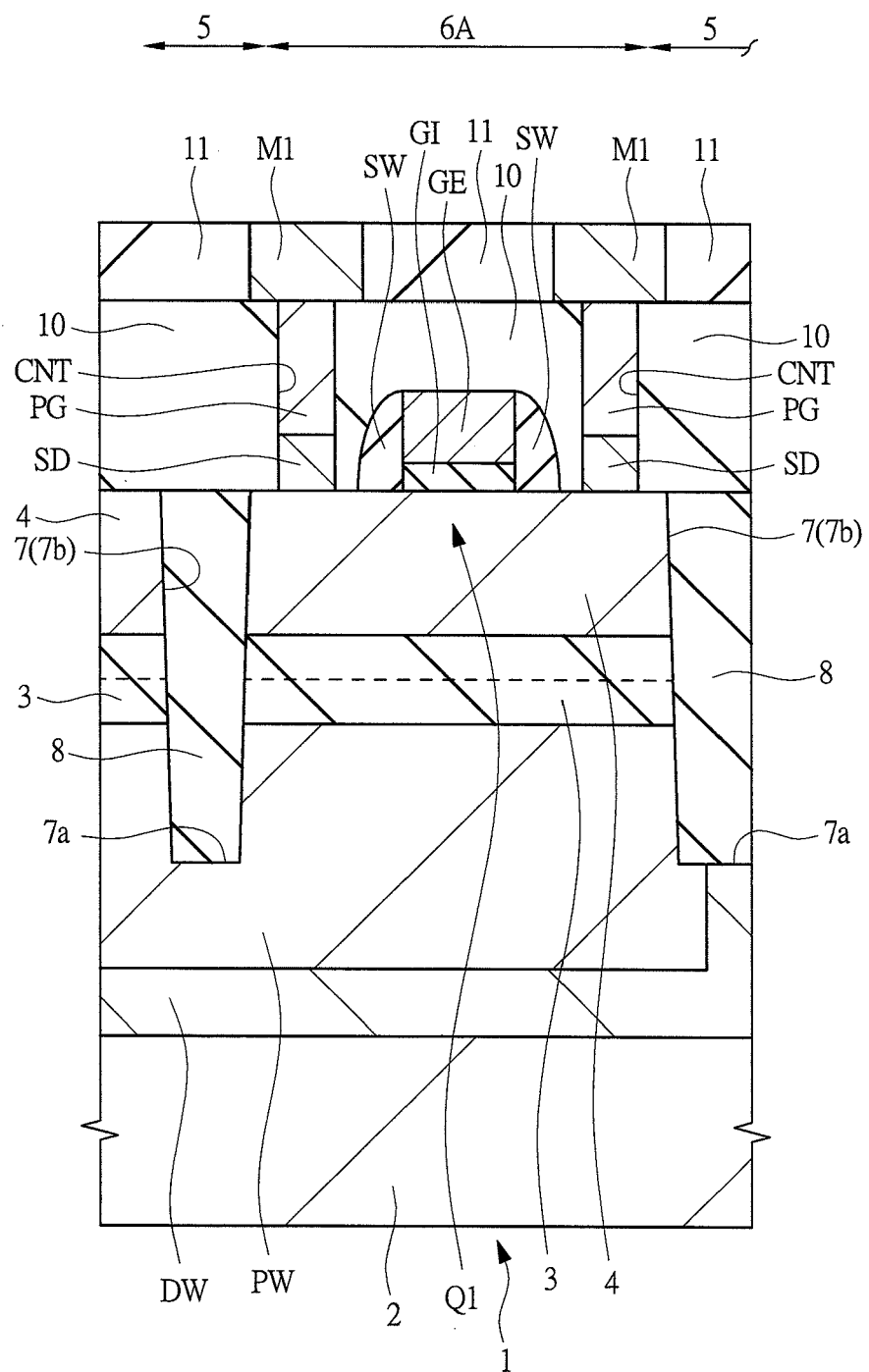
FIG. 54 is a cross-sectional view of main parts of the semiconductor device according to the third embodiment.

FIGS. 53 and 54 are cross-sectional views of main parts of a semiconductor device of the third embodiment. FIG. 54 is a diagram illustrating a region in a vicinity of an n-channel type MISFET Q1 in FIG. 53 in an enlarged manner.

In the present embodiment, a portion of the BOX layer 3 of the SOI substrate 1 on the SOI layer 4 side and a portion of the BOX layer 3 on the supporting substrate side 2 are nitrided. The nitrided portions of the BOX layer 3 prevent oxidation of the SOI layer 4 upon a thermal processing (annealing processing) for baking the isolation film 8 buried in the groove 7.

In the SOI substrate 1, the supporting substrate 2 and the SOI layer 4 are formed of single crystal silicon and the BOX layer 3 is formed of a silicon oxide film. Note that, in the BOX layer 3, the portion on the SOI layer 4 side and the portion on the supporting substrate 2 side are nitrided and thus the portions are silicon oxynitride. Using such the SOI substrate 1, an oxidation resistant film covering the inside of a groove 7 is not formed after forming the groove 7 and the isolation film 8 is directly formed to the groove 7 to fill the groove 7. In this manner, oxidation of the SOI layer 4 upon the annealing processing after forming the isolation film 8 is prevented.

In addition, as an oxidation resistant film is not interposed between the SOI layer 4 and the isolation film 8 and between the supporting substrate 2 and the isolation film 8 in the third embodiment, variations in the threshold voltage (Vth) of the MISFET due to charge-up of charges trapped in an oxidation resistant film.

<Manufacturing Process of the Semiconductor Device>

Figure 55:
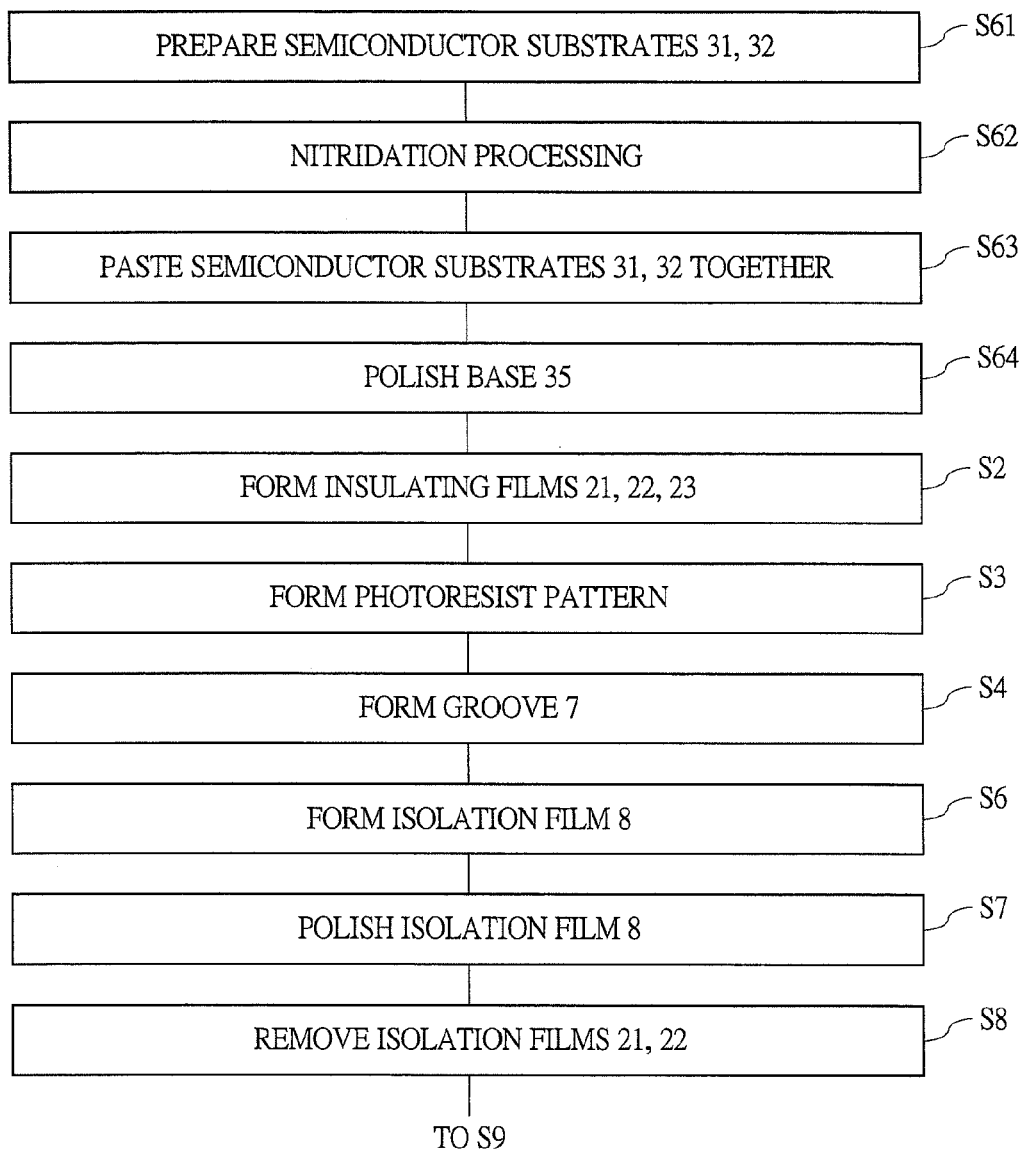
FIG. 55 is a manufacturing process flow diagram illustrating a part of the manufacturing process of the semiconductor device according to the third embodiment.

A manufacturing process of the semiconductor device according to the third embodiment will be described with reference to the drawings. FIG. 55 is a manufacturing process flow chart illustrating a part of the manufacturing process of the semiconductor device according to the third embodiment. FIGS. 56 to 58, FIG. 59A, and FIGS. 60 to 68 are cross-sectional views of main parts during the manufacturing process of the semiconductor device according to the third embodiment. FIG. 59B is a graph schematically illustrating a distribution of nitride concentration. Note that, in FIGS. 60 to 65, a vicinity of an isolation region is illustrated in an enlarged manner.

Figure 56:
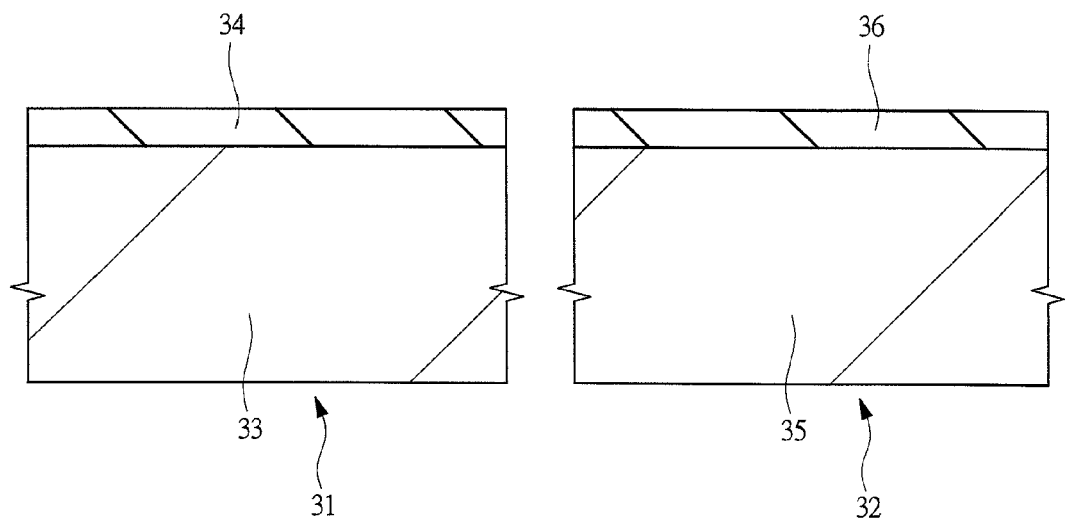
FIG. 56 is a cross-sectional view of main parts of the semiconductor device during the manufacturing process according to the third embodiment.

First, as illustrated in FIG. 56, semiconductor substrates 31 and 32 for fabricating the SOI substrate 1 are prepared (step S61 in FIG. 55). The semiconductor substrate 31 has a base 33 and an insulating layer 34 formed on the base 33. The semiconductor substrate 32 has a base 35 and an insulating layer 36 formed on the base 35. The bases 33 and 35 are, for example, single crystal silicon substrate. The insulating layers 34 and 36 are, for example, silicon oxide films and having a thickness of, for example, 2 to 10 nm.

Figure 57:
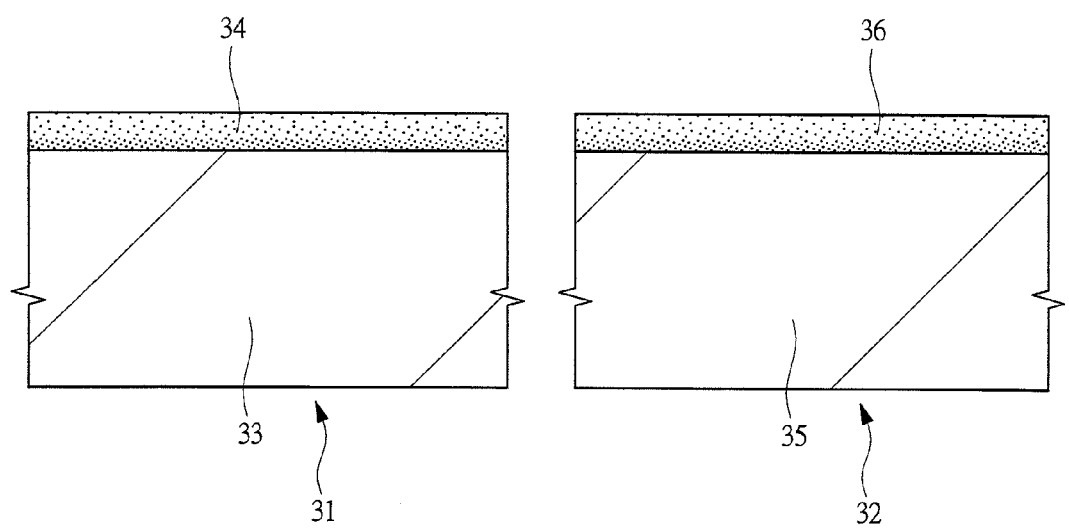
FIG. 57 is a cross-sectional view of main parts of the semiconductor device during the manufacturing process according to the third embodiment.

Next, as illustrated in FIG. 57, the insulating layers 34 and 36 are subjected to a nitridation processing (step S62 in FIG. 55). The nitridation processing here is performed by a thermal processing using a nitriding gas (nitriding species) such as NO gas. In this case, the nitriding species mainly nitride interfaces of the insulating layers 34 and 36, which are silicon oxide films, and the bases 33 and 35. As a result, in the insulating layers 34 and 36, portions on the bases 33 and 35 side (portions on the lower side of FIG. 57) become silicon oxynitride films having a higher nitride concentration than portions on the opposite side of the bases 33 and 35 side (portions on the upper side of FIG. 57). In the silicon oxynitride films, diffusion of oxygen is more difficult than in silicon oxide films. Therefore, silicon oxynitride films have a function of preventing oxidation of the SOI layer 4 in an annealing processing of the isolation film 8 (see FIG. 63) formed in a later process. In addition, as portions of the insulating layers 34 and 36 on the opposite side of the base 33 and 35 side are hardly nitrided and remain to be silicon oxide films, a function as BOX layers, that is, buried oxide films can be ensured.

As described above, the nitridation process can be performed by, for example, plasma nitridation or thermal nitridation. From the two, the nitridation process is preferable to be the thermal nitridation using NO gas according to the points that it is easier for nitride to diffuse in the insulating layers 34 and 36 and it is easier to form silicon nitride films.

Figure 58:
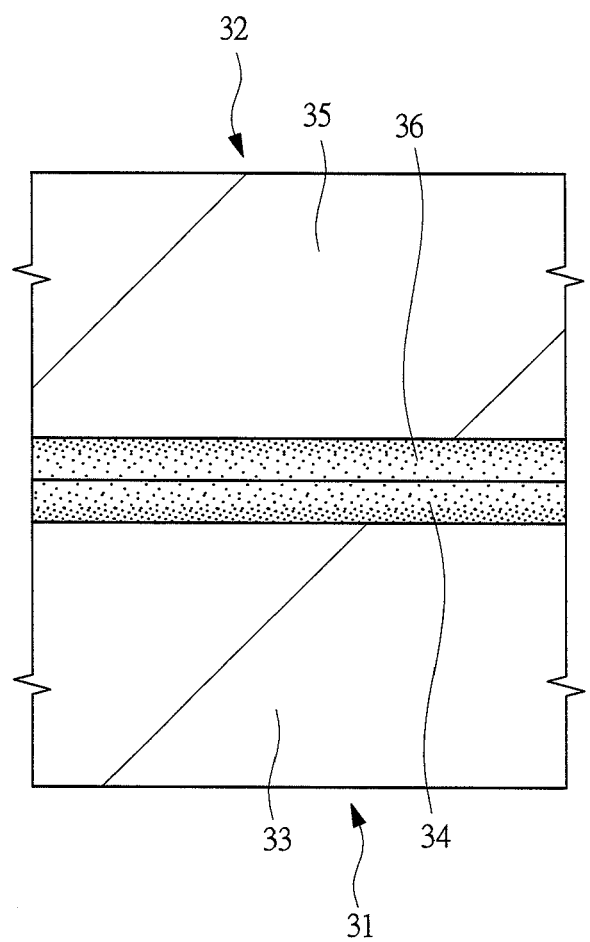
FIG. 58 is a cross-sectional view of main parts, of the semiconductor device during the manufacturing process according to the third embodiment.

Next, as illustrated in FIG. 58, the semiconductor substrates 31 and 32 are attached to each other by pressing for attaching the semiconductor substrate 31 and the semiconductor substrate 32 to each other so that the semiconductor substrates 31 and 32 are in contact with each other on the insulating layer 34 side and the insulating layer 36 side, and performing a thermal processing of keeping the semiconductor substrates 31 and 32 at a high temperature of, for example, 1000° C. (step S63 in FIG. 55). Here, the insulating layers 34 and 36 are joined and integrated.

Figure 59A:
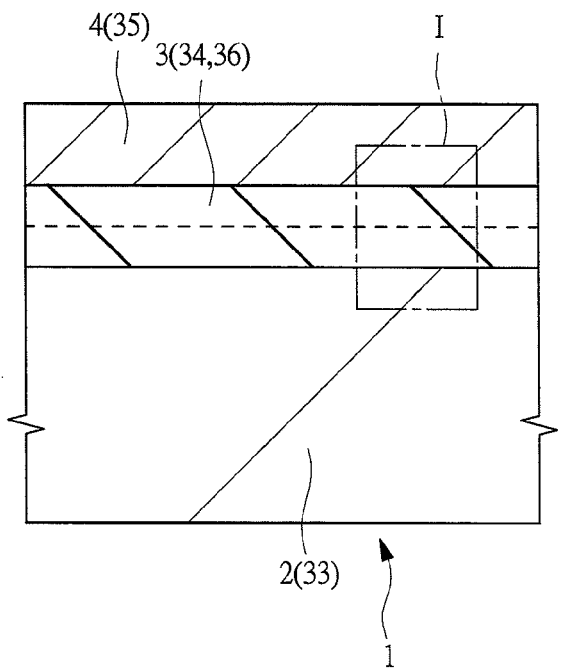
FIG. 59A is a cross-sectional view of main parts of the semiconductor device during the manufacturing process according to the third embodiment.
Figure 59B:
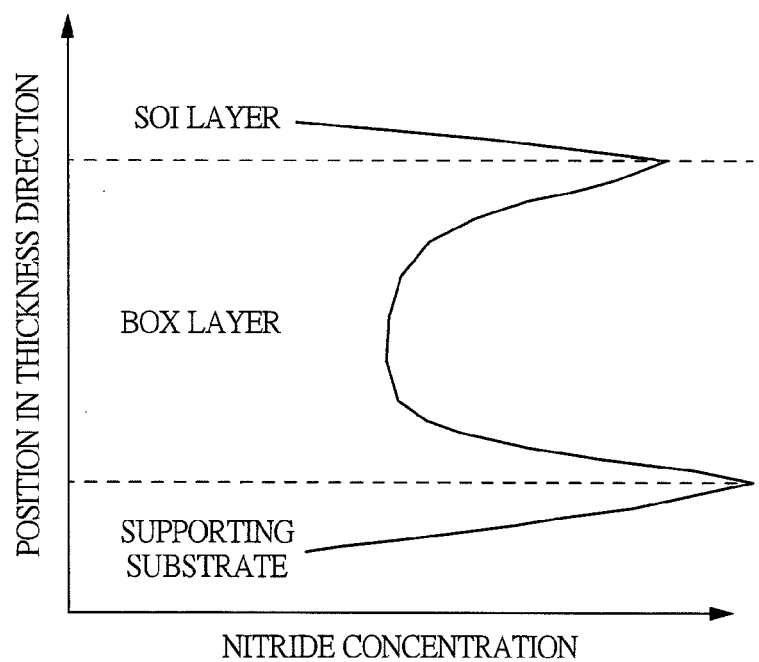
FIG. 59B is a graph schematically illustrating a distribution of nitride concentration of the semiconductor device during the manufacturing process according to the third embodiment.

Next, as illustrated in FIG. 59A, the base 35 of the semiconductor substrates 31 and 32 being attached is polished (step S64 in FIG. 55). By thinning the base 35 by polishing until a thickness of the base 35 becomes about 2 to 100 nm, the SOI substrate 1 having the base 33 as the supporting substrate 2, the joined insulating layers 34 and 36 as the BOX layer 3, and the base 35 thinned as the SOI layer 4 is fabricated.

FIG. 59B is a graph schematically illustrating a distribution of nitride concentration of the SOI substrate 1 in a thickness direction of the SOI substrate 1 in a region I surrounded by a dashed-dotted line in FIG. 59A. As illustrated in FIG. 59B, along the thickness direction of the SOI substrate 1, the nitride concentration shows the maximum in a vicinity of an interface of the supporting substrate 2 and the BOX layer 3 and in a vicinity of an interface of the BOX layer 3 and the SOI layer 4. More specifically, along the thickness direction of the SOI substrate 1, a portion on the supporting substrate 2 side of the BOX layer 3 and a portion on the SOI layer 4 side of the BOX layer 3 are nitrided and become silicon oxynitride. As the BOX layer 3 has nitrided portions along the thickness direction of the SOI substrate 1, diffusion of oxygen through the BOX layer 3 is more difficult than the case when the BOX layer 3 not nitrided at all; and thus the BOX layer 3 has a function of preventing oxidation of the SOI layer 4 in the annealing processing of the isolation film 8 formed in a later process (see FIG. 63). Also, portions of the insulating layers 34 and 36 on the opposite side of the bases 33 and 35 side are hardly nitrided and remain as silicon oxide films; and thus a function as a BOX layer, that is, a buried oxide film can be ensured.

Note that, only one of the semiconductor substrates 31 and 32 may be subjected to the nitridation processing. Also in this case, since either of the portion on the supporting substrate 2 side of the BOX layer 3 or the portion on the SOI layer 4 side of the BOX layer 3 is nitrided along the thickness direction of the SOI substrate 1, diffusion of oxygen through the BOX layer 3 is more difficult than the case when the BOX layer 3 not nitrided at all; and thus the BOX layer 3 has a function of preventing oxidation of the SOI layer 4 in the annealing processing of the isolation film 8 formed in a later process.

Figure 60:
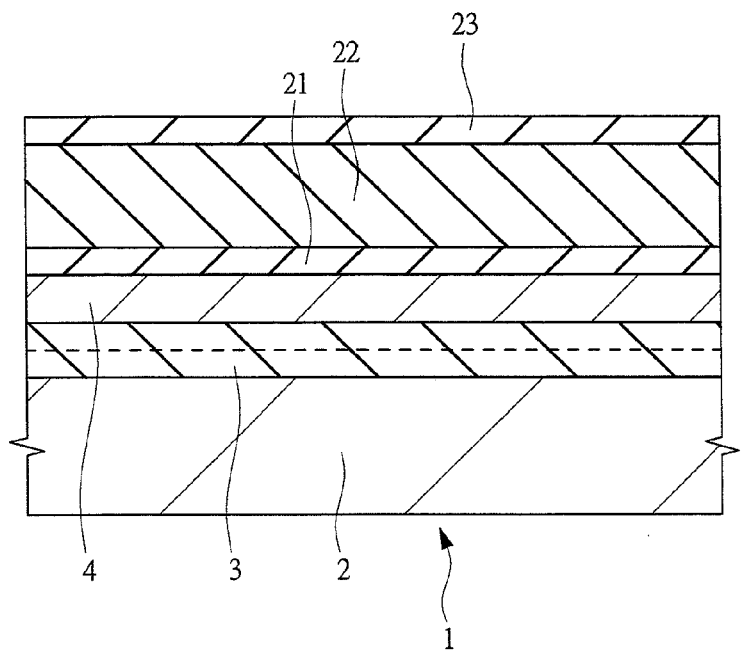
FIG. 60 is a cross-sectional view of main parts of the semiconductor device during the manufacturing process according to the third embodiment.
Figure 61:
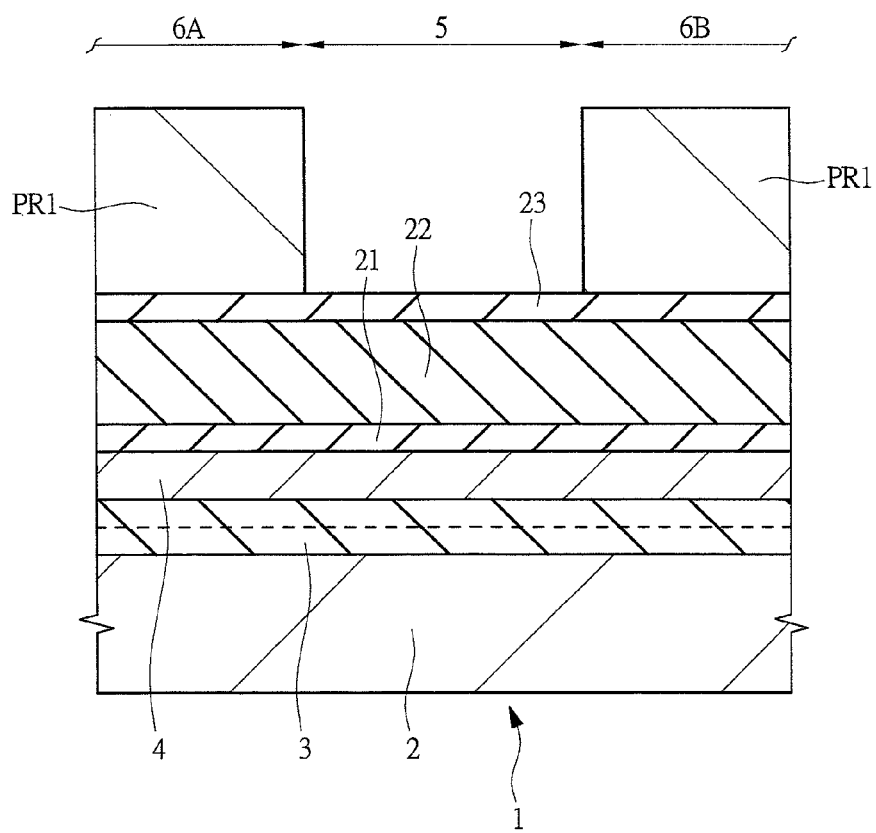
FIG. 61 is a cross-sectional view of main parts of the semiconductor device during the manufacturing process according to the third embodiment.
Figure 62:
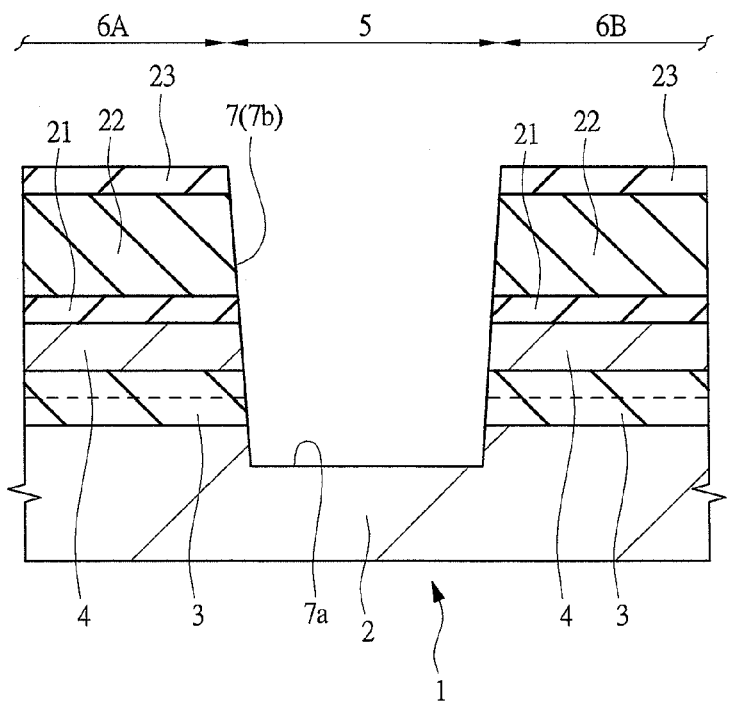
FIG. 62 is a cross-sectional view of main parts of the semiconductor device during the manufacturing process according to the third embodiment.
Figure 63:
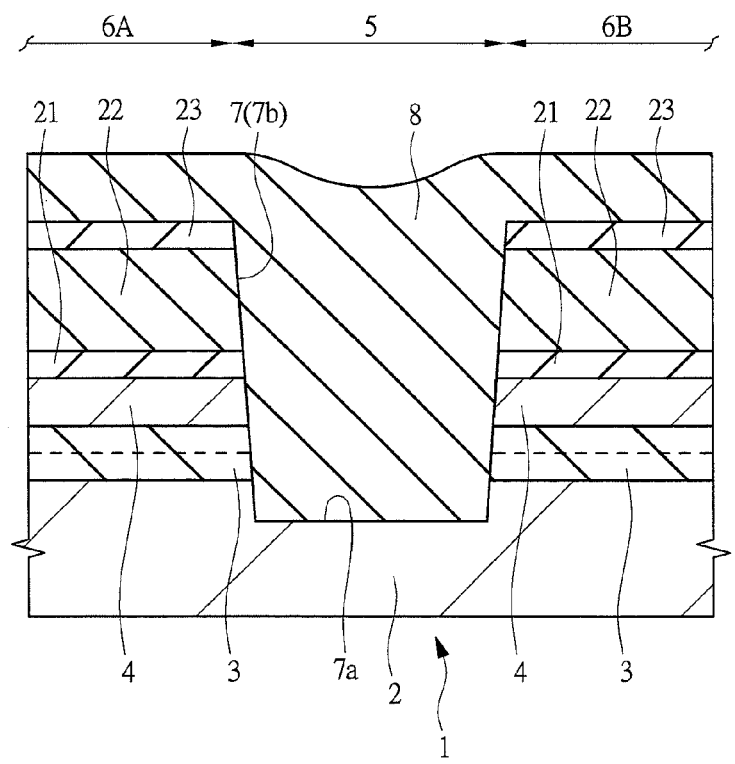
FIG. 63 is a cross-sectional view of main parts of the semiconductor device during the manufacturing process according to the third embodiment.
Figure 64:
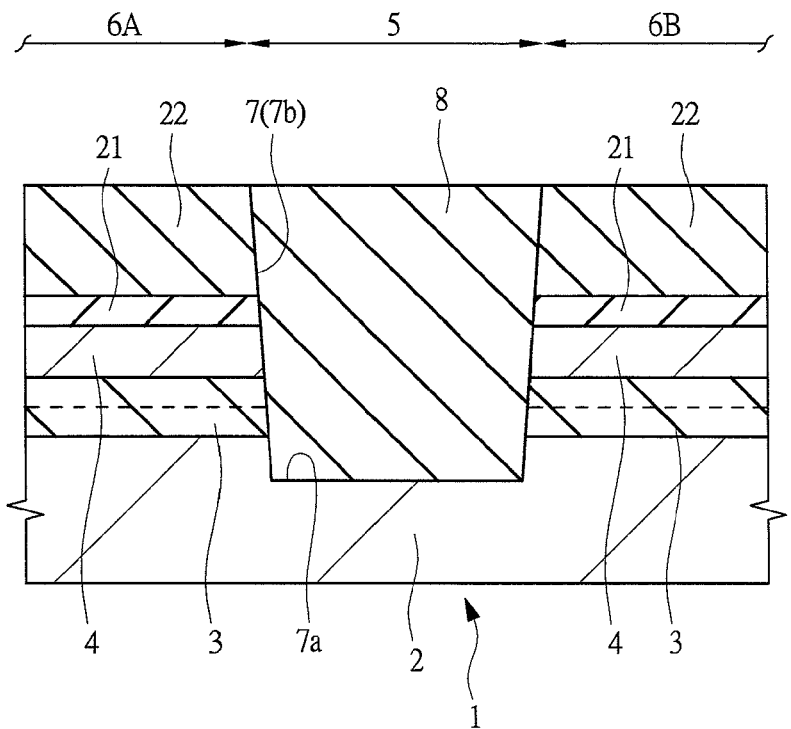
FIG. 64 is a cross-sectional view of main parts of the semiconductor device during the manufacturing process according to the third embodiment.
Figure 65:
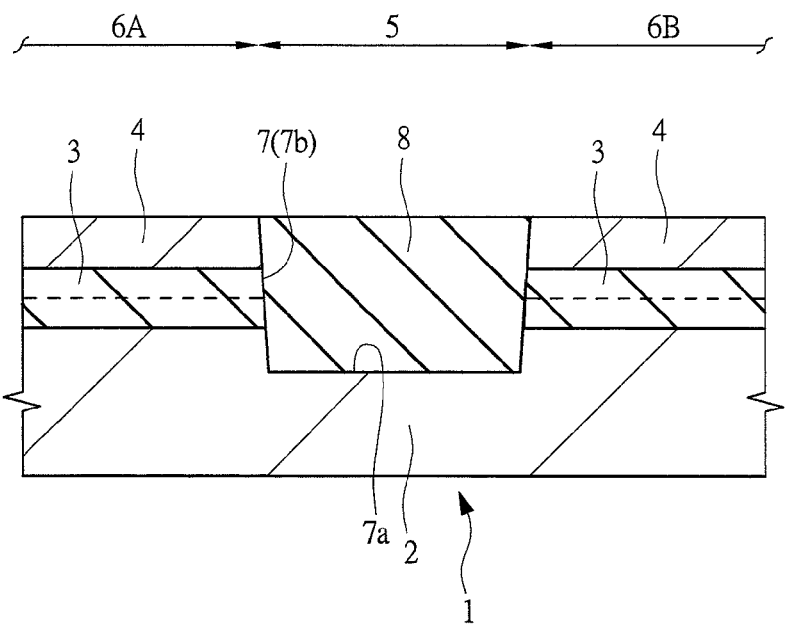
FIG. 65 is a cross-sectional view of main parts of the semiconductor device during the manufacturing process according to the third embodiment.

Next, in the same manner as the process illustrated in FIGS. 6 to 8 (steps S2 to S4 in FIG. 3), a process in FIGS. 60 to 62 (steps S2 to S4 in FIG. 55) is performed, thereby forming a groove 7 in an isolation region 5. Then, in the same manner as the process illustrated in FIGS. 10 to 12 (steps S6 to S8 in FIG. 3), a process illustrated in FIGS. 63 to 65 (steps S6 to S8 in FIG. 55) is performed, thereby forming the isolation film 8.

Figure 66:
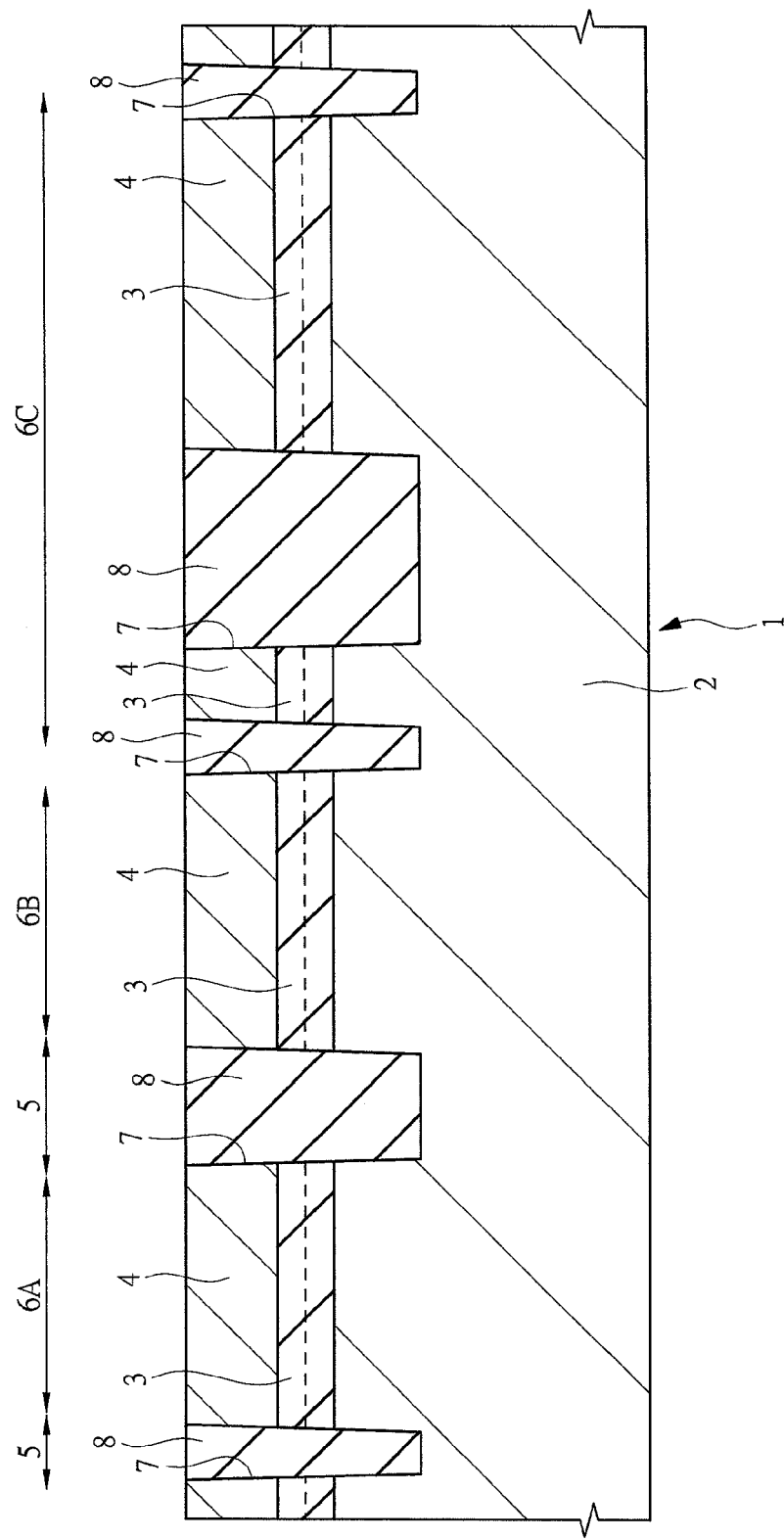
FIG. 66 is a cross-sectional view of main parts of the semiconductor device during the manufacturing process according to the third embodiment.

In the manner as described above, as illustrated in FIG. 65, the isolation film 8 is formed by the STI method. In addition, as illustrated in FIG. 66, over the whole surface of the main surface (surface) of the SOI substrate 1, in a plurality of the isolation regions 5, the isolation film 8 is formed. Since the isolation film 8 is formed in the isolation region 5, the SOI substrate 1 is defined (sectioned) into the MISFET forming regions (active regions) 6A, 6B and 6C by the isolation regions 5 to which the isolation film 8 is formed. Moreover, to the MISFET forming regions 6A, 6B and 6C, various semiconductor elements (for example, the MISFETs Q1, Q2, Q3 etc.) are formed in following processes.

Figure 67:
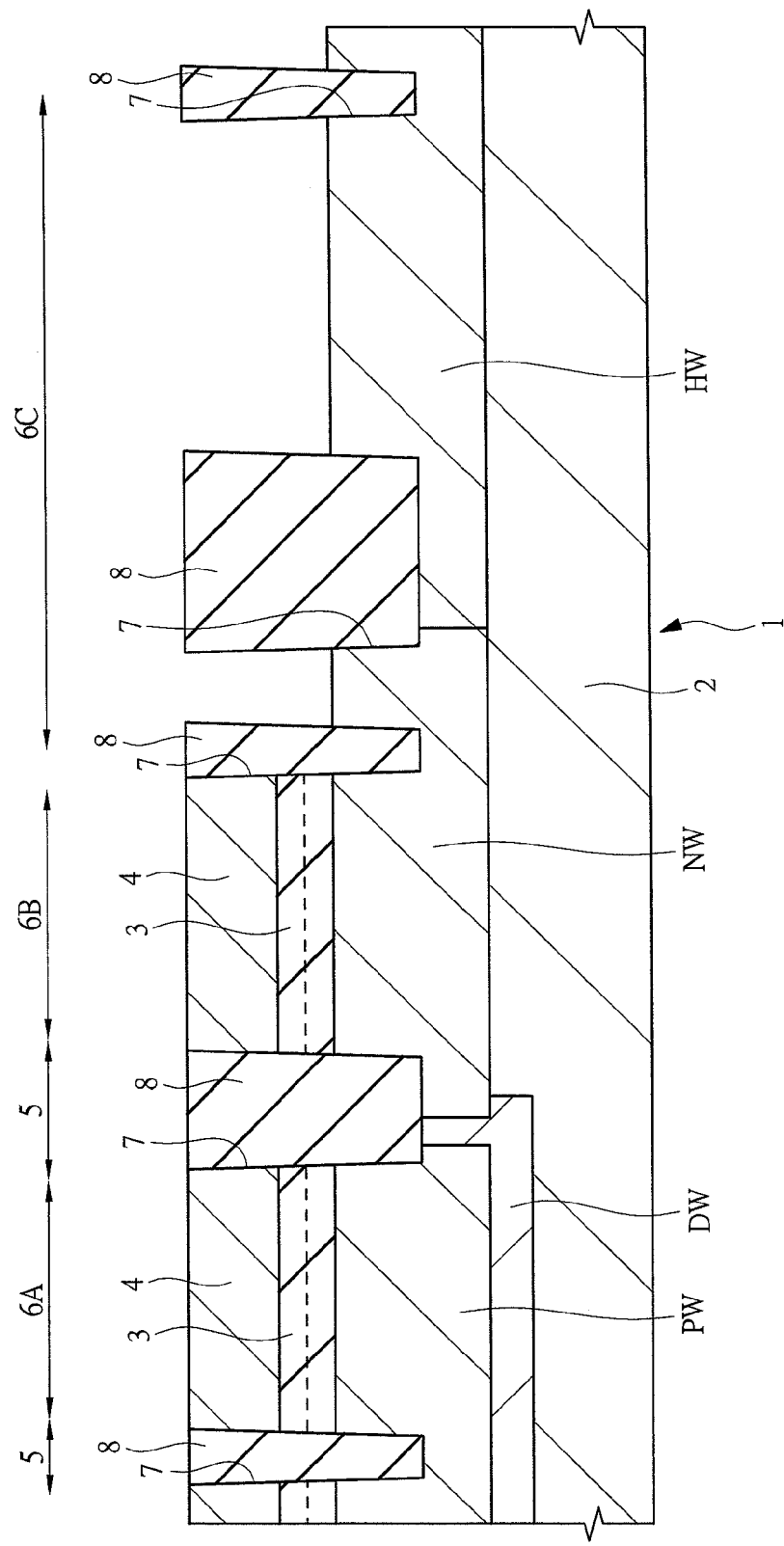
FIG. 67 is a cross-sectional view of main parts of the semiconductor device during the manufacturing process according to the third embodiment.
Figure 68:
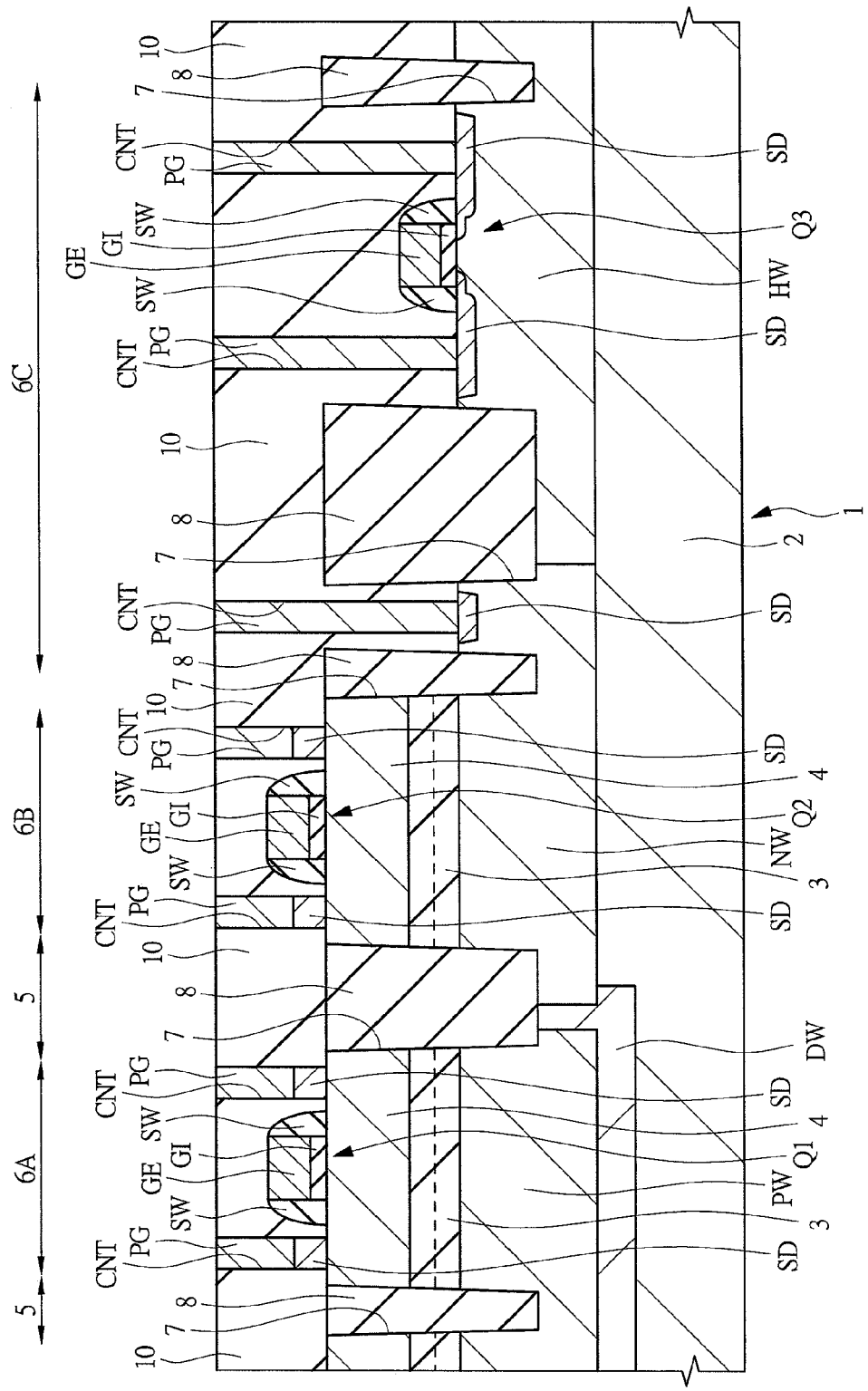
FIG. 68 is a cross-sectional view of main parts of the semiconductor device during the manufacturing process according to the third embodiment.

Then, by performing a process in the same manner as the process illustrated in FIGS. 19 and 20 (steps S9 and S10 in FIG. 4), as illustrated in FIG. 67, the well regions PW, NW and HW are formed and the SOI layer 4 and the BOX layer 3 are removed in the high-withstand-voltage MISFET forming region 6C. Then, by performing a process in the same manner as the process illustrated in FIGS. 21 and 22 (steps S11 and S12 in FIG. 4), as illustrated in FIG. 68, the n-channel type MISFET Q1 and the p-channel type MISFET Q2 are formed on the SOI layer 4 and the MISFET Q3 having a high withstand voltage is formed on the supporting substrate 2. The interlayer insulator 10 and plugs PG are formed on the MIS- FETs Q1, Q2 and Q3. Moreover, by performing a process in the same manner as the process indicated by S13 in FIG. 4, as illustrated in FIG. 53, a semiconductor device having a structure in which the wiring M1 of the first layer is formed is manufactured.

<Main Features and Effects of the Third Embodiment>

In the third embodiment, the SOI substrate 1 in which the portion on the SOI layer 4 side and the portion on the supporting substrate 2 side of the BOX layer 3 are nitrided is prepared and the groove 7 is formed in the isolation region 5. While the BOX layer 3 is exposed to a side surface 7b of the groove 7, as the portion on the SOI layer 4 side and the portion on the supporting substrate 2 side of the BOX layer 3 are nitrided, upon performing an annealing processing after forming the isolation film 8 so as to fill the groove 7, diffusion of oxygen through the isolation film 8 and the BOX layer 3 can be prevented and thus oxidation of the SOI layer 4 can be prevented.

As a result, also in the semiconductor device of the present embodiment, also in a minute MISFET having a short channel length, it is possible to prevent an increase in the thickness of the BOX layer 3 on the isolation region 5 side and to suppress variations of the threshold voltage (Vth) of the semiconductor device. In addition, in the semiconductor device of the present embodiment, also in a minute MISFET having a short channel length, it is possible to prevent occurrence of fluctuations in the threshold voltage (Vth) of the semiconductor device over the whole surface of the main surface (surface) of the SOI substrate 1 and to prevent lowering of the uniformity of electric characteristics of the semiconductor device. Further, in the semiconductor device of the present embodiment, an increase in the etching speed of the BOX layer 3 on the isolation region 5 side can be prevented and thus occurrence of "pattern defects" can be prevented also in a minute MISFET having a short channel length.

Further, as an oxidation resistant film is not interposed between the SOI layer 4 and the isolation film 8 and between the supporting substrate 2 and the isolation film 8 in the third embodiment, variations in the threshold voltage (Vth) of the MISFET due to charge-up of charges trapped in an oxidation resistant film can be suppressed.

Moreover, in the present embodiment, as the nitridation processing is performed in a process of previously fabricating the SOI substrate 1, a process of forming an oxidation resistant film is unnecessary after forming the groove 7 to the SOI substrate 1 and thus the manufacturing process of the semiconductor device can be shortened.

On the contrary, in the first and second embodiments, the oxidation resistant film 9 is interposed between the BOX layer 3 and the isolation film 8 and thus they are more advantageous than the third embodiment according to the point that oxidation of the SOI layer 4 is more surely prevented upon the annealing processing in the first and second embodiments as compared with the third embodiment in which the portion on the SOI layer 4 side or the supporting substrate 2 side of the BOX layer 3 is nitrided.

In the foregoing, the invention made by the inventors of the present invention has been concretely described based on the embodiments. However, it is needless to say that the present invention is not limited to the foregoing embodiments and various modifications and alterations can be made within the scope of the present invention.

The present invention is effective when adopted for a semiconductor device and a manufacturing process of the semiconductor device.

What is claimed is:

1. A semiconductor device comprising:
   a semiconductor substrate including a base, an insulating layer on the base, and a semiconductor layer on the insulating layer;
   a semiconductor element formed on the semiconductor layer; and
   an isolation film, which is continuous between an upper surface of the isolation film and a bottom surface of the isolation film, buried in a groove formed in the semiconductor layer, the insulating layer, and the base in an isolation region,
   wherein an oxidation resistant film is interposed between the insulating layer and the isolation film,
   the oxidation resistant film is in direct contact with the insulating layer and the base in the isolation region,
   a portion of the semiconductor layer exposed to a first side surface of the groove is in direct contact with an upper portion of the isolation film,
   a portion of the base exposed to a bottom surface of the groove is in direct contact with a lower portion of the isolation film, and
   the insulating layer adjacent to the first side surface of the groove is not in direct contact with the isolation film.

2. The semiconductor device according to claim 1, wherein the insulating layer and the isolation film each include a silicon oxide film.

3. The semiconductor device according to claim 2, wherein the oxidation resistant film includes a silicon nitride film.

4. The semiconductor device according to claim 1, wherein the insulating layer is set back from the first side surface of the groove, and
the oxidation resistant film is interposed between the insulating layer and the isolation film, and is sandwiched by the semiconductor layer and the base from the top and bottom.

5. The semiconductor device according to claim 1, wherein a portion of the oxidation resistant film is interposed between the isolation film and a second portion of the semiconductor layer exposed to the first side surface of the groove.

6. The semiconductor device according to claim 5, wherein the portion of the semiconductor layer exposed to the first side surface of the groove and directly in contact with the isolation film is an upper portion of the semiconductor layer, and the second portion of the semiconductor layer is a lower portion of the semiconductor layer.

7. The semiconductor device according to claim 1, wherein the isolation film includes a single layer film.

* * * * *